United States Patent
Kwon et al.

(10) Patent No.: US 8,408,892 B2
(45) Date of Patent: Apr. 2, 2013

(54) FLUIDIC CHANNEL SYSTEM AND METHOD FOR FABRICATING FINE STRUCTURE

(75) Inventors: Sunghoon Kwon, Gwanak-gu (KR); JiYun Kim, Gunpo-si (KR); Wook Park, Gangseo-gu (KR); HyunSung Park, Suseung-gu (KR); SeungAh Lee, Yeoju-gun (KR); SuEun Chung, Gangnam-gu (KR)

(73) Assignee: SNU R&DB Foundation, Seoul (KR)

( * ) Notice: Subject to any disclaimer, the term of this patent is extended or adjusted under 35 U.S.C. 154(b) by 238 days.

(21) Appl. No.: 12/681,698

(22) PCT Filed: Oct. 1, 2008

(86) PCT No.: PCT/KR2008/005787
§ 371 (c)(1),
(2), (4) Date: Apr. 5, 2010

(87) PCT Pub. No.: WO2009/045050
PCT Pub. Date: Apr. 9, 2009

(65) Prior Publication Data
US 2011/0006464 A1    Jan. 13, 2011

(30) Foreign Application Priority Data

Oct. 5, 2007   (KR) .................. 10-2007-0100472
Jul. 31, 2008  (KR) .................. 10-2008-0075190
Jul. 31, 2008  (KR) .................. 10-2008-0075302

(51) Int. Cl.
*B29C 35/08* (2006.01)

(52) U.S. Cl. ............... 425/174.4; 425/176.6; 264/494; 264/495; 264/496

(58) Field of Classification Search ............... 425/176.6, 425/174.4; 264/494, 495, 496
See application file for complete search history.

(56) References Cited

U.S. PATENT DOCUMENTS

| 5,575,962 | A | 11/1996 | Takahashi |
| 2005/0010199 | A1* | 1/2005 | Karino et al. ............ 606/14 |
| 2007/0105972 | A1 | 5/2007 | Doyle et al. |

FOREIGN PATENT DOCUMENTS

| JP | 2003-190767 A | 7/2003 |
| KR | 10-0163369 B1 | 1/1999 |
| KR | 10-2005-0080889 A | 8/2005 |

OTHER PUBLICATIONS

Jung et al., "Optofluidic Maskless Lithography and Self-Assembly for . . . ", In: 14th Conference on Potoelectronics & Optical Communications, Korea, May 16, 2007, pp. 172-173.

Dendukuri et al., "Continuous-flow lithography for high-throughput microparticle synthesis", Nature Materials, vol. 5, pp. 365-369, May 2006.

* cited by examiner

*Primary Examiner* — Jeffrey Wollschlager
*Assistant Examiner* — Saeed Huda
(74) *Attorney, Agent, or Firm* — Sherr & Jiang, PLLC

(57) ABSTRACT

A fluidic channel system is provided. The fluidic channel system includes a light projection apparatus, a fluidic channel, and a rail. The light projection apparatus provides light. A photocurable fluid, which is selectively cured by the light, flows inside the fluidic channel. A fine structure which is to be formed by curing the photocurable fluid moves along the rail.

46 Claims, 89 Drawing Sheets (b)　　　　　(c)　　　　　(d)

patterned light (a)

(c)

(b)

US 8,408,892 B2

FLUIDIC CHANNEL SYSTEM AND METHOD FOR FABRICATING FINE STRUCTURE

CROSS REFERENCE TO PRIOR APPLICATIONS

This application is a National Stage Patent Application of International Patent Application No. PCT/KR2008/005787 (filed on Oct. 1, 2008) under 35 U.S.C. §371, which claims priority to Korean Patent Application Nos. 10-2007-0100472 (filed on Oct. 5, 2007), 10-2008-0075190 (filed on Jul. 31, 2008), and 10-2008-0075302 (filed on Jul. 31, 2008), which are all hereby incorporated by reference in their entirety.

TECHNICAL FIELD

The described technology relates generally to a fluidic channel system and a method for fabricating a fine structure.

BACKGROUND ART

Fine structures such as microstructures and nanostructures have applications in various fields such as photonic materials, micro-electromechanical systems (MEMS), biomaterials, self-assembly, etc. Recently, as an example of a technique for producing such fine structures, a continuous-flow lithography technique was proposed (D. Dendukuri, D. Pregibon, J. Collins, T. Hatton and P. Doyle, "Continuous-Flow Lithography for High-Throughput Microparticle Synthesis", Nature Materials, vol. 5, pp. 365-369, 2006; US Patent Publication No. 2007-0105972, "Microstructure Synthesis by Flow Lithography and Polymerization). In the continuous-flow lithography technique, a photocurable fluid flowing in a microfluidic channel is exposed to a predetermined shape of light such that the photocurable liquid is selectively cured, thereby continuously producing a variety of free-floating microstructures.

DISCLOSURE

Technical Solution

In one embodiment, a fluidic channel system includes a light projection apparatus, a fluidic channel, and a rail. The light projection apparatus provides light. A photocurable fluid, which is selectively cured by the light, flows inside the fluidic channel. A fine structure which is to be formed by curing the photocurable fluid moves along the rail.

In another embodiment, a fluidic channel system includes a fluidic channel, a fine structure, and a rail. The fine structure is positioned inside the fluidic channel. The fine structure moves along the rail.

In still another embodiment, a method for fabricating a fine structure includes providing a photocurable fluid to a fluidic channel having a rail along which a fine structure can move. Further, the method includes producing a fine structure by irradiating the photocurable fluid with light such that the photocurable fluid is selectively cured. Further, the method includes moving the fine structure along the rail.

In yet another embodiment, a method for conveying a fine structure includes providing a fluid to a fluidic channel having a rail along which a fine structure can move. Further, the method includes moving the fine structure having a guide along the rail. The guide prevents the fine structure from coming off of the rail.

DESCRIPTION OF DRAWINGS

The above and other objects, features and advantages of the present disclosure will become more apparent to those of ordinary skill in the art by describing in detail embodiments thereof with reference to the attached drawings, in which.

MODE FOR INVENTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout. Moreover, the drawings are not necessarily to scale, and the size and relative sizes of the layers and regions may have been exaggerated for clarity. It will also be understood that when an element or layer is referred to as being "on," another element or layer, the element or layer may be directly on the other element or layer or intervening elements or layers may be present. As used herein, the term "and/or" may include any and all combinations of one or more of the associated listed items.

When a continuous flow lithography technique is used to form a fine structure, microstructures having various shapes, sizes, and chemical compositions can be produced quickly and easily. In the conventional continuous flow lithography technique, however, it is difficult to control the shapes and positions of the produced microstructures in real time. For example, in the continuous flow lithography technique proposed in the above-mentioned patent documents, the position of the fabricated microstructure along the axis of fluid flow can be controlled by the fluid flow, but the position of the microstructure perpendicular to the fluid flow cannot be controlled.

Figure 1:
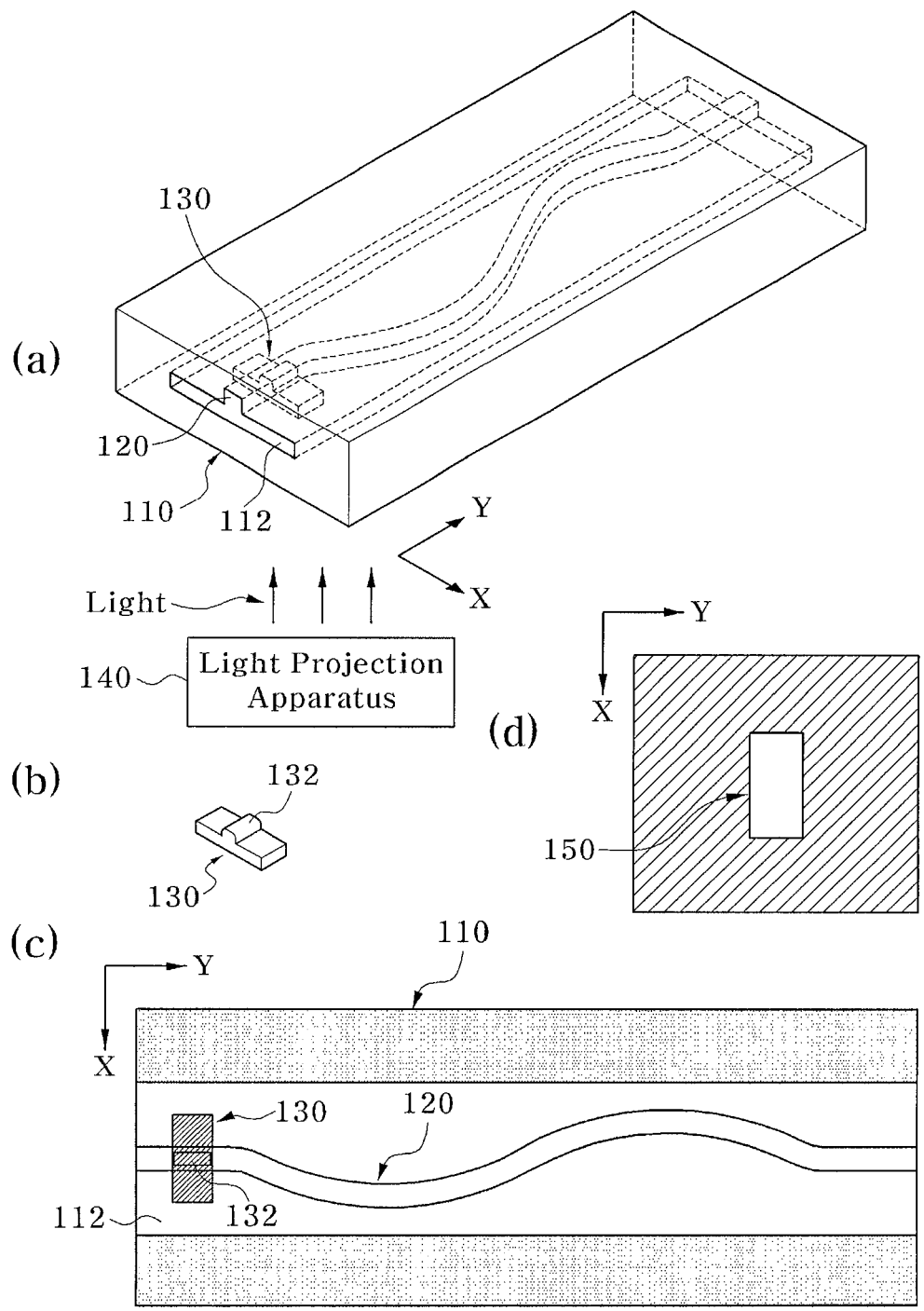
FIGS. 1 and 4 are diagrams for explaining a fluidic channel system according to one embodiment.

FIG. 1 is diagrams for explaining a fluidic channel system according to one embodiment. (a) of FIG. 1 is a perspective view of the fluidic channel system, (b) of FIG. 1 is a perspective view of a fine structure 130, (c) of FIG. 1 is an opened-up plan view of a fluidic channel 110, and (d) of FIG. 1 is a diagram showing a shape 150 of light provided to the fluidic channel 110. Referring to FIG. 1, the fluidic channel system includes a fluid channel 110, a rail 120, a fine structure 130, and a light projection apparatus 140.

As a material of the fluidic channel 100, a variety of materials or mixtures may be used. For example, the fluidic channel 100 may be formed of poly-dimethyl siloxane (PDMS) or glass. Inside the fluidic channel 100, a fluid 112 exists. The fluid 112 may be used for conveying the fine structure 130. In an example, the fluid 112 may be a liquid, liquid solution, liquid mixture, or supercritical fluid. In another example, the fluid 112 may be powder or particles which do not have a predetermined shape as a whole. In still another example, when there is relatively little need to have a force for conveying a fine structure, the fluid 112 may be a gas. In still another example, the fluid 112 may be a photocurable fluid. In this case, the fluid 112 may be used for producing and conveying the fine structure 130. The production of the fine structure 130 may be performed by radiating light onto the fluid 112 such that the fluid 112 is selectively cured. As the photocurable fluid, a mixture of polyethylene glycol (400) diacrylate (PEG-DA of Sigma Aldrich Co.) and a known photoinitiator may be used. Alternatively, other known materials or mixtures cured by radiating visible rays, infrared rays, or ultraviolet rays may be used. The fluid 112 may include cells, nanostructures, or particles dispersed therein. In this case, the fine structure 130 obtained by curing the fluid 112 includes cells, nanostructures, or particles.

The rail 120 along which the fine structure 130 can move is positioned inside the fluidic channel 110. (a) of FIG. 1 shows that the rail 120 is positioned on one surface of the fluidic channel 110, is formed in a groove shape, and has a rectangular cross-section. However, the position, shape, and cross-sectional shape of the rail 120 are not limited thereto and various other positions and shape are possible. As the fine structure 130 moves along the rail 120, it may move in a different direction from the flow direction of the fluid 112 flowing in the fluidic channel 110, depending on the position and the shape of the rail 120. This does not mean that the fine structure 130 always moves in a different direction from the flow direction of the fluid 112, but that the fine structure 130 may move in a different direction from the flow direction of the fluid 112 in at least a region of the fluidic channel 110. Further, this does not mean that the movement of the fine structure 130 is determined regardless of the flow of the fluid 112, but that the movement of the fine structure 130 is determined by the disposition of the rail 120 as well as the flow of the fluid 112. As the fine structure 130 moves along the rail 120, it is possible to prevent the fine structure 130 from diffusing. When the fine structure 130 does not move along the rail 120, it may diffuse in a perpendicular direction (+X or −X direction) to the flow direction (+Y or −Y direction) of the fluid 112. Since the rail 120 limits the position of the fine structure 130 in the perpendicular direction (+X or −X direction), the diffusion of the fine structure 130 is prevented.

The fine structure 130 is positioned inside the fluidic channel 110. For example, the fine structure 130 may be a microstructure or nanostructure. The microstructure is a structure of which at least one of length, width, and height is equal to or more than 1 μm and less than 1 mm, or a structure corresponding thereto. The nanostructure is a structure of which at least one of length, width, and height is equal to or more than 1 nm and less than 1 μm, or a structure corresponding thereto.

According to one embodiment, the fine structure 130 may be produced by photocuring the fluid 112. In this case, a guide 132 may be produced at the same time as the fine structure 130. That is, light may be provided to the fluidic channel 110 having the rail 120 positioned therein, thereby producing the fine structure 130 having the guide 132 provided thereon. The guide 132 may have a shape corresponding to the rail 120. For example, when the rail 120 has a groove shape, the guide 132 may have a protrusion shape. Alternatively, when the rail 120 has a protrusion shape, the guide 132 may have a groove shape. Further, when the rail 120 has a rectangular cross-section, the guide 132 also has a rectangular cross-section. When the rail 120 has a triangular cross-section, the guide 132 also has a triangular cross-section. When the rail 120 has a semi-circular cross-section, the guide 132 also has a semi-circular cross-section.

According to another embodiment, the fine structure 130 having the guide 132 provided thereon may be injected into the fluidic channel 110 from the outside of the fluidic channel 110. In this case, the fluidic channel system may not include the light projection apparatus 140. In an example, the fine structure 130 having the guide 132 provided thereon may be produced in a separate fluidic channel to be delivered to the fluidic channel 110 shown in FIG. 1. At this time, the fine structure 130 produced in a separate fluidic channel may be put into a container such as a beaker and then delivered to the fluidic channel 110 shown in FIG. 1. In this case, when the fine structure 130 is produced in a separate fluidic channel, the fine structure 130 may be fabricated in such a manner that the guide 132 is positioned on or under the fine structure 130. However, when the fine structure 130 is delivered to the fluidic channel 110 shown in FIG. 1 through the container, the fine structure 130 may be turned over. As a result, the guide 132 may be positioned at the top side or the bottom side of the fine structure 130. In this case, a separate technique may be required, which can extract the guide 132 positioned at either one of the top side and the bottom side of the fine structure 130. Such a technique will be described below separately.

According to other embodiments, the fine structure 130 having the guide 132 may be produced by methods other than photocuring of the fluid. In one example, silicon may be patterned to produce the fine structure 130 having the guide 132 provided thereon. In this case, both the guide 132 and the fine structure 130 are formed of silicon. In another example, a separate material (for example, photoresist) other than silicon may be deposited on silicon that is used as the fine structure 130 and the separate material is patterned to form the guide 132.

The guide 132 provided on the fine structure 130 prevents the fine structure 130 from coming off of the rail 120. In the drawing, the guide 132 is positioned on one surface of the fine structure 130, is formed in a protrusion shape, and has a rectangular cross-section. However, the position, shape, and cross-sectional shape of the guide 132 are not limited thereto.

The light projection apparatus 140 provides light to the fluidic channel 110. The light may be provided by the light projection apparatus 140 in various ways. In one example, the light projection apparatus 140 may provide light having a shape 150 shown in (d) of FIG. 1 to the fluidic channel 110 by using a photomask or spatial light modulator. In another example, the light projection apparatus 140 may provide light to the fluidic channel 110 through scanning. In this case, while the fluid 112 flows, the light may be provided to the fluid 112. In still another example, while light is provided to the fluid, the flow of the fluid may be stopped, and while light is not provided to the fluid, the fluid may flow. In order for the light provided by the light projection apparatus 140 to reach the fluid 112, at least a region of the fluidic channel 110 may be transparent.

Figure 2:
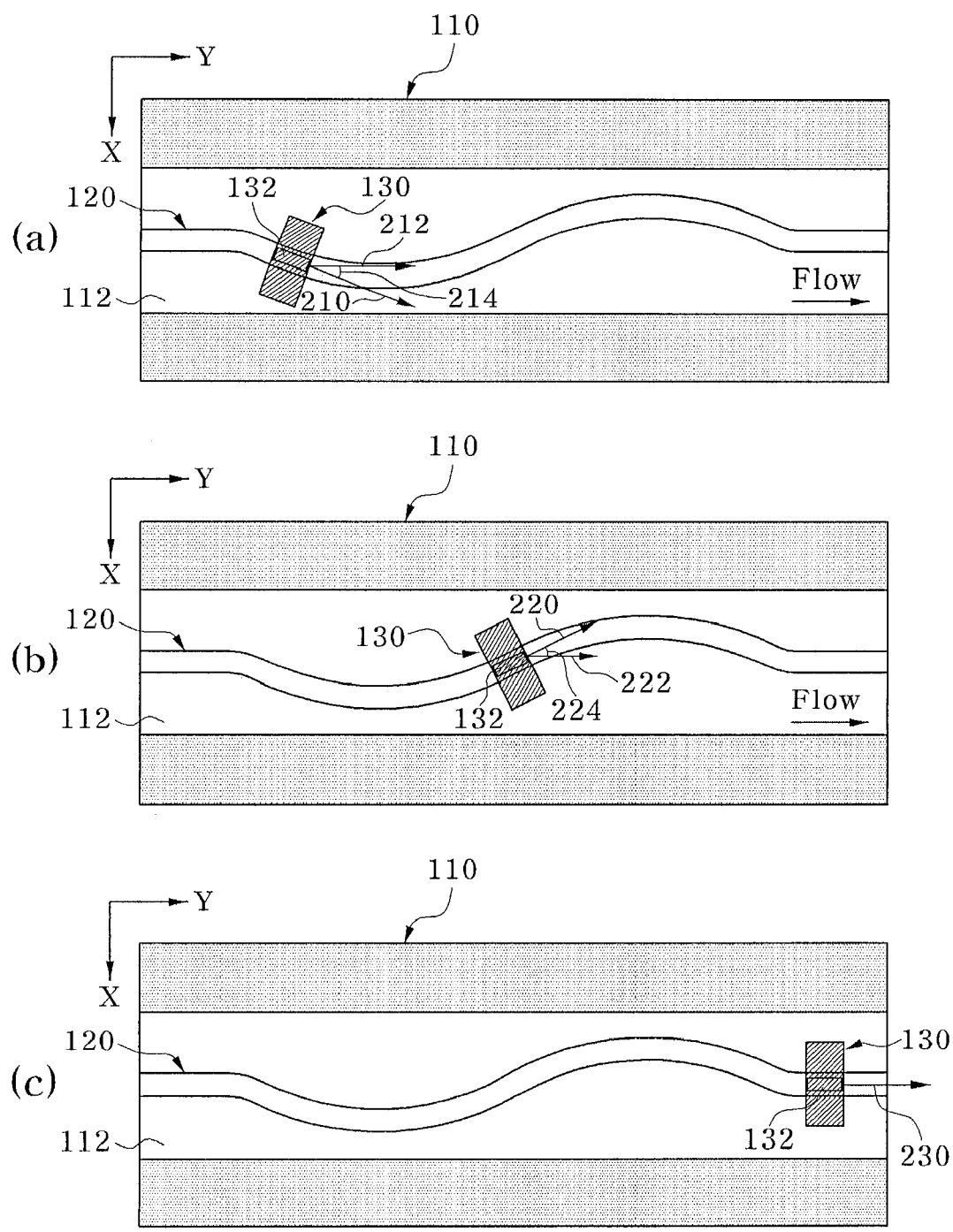
FIG. 2 is diagrams for explaining that a fine structure 130 flows in a different direction from a flow direction of a fluid 112 in the fluidic channel system shown in FIG. 1.

FIG. 2 is diagrams for explaining a movement direction of the fine structure 130 and a flow direction of the fluid 112 in the fluidic channel system shown in FIG. 1. (a) to (c) of FIG. 2 are opened-up plan views of the fluidic channel system. Referring to (a) of FIG. 2, a movement direction 210 of the fine structure 130 is different from a flow direction 212 of the fluid 112, and there is an angle difference 214 between the movement direction 210 of the fine structure 130 and the flow direction 212 of the fluid 112. Further, referring to (b) of FIG. 2, a movement direction 220 of the fine structure 130 is different from a flow direction 222 of the fluid 112, and there is an angle difference 224 between the movement direction 220 of the fine structure 130 and the flow direction 222 of the fluid 122. Referring to (c) of FIG. 2, a movement direction 230 of the fine structure 130 substantially coincides with a flow direction 230 of the fluid 112.

As shown in FIG. 2, the rail 120 may be formed in a sine wave shape to be disposed in the fluidic channel system. When the rail 120 is not provided, a position of the fine structure 130 in a parallel direction (+Y or −Y direction) to the flow direction (+Y or −Y direction) of the fluid 112 can be controlled by the flow of the fluid. However, a position of the fine structure 130 in a perpendicular direction (+X or −X direction) to the flow direction of the fluid 112 cannot be controlled by the flow of the fluid 112. Further, the fine structure 130 may diffuse in the perpendicular direction (+X or −X direction). Therefore, as the fluidic channel system is provided with the rail 120, the fine structure 130 can be prevented from diffusing in the perpendicular direction (+X or −X direction), and the position of the fine structure 130 in the perpendicular direction (+X or −X direction) can be accurately controlled.

Figure 3:
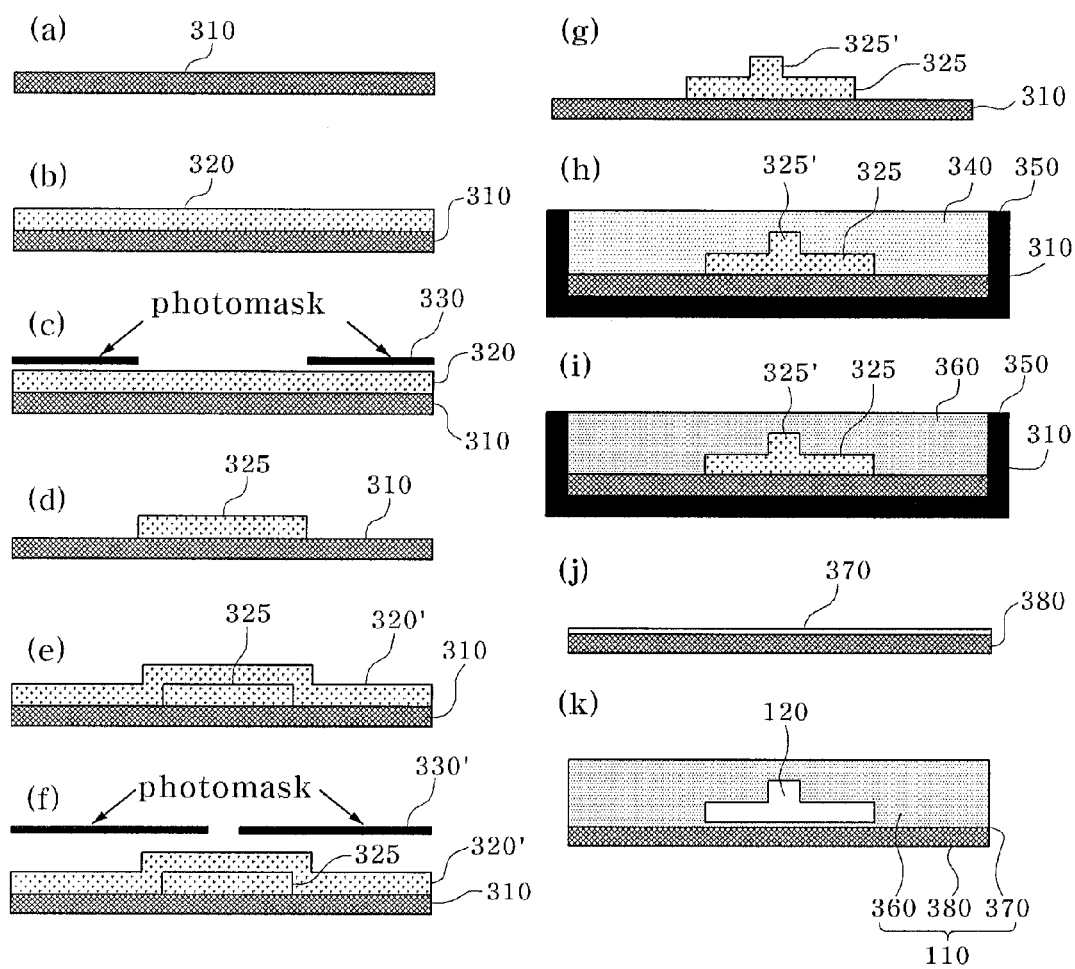
FIG. 3 is diagrams showing a process of fabricating a fluidic channel 110 shown in FIG. 1.

FIG. 3 is diagrams showing a process of fabricating the fluidic channel 110 shown in FIG. 1. In (a) of FIG. 3, a silicon substrate 310 is prepared. In (b) of FIG. 3, photoresist 320 is applied onto the silicon substrate 310. The photoresist 320 may be SU-8 photoresist, for example. In (c) and (d) of FIG. 3, the photoresist 320 is patterned to form a main channel layer 325. The patterning of the photoresist 320 includes a step ((c) of FIG. 3) of aligning a photomask 330 and exposing the photoresist 320, and a step ((d) of FIG. 3) of developing the photoresist 320. In (e) of FIG. 3, additional photoresist 320' is applied onto the silicon substrate 310 and the main channel layer 325. In (f) and (g) of FIG. 3, the additional photoresist 320' is patterned to form a rail layer 325'. The patterning of the additional photoresist 320' includes a step ((f) of FIG. 3) of aligning an additional photomask 330' and exposing the photoresist 320', and a step ((g) of FIG. 3) of developing the additional photoresist 320'. In (h) of FIG. 3, the silicon substrate 310 having the main channel layer 325 and the rail layer 325' formed thereon is put into an aluminum container 350, and uncured thermosetting polymer, for example, uncured PDMS 340 is introduced onto the silicon substrate 310. In (i) of FIG. 3, the uncured PDMS 340 is converted into the cured PDMS 360. To cure the PDMS, the aluminum container 350 is disposed on a hot plate and maintained at a temperature of about 150° C. for a proper time, for example, about ten minutes. As such, the cured PDMS 360 is obtained by the 2 layer mold fabricating process described with reference to (a) to (i) of FIG. 3.

In (j) of FIG. 3, a glass substrate 380 coated with PDMS 370 is prepared separately from the above-described process ((a) to (i) of FIG. 3). In (k) of FIG. 3, the cured PDMS 360 obtained by the process of (a) to (i) of FIG. 3 is coupled to the PDMS 370 applied onto the glass substrate 380, thereby forming the fluidic channel 110 having the rail 120 provided thereon. The fluidic channel 110 includes the PDMS 360 and 370 and the glass substrate 380.

According to another embodiment, the step (shown in (d) of FIG. 3) of developing the photoresist 320 may be omitted. That is, after the photoresist 320 is applied and exposed, the additional photoresist 320' is applied and exposed. Then, the photoresist 320 and the additional photoresist 320' may be simultaneously developed to form the main channel layer 325 and the rail layer 325'.

According to still another embodiment, various other types of containers may be used instead of the aluminum container 350 shown in (h) and (i) of FIG. 3. For example, a glass Petri dish may be used.

Figure 4:
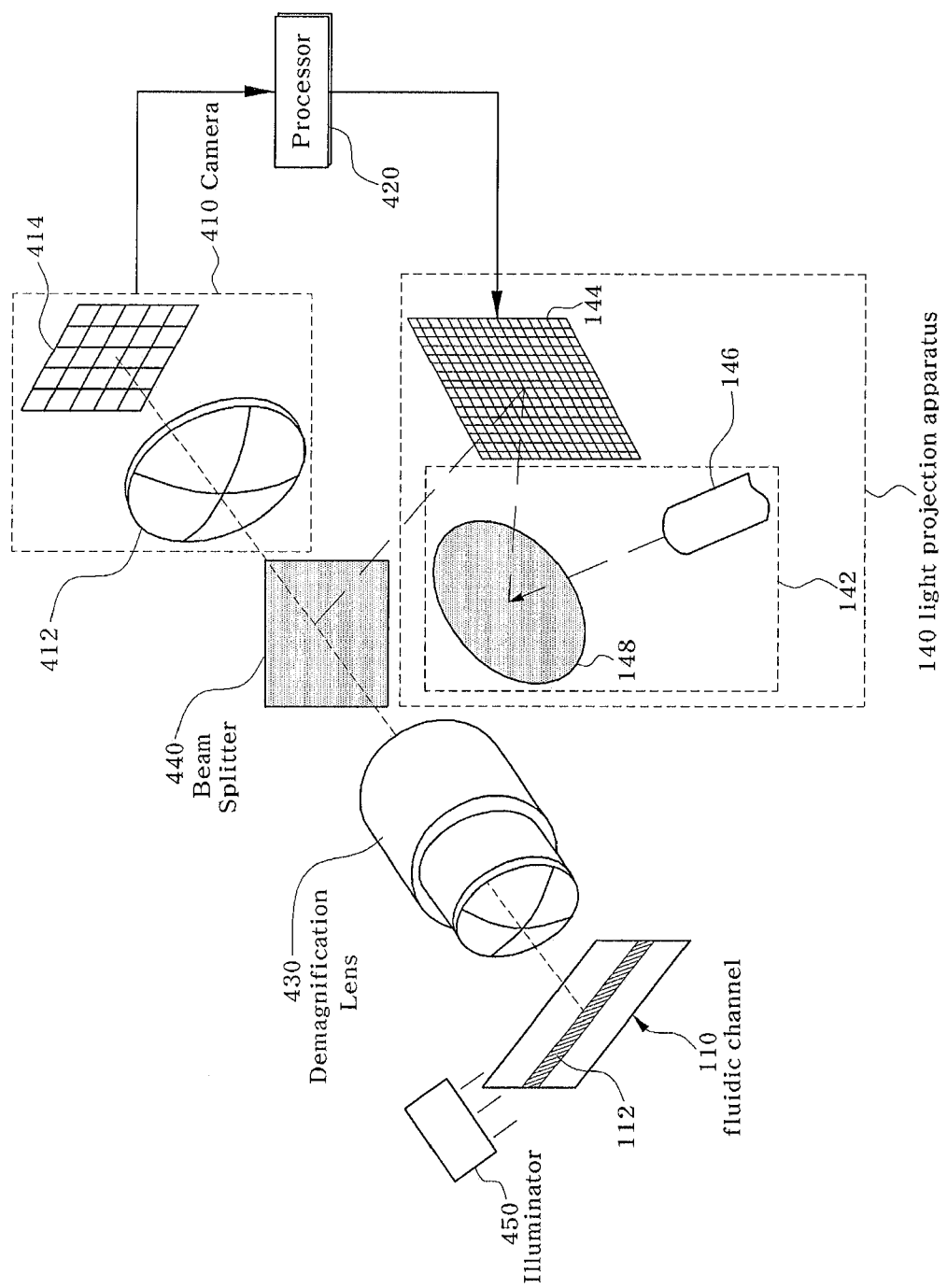

According to some embodiments, as shown in FIG. 4, the fluidic channel system may further include a camera 410, a processor 420, a demagnification lens 430, a beam splitter 440, and an illuminator 450, in addition to the fluidic channel 110, the rail 120, the fine structure 130, and the light projection apparatus 140 shown in FIG. 1. Referring to FIG. 4, the camera 410 photographs the fluidic channel 110. The camera 410 may include an image lens 412 and an image sensor 414. The image lens 412 receives light from the beam splitter 440, and then delivers the received light to the image sensor 414 such that an image can be formed in the image sensor 414. The image sensor 414 generates an electrical signal corresponding to the incident light. To determine the shape of light provided by the light projection apparatus 140 based on the image photographed by the camera 410, the electrical signal output from the camera 410 may be provided to the processor 420.

The processor 420 determines the shape of light and the light projection apparatus 140 provide the beam splitter 440 with the light having the shape. When the shape of the light provided by the light projection apparatus 140 is determined based on the image photographed by the camera 410, the processor 420 determines the shape of light based on the electrical signal output from the camera 410. In an example, when a package is formed by radiating light onto a chip (not shown) injected into the fluidic channel 110, the processor 420 may determines a proper shape of the light based on an image of the chip delivered from the camera 410. In another example, when additional light needs to be radiated onto a fine structure produced by light provided from the light projection apparatus 140, the processor 420 may determine a proper shape of light according to an image of a fine structure delivered from the camera 410. The processor 420 may be, for example, a personal computer (PC) or notebook computer. In still another example, when the shape of light provided by the light projection apparatus 140 does not change with time, that is for example, when the light projection apparatus 140 uses a predetermined photomask, the processor 420 may be omitted.

The demagnification lens 430 demagnifies light provided from the light projection apparatus 140, and then provides the light to the fluidic channel 110. As examples of the demagnification lens 430, a 10×, 20×, or 60× objective lens may be used.

The beam splitter 440 delivers the light provided from the light projection apparatus 140 to the fluidic channel 110 through the demagnification lens 430. Further, the beam splitter 440 delivers to the camera 410 an image delivered from the fluidic channel 110 through the demagnification lens 430. For example the beam splitter 440 may be a half mirror.

The illuminator 450 provides illumination such that the camera 410 can secure an image of the fluidic channel 110. Since a cured fine structure and an uncured fluid have a small difference in refractive index, off-axis illumination may be used so that the cured fine structure can be seen more clearly.

The light projection apparatus 140 includes a light source 142 and a spatial light modulator 144. The light source 142 may be, for example, an ultraviolet light source, visible light source, or infrared light source. The light source 142 may include, for example, an ultraviolet light source collimator 146 and an ultraviolet filter 148. The ultraviolet light source collimator 146 serves to output parallel ultraviolet light. The ultraviolet light source collimator 146 may include, for example, a 200 W UV lamp (not shown) and a fiber-based light guide system (not shown). The ultraviolet filter 148 serves to select ultraviolet light from light provided from the ultraviolet light source collimator 146 and then provide the selected ultraviolet light to the spatial light modulator 144. The spatial light modulator 144 serves to modulate the light provided from the light source 142 in accordance with a signal provided from the processor 420. The spatial light modulator 144 may be, in an example, a digital micromirror array manufactured in a two-dimensional array type, as shown in FIG. 4. Alternatively, the spatial light modulator 144 may be manufactured in a one-dimensional array type, or may be manufactured using a liquid crystal display (LCD) or the like instead of the micromirror array. As described above, the light projection apparatus 140 may be implemented in various other ways not shown in the drawing.

Figure 5:
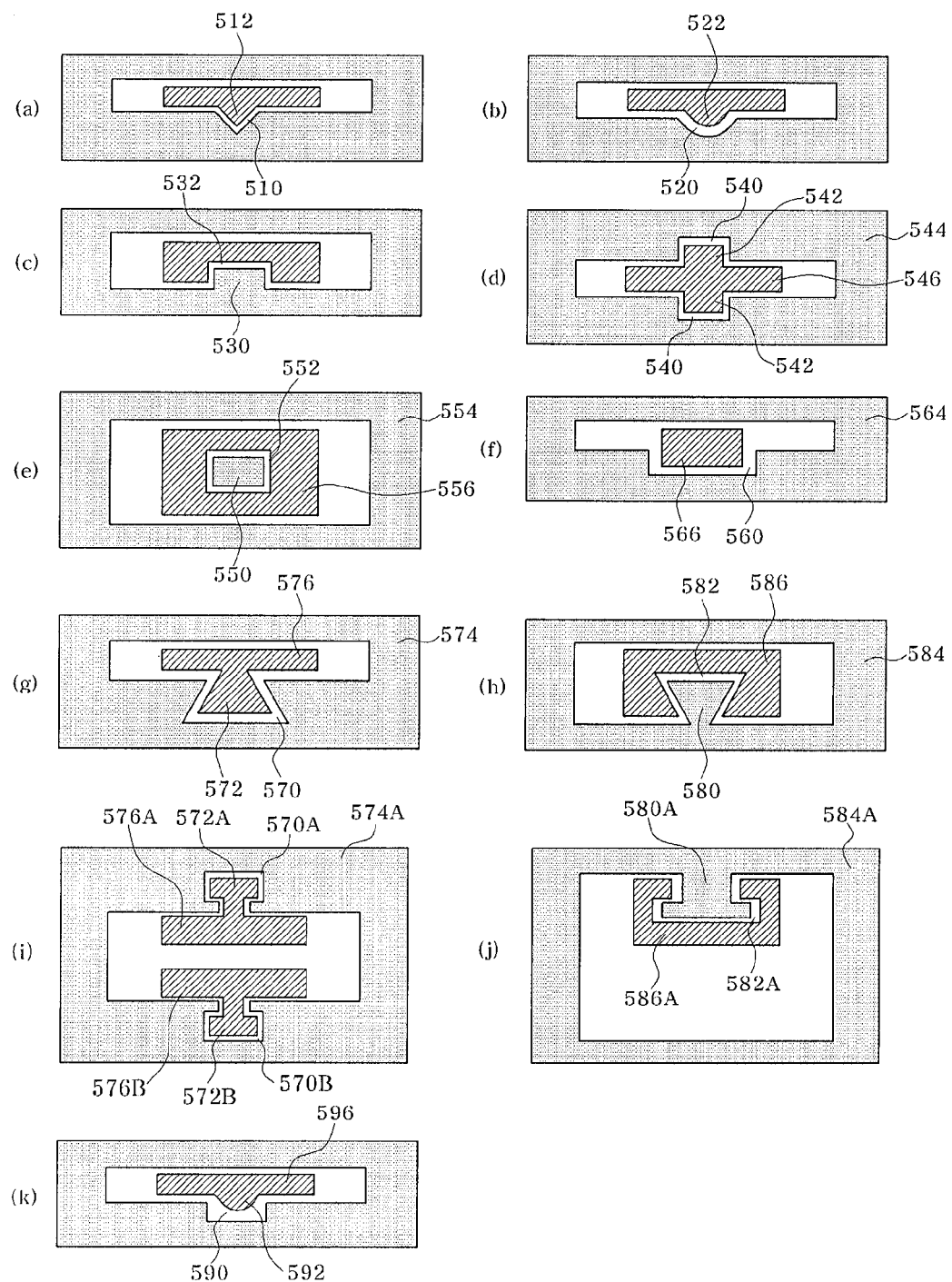
FIG. 5 is diagrams for explaining a modified embodiment of a rail adopted in the fluidic channel system shown in FIG. 1.

FIG. 5 is a diagram for explaining modified embodiments of the rail adopted in the fluidic channel system shown in FIG. 1. (a) to (i) of FIG. 5 are cross-sectional views of fluidic channels having a fine structure positioned therein. Referring to (a) of FIG. 5, cross-sections of a rail 510 and a guide 512 have triangular shapes. Referring to (b) of FIG. 5, cross-sections of a rail 520 and a guide 522 have semi-circular shapes. Referring to (c) of FIG. 5, a cross-section of a rail 530 has a protrusion shape, and a cross-section of a guide 532 has a groove shape. Referring to (d) of FIG. 5, rails 540 are respectively formed on two surfaces of a fluidic channel 544 facing each other. Further, guides 542 are respectively positioned facing each other inside the rails 540 formed on two surfaces of the fluidic channel 544. Referring to (e) of FIG. 5, a rail 550 is positioned inside a fluidic channel 554 so as not to come in contact with an inner surface of the fluidic channel 554. The rail 550 has a bar shape connected along the fluidic channel 554. Further, a guide 552 having a hole shape is formed inside a fine structure 556.

Referring to (f) of FIG. 5, a rail 560 is provided inside a fluidic channel 564, but a fine structure 566 does not have a protrusion, groove, or hole. Therefore, it looks like the fine structure 566 does not have a portion which is to be named as a guide. However, since the fine structure 566 does not come off of the rail 560 because of its shape, it can be understood that the fine structure 566 itself functions as a guide. Further, since the fine structure 566 does not come off of the rail 560 because of the lower portion of the fine structure 566, it can be understood that the lower portion of the fine structure 566 corresponds to a guide.

Referring to (g) of FIG. 5, the width of a protrusion-shaped guide 572 increases toward the outside of a fluidic channel 574, and the width of a groove-shape rail 570 increases toward the outside of the fluidic channel 574. Referring to (h) of FIG. 5, the width of a groove-shaped guide 582 decreases toward the outside of a fluidic channel 584, and the width of a protrusion-shaped rail 580 decreases toward the outside of the fluidic channel 584. Since the guide 572 or 582 and the rail 570 or 580 are formed in such a manner that their widths change toward the outside as shown in (g) and (h) of FIG. 5, it is possible to prevent the fine structure 576 or 586 from coming off of the rail, even when the internal height of the fluidic channel 574 or 584 is increased. (g) and (h) of FIG. 5 show an example in which the widths of the guide 572 or 582 and the rail 570 or 580 continuously change. However, the widths of the guide 572 or 582 and the rail 570 or 580 may change discontinuously, different from (g) and (h) of FIG. 5. Such examples are illustrated in (i) and (j) of FIG. 5. Referring to (i) of FIG. 5, two fine structures 576A and 576B are positioned inside a fluidic channel 574A. The first fine structure 576A moves along a rail 570A positioned at an upper surface of the fluidic channel 574A, and the second fine structure 576B moves along a rail 570B positioned at a lower surface of the fluidic channel 574A. The fine structure 576A or 576B has a guide 572A or 572B protruding in a T shape, and the rail 570A or 570B recessed in a T shape is positioned inside the fluidic channel 574A. Therefore, although the internal height of the fluidic channel 574A is larger than the sum of the thickness of the fine structure 576A or 576B and the height of the guide 572A or 572B, the fine structure 576A or 576B moves along the rail 570A or 570B without coming off. Further, the two fine structures 576A and 576B can be moved simultaneously along the upper and lower portions of the fluidic channel 574A. Further, four rails may be formed at four surfaces of the fluidic channel 574A such that four fine structures can be moved along the four rails formed at the upper and lower and left and right surfaces of the fluidic channel 574A, respectively. Referring to (j) of FIG. 5, a fine structure 586A has a guide 582A recessed in a T shape, and a rail 580A protruding in a T shape is positioned inside a fluidic channel 584A. Therefore, although the internal height of the fluidic channel 584A is larger than the sum of the thickness of the fine structure 586A and the height of the guide 582A, the fine structure 586A moves along the rail 580A without coming off.

Although the guide serves to prevent the fine structure from coming off of the rail, the cross-sectional shape of the guide does not necessarily have to coincide with that of the rail. In one example, even when the rail has a triangular cross-section, the guide may have a rectangular or semi-circular cross-section. In another example, even when the rail has a rectangular cross-section, the guide may have a triangular or semi-circular cross-section. In still another example, even when the rail has a semi-circular cross-section, the guide may have a triangular or rectangular cross-section. (k) of FIG. 5 shows an example in which the cross-sectional shape of the guide does not coincide with that of the rail. Referring to (k) of FIG. 5, while the rail 590 has a rectangular cross-section, the guide 592 has a semi-circular cross-section. In this case, a fine structure 596 having the guide 592 provided thereon moves along but does not come off of the rail 590.

FIGS. 6 to 11 are diagrams for explaining one embodiment of the rail which can be adopted in the fluidic channel system shown in FIG. 1, and one embodiment of a method of fabricating a fine structure. In particular, FIGS. 6 to 11 show examples in which the width of a rail is changed such that a fine structure can be easily moved along the rail. (a) of each of FIGS. 6 to 11 is an opened-up plan view of a fluidic channel, and (b) of each of FIGS. 6 to 11 is a cross-sectional view of the fluidic channel, taken along the dashed line of (a) of each of FIGS. 6 to 11.

Figure 6:
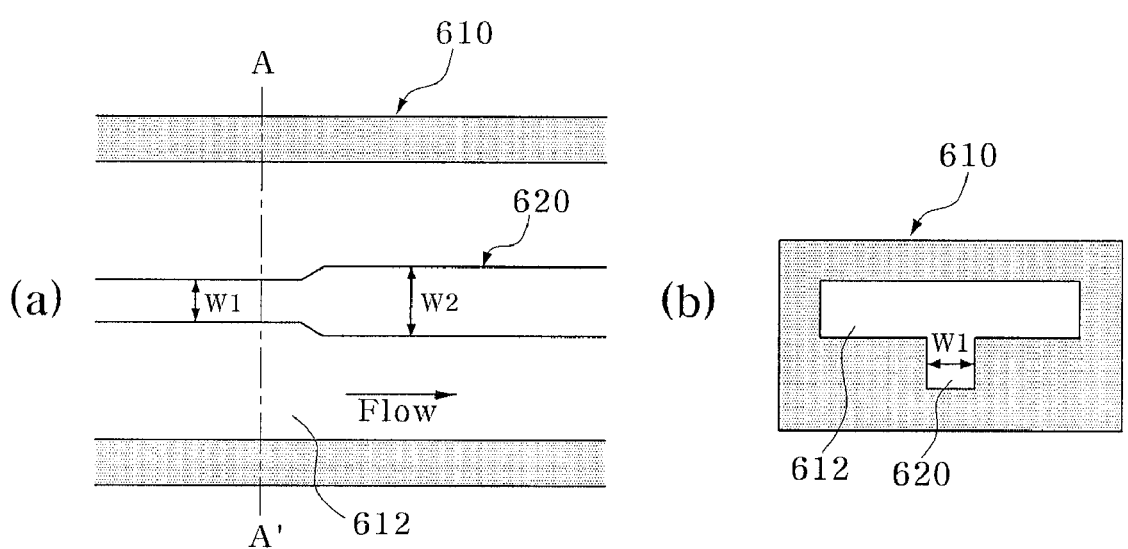
FIGS. 6 to 11 are diagrams for explaining another embodiment of the rail which can be adopted in the fluidic channel system shown in FIG. 1, and one embodiment of a method of fabricating a fine structure, which show an example in which the width of a rail is changed such that a fine structure can be easily moved along the rail.
Figure 7:
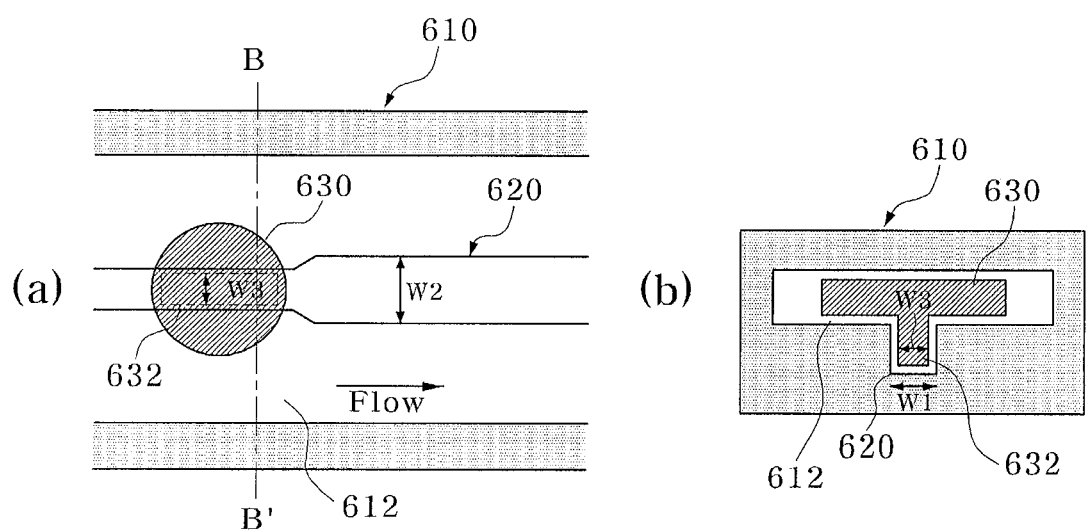
Figure 8:
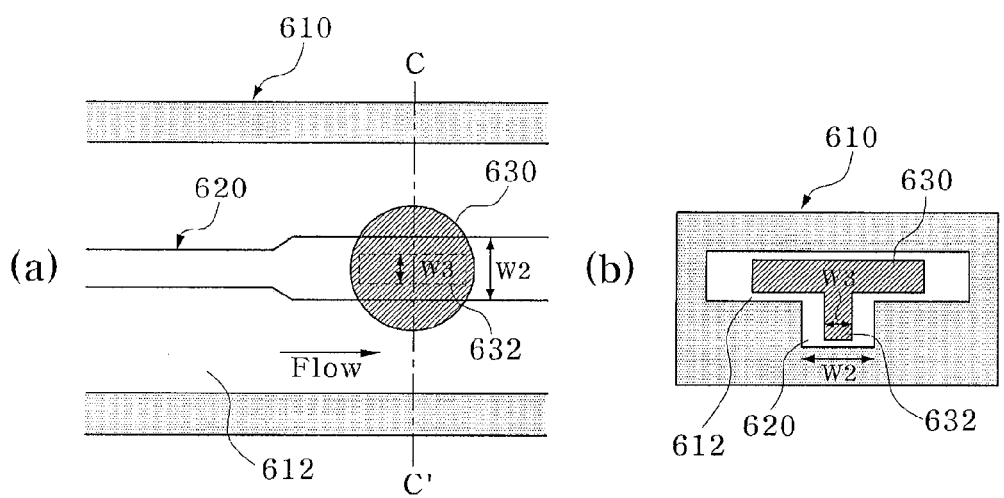

Referring to FIG. 6, a photocurable fluid 612 flows through a fluidic channel 610 having a groove-shaped rail 620 mounted therein, and the width W1 of the rail 620 in a region where a fine structure is produced is set to be smaller than the width W2 of the rail 620 in a region where the fine structure moves. Referring to FIG. 7, light is radiated onto the photocurable fluid 612 to form a fine structure 630 having a protrusion-shaped guide 632. The width W3 of the guide 632 formed in such a manner is slightly smaller than the width W1 of the rail. Referring to FIG. 8, the fine structure 630 is moved along the rail 620 into the region having a relatively large width W2 by the flow of the photocurable fluid 612. When the rail 620 is not too tight for the guide 632, the movement of the fine structure 630 is not hindered by friction between the guide 632 and the rail 620. In particular, when the guide 632 has a large length and the rail 620 is curved, the fine structure 630 may not be moved at all. In this case, when the width W2 of the rail 620 in the region where the fine structure 630 moves is larger than the width W1 of the rail 620 in the region where the fine structure 630 is produced, such a phenomenon can be prevented. When the width W2 of the rail 620 in the region where the fine structure 630 moves is larger than the width W1 of the rail 620 in the region where the fine structure 630 is produced, it does not necessarily mean that the width W2 of the rail 620 in the entire region where the fine structure 630 moves is larger than the width W1 of the rail 620 in the region where the fine structure 630 is produced, but that the width W2 of the rail 620 in a portion of the region where the fine structure 630 moves is larger than the width W1 of the rail 620 in the region where the fine structure 630 is produced. For example, the width of the rail 620 in a curved portion of the region where the fine structure 630 moves may be larger than that in the region where the fine structure 630 is produced.

Figure 9:
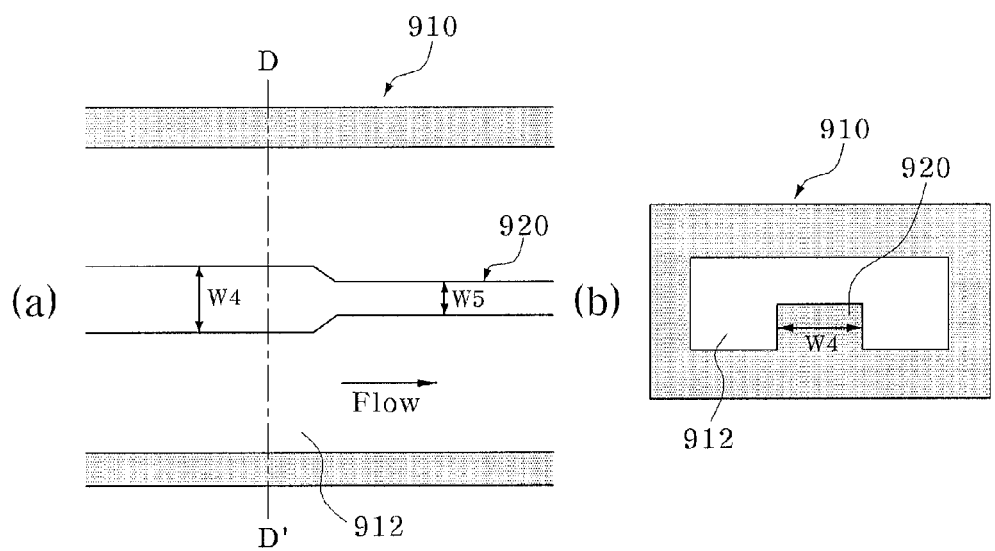
Figure 10:
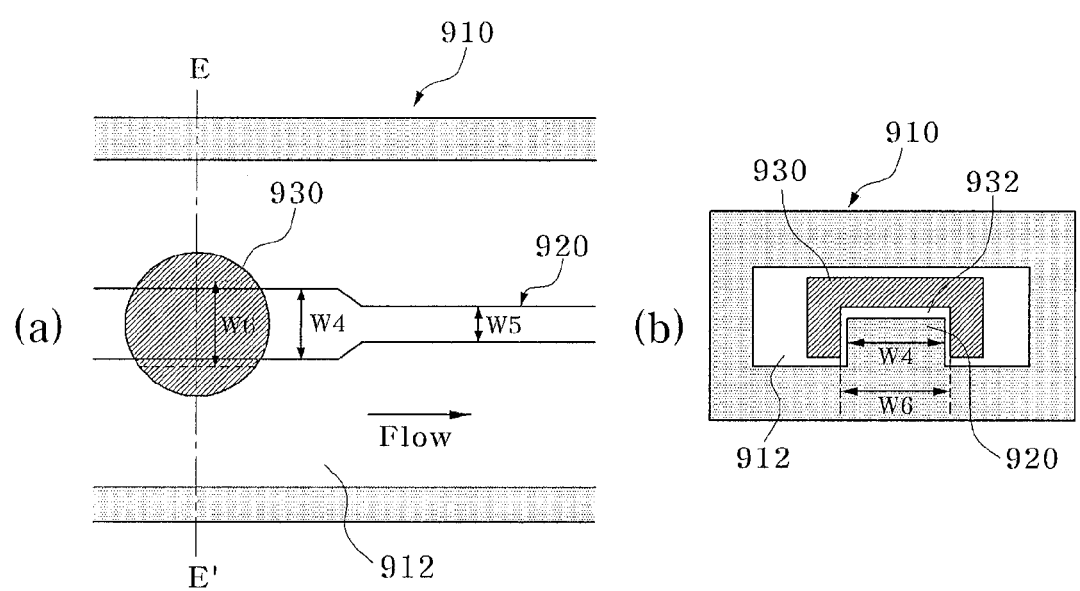
Figure 11:
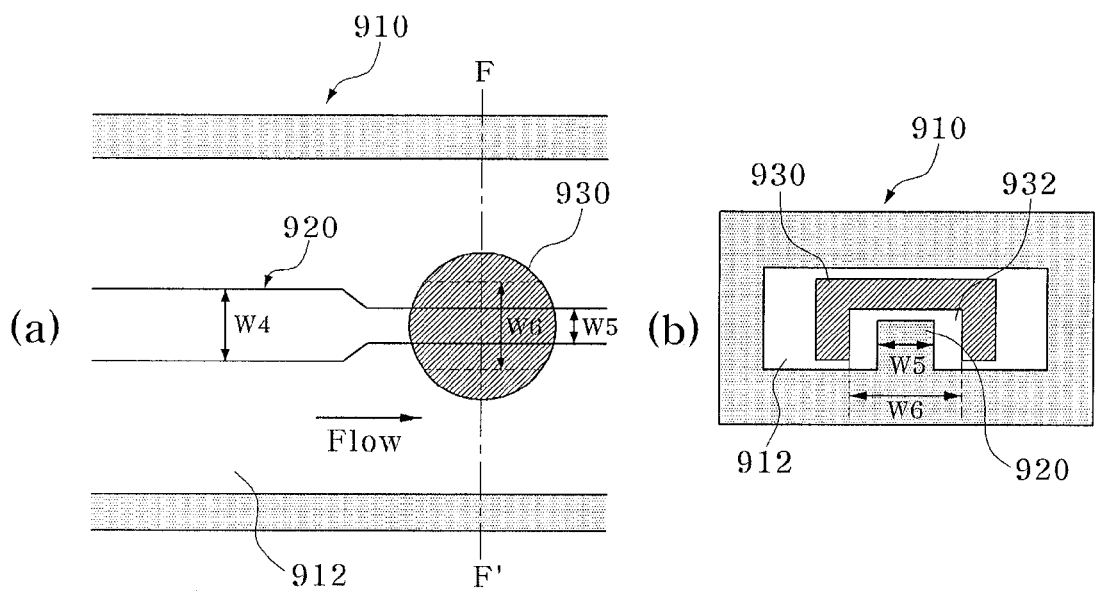

Referring to FIG. 9, a photocurable fluid 912 flows through a fluidic channel 910 having a protrusion-shaped rail 920 mounted thereon, and the width W4 of the rail 920 in a region where a fine structure is produced is set to be larger than the width W5 of the rail 920 in a region where the fine structure moves. Referring to FIG. 10, light is radiated onto the photocurable fluid 912 to form a fine structure 930 having a groove-shaped guide 932. The guide 932 formed in such a manner has a slightly larger width W6 than the width W4 of the rail. Referring to FIG. 11, the fine structure 930 is moved along the rail 920 into the region having a relatively small width W5 by the flow of the photocurable fluid 912. When the rail 920 is not too tight for the guide 932, the fine structure 930 moves smoothly. When the width W5 of the rail 920 in the region where the fine structure 930 moves is smaller than the width W4 of the rail 920 in the region where the fine structure 930 is produced, it does not necessarily mean that the width W5 of the rail 920 in the entire region where the fine structure 930 moves is smaller than the width W4 of the rail 920 in the region where the fine structure 930 is produced, but that the width W5 of the rail 920 in a portion of the region where the fine structure 930 moves is smaller than the width W4 of the rail 920 in the region where the fine structure 930 is produced. For example, the width of the rail 920 in a curved portion of the region where the fine structure 930 moves may be smaller than that in the region where the fine structure 930 is produced.

As described above, in order to increase the distance between the guide 632 or 932 and the rail 620 or 920, the width of the rail 620 or 920 in the region where the fine structure 630 or 930 is produced may be set to be different from in the region where the fine structure 630 or 930 moves. In this case, the fine structure 630 or 930 can move more easily. Such a technical idea can be applied to another rail having a different shape. For example, the width of the rail 550 shown in (e) of FIG. 5 in a region where the fine structure 556 moves may be set to be smaller than that in a region where the fine structure 556 is produced. Then, the fine structure 556 can move more easily.

FIGS. 12 to 17 are diagrams for explaining another embodiment of the rail which can be adopted in the fluidic channel system shown in FIG. 1, and another embodiment of a method of fabricating a fine structure. In particular, FIGS. 12 to 17 show an example in which a fine structure passes through an interface between fluids. (a) of each of FIGS. 12 to 17 is an opened-up plan view of a fluidic channel, and (b) of each of FIGS. 12 to 17 is a cross-sectional view of the fluidic channel, taken along the dashed line of (a) of each of FIGS. 12 to 17.

Figure 12:
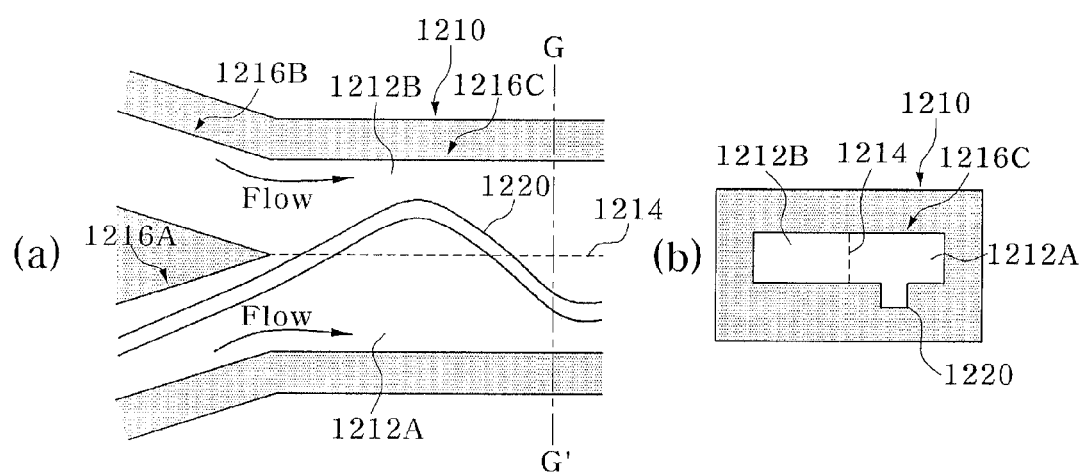
FIGS. 12 to 17 are diagrams for explaining another embodiment of the rail which can be adopted in the fluidic channel system shown in FIG. 1, and another embodiment of a method of fabricating a fine structure, which show an example in which a fine structure passes through an interface between fluids.
Figure 13:
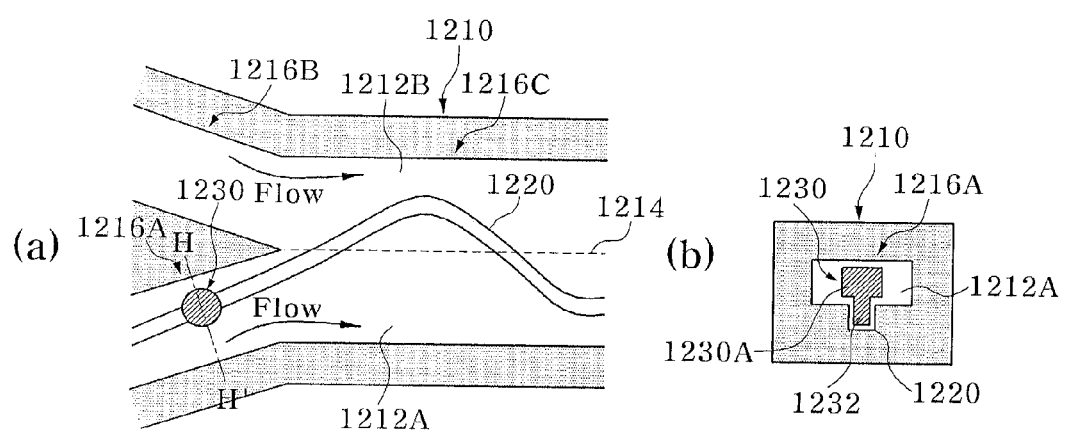
Figure 14:
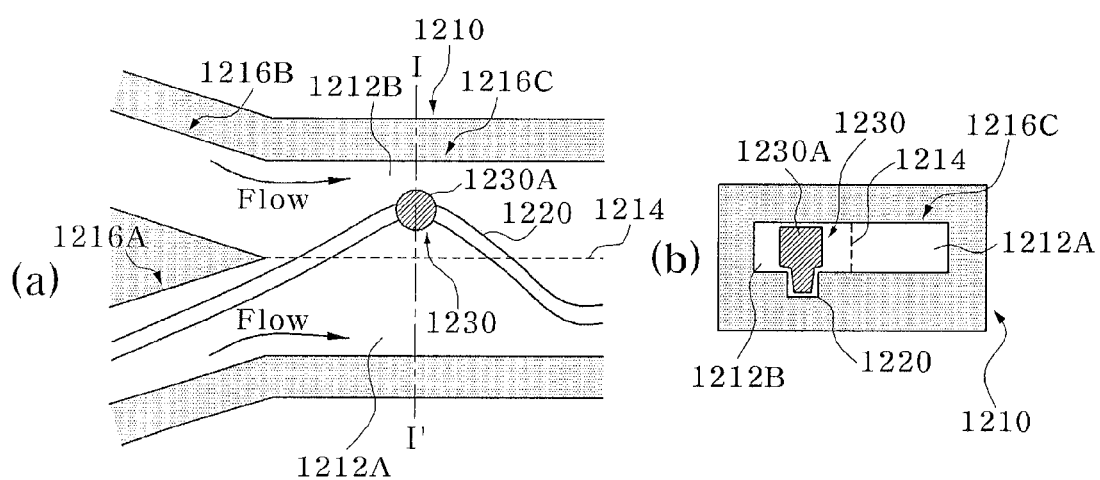
Figure 15:
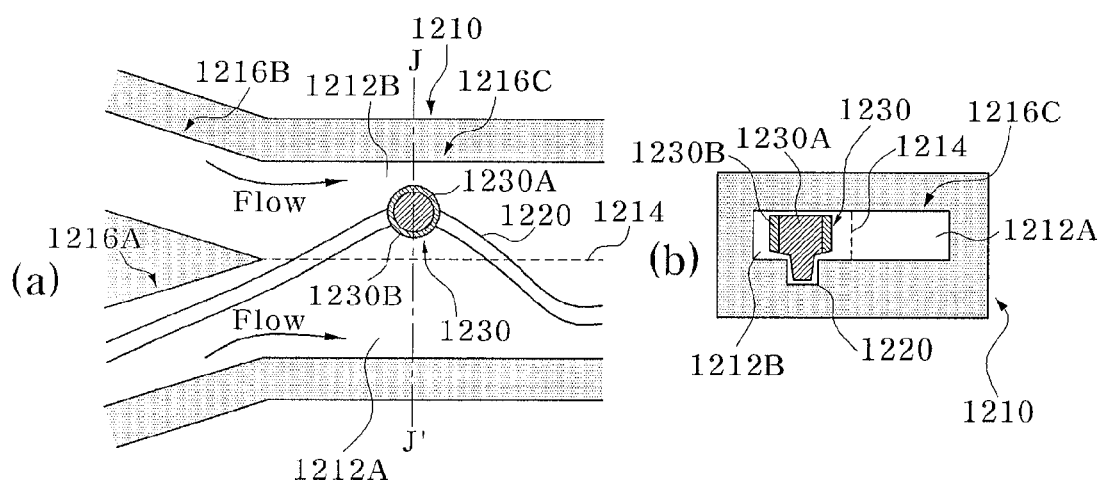
Figure 16:
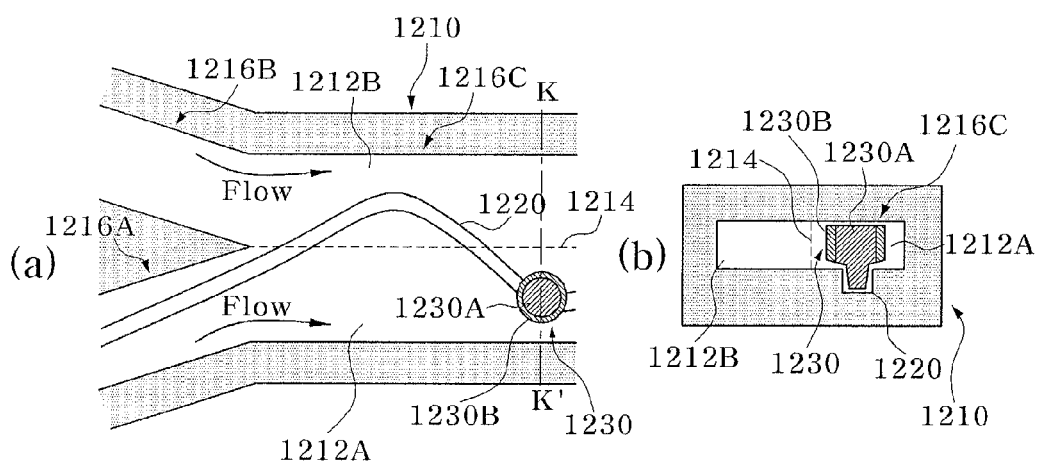
Figure 17:
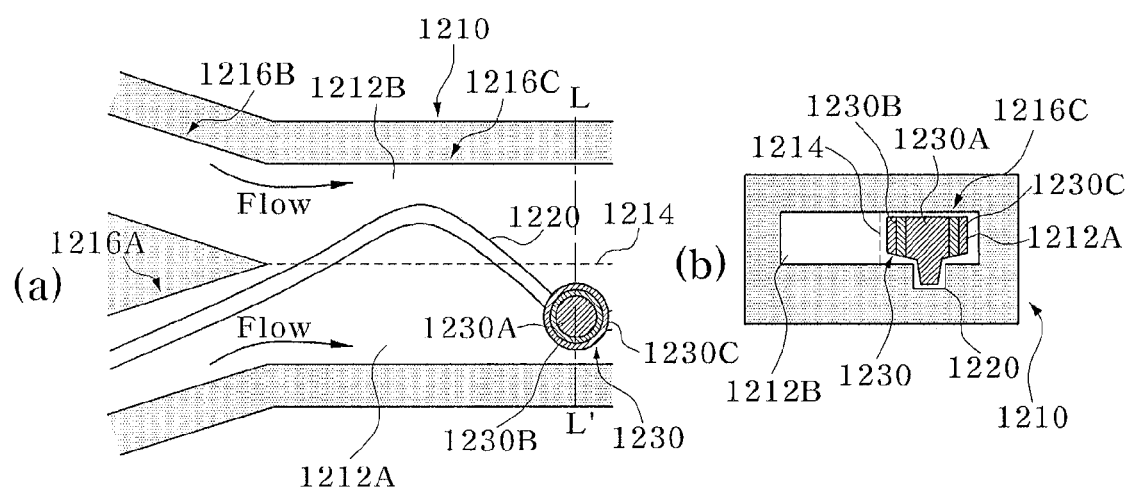

Referring to FIG. 12, two different kinds of first and second fluids 1212A and 1212B flow along a fluidic channel 1210, and an interface 1214 is formed between the fluids 1212A and 1212B. The first fluid 1212A is introduced into a third passage 1216C positioned in the fluidic channel 1210 through a first passage 1216A positioned in the fluidic channel 1210, and the second fluid 1212B is introduced into the third passage 1216C through a second passage 1216B positioned in the fluidic channel 1210. A rail 1220 is formed to intersect the interface 1214. The first and second fluids 1212A and 1212B may be a photocurable fluid. Constituents of the fluids 1212A and 1212B may be different from each other. Alternatively, constituents of the fluids 1212A and 1212B may be the same as each other, but components (for example, nanostructures or particles) dispersed in the fluids 1212A and 1212B may be different from each other. In this embodiment, two fluids 1212A and 1212B flow, but three or more fluids may flow. Referring to FIG. 13, light is radiated onto the first fluid 1212A to form a fine structure 1230 having a guide 1232 provided thereon. Since the fine structure 1230 is formed by curing the first fluid 1212A, the fine structure 1230 includes a first polymer 1230A formed by curing the first fluid 1212A. Referring to FIG. 14, since the fine structure 1230 moves along a rail 1220, the fine structure 1230 moves from the first fluid 1212A through the interface 1214 to the second fluid 1212B. If the rail 1220 is not provided, the produced fine structure 1230 will move along the first fluid 1212A. In this embodiment, since the rail 1220 and the guide 1232 are provided to intersect the interface 1214, the fine structure 1230 can move from the first fluid 1212A through the interface 1214 between the first and second fluids 1212A and 1212B to the second fluid 1212B. Referring to FIG. 15, light is radiated onto the second fluid 1212B to form a second polymer 1230B. Then, the fine structure 1230 includes the first polymer 1230A and the second polymer 1230B formed by curing the second fluid 1212B. Referring to FIG. 16, as the fine structure 1230 moves along the rail 1220, the fine structure 1230 moves from the second fluid 1212B through the interface 1214 to the first fluid 1212A. Referring to FIG. 17, light is radiated onto the first fluid 1212A to form a third polymer 1230C. Then, the fine structure 1230 includes the first polymer 1230A, the second polymer 1230B, and the third polymer 1230C formed by curing the first fluid 1212A.

As shown in the drawings, when the fluidic channel 1210 having the rail 1220 disposed therein is used, the fine structure 1230 can be controlled to pass through the interface 1214 between the fluids 1212A and 1212B. Further, when the fluidic channel 1210 having the rail 1220 disposed therein is used, it is possible to form the fine structure 1230 composed of different materials 1230A and 1230B.

FIGS. 18 to 21 are diagrams for explaining another embodiment of the rail which can be adopted in the fluidic channel system shown in FIG. 1, and another embodiment of a method of fabricating a fine structure. In particular, FIGS. 18 to 21 show another example in which a fine structure passes through an interface between fluids. FIGS. 18 to 21 are opened-up plan views of a fluidic channel.

Figure 18:
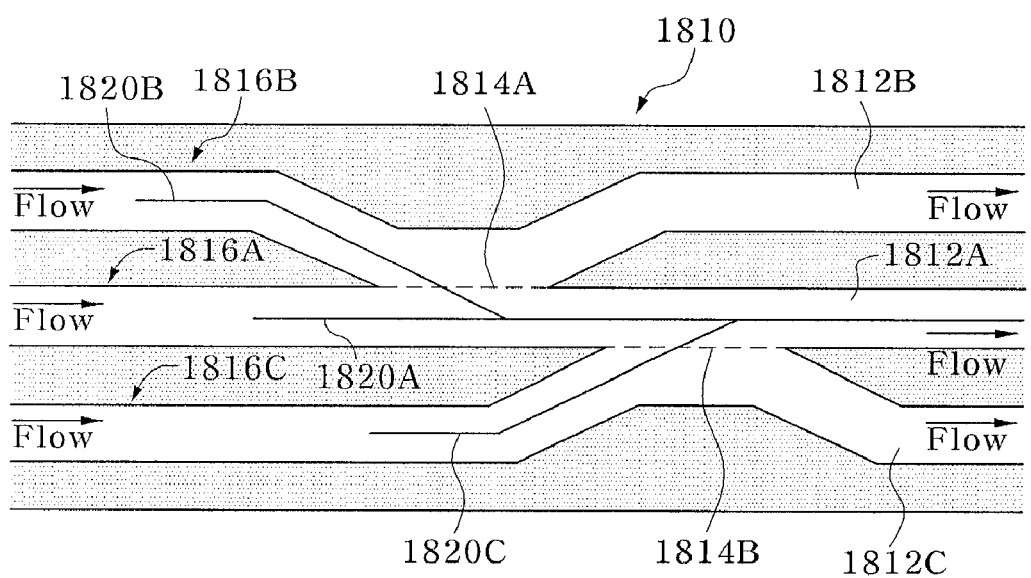
FIGS. 18 to 21 are diagrams for explaining another embodiment of the rail which can be adopted in the fluidic channel system shown in FIG. 1, and another embodiment of a method of fabricating a fine structure, which show another example in which a fine structure passes through an interface between fluids.

Referring to FIG. 18, a first fluid 1812A flows along a first passage 1816A positioned inside a fluidic channel 1810, a second fluid 1812B flows along a second passage 1816B positioned inside the fluidic channel 1810, and a third fluid 1812C flows along a third passage 1816C positioned inside the fluidic channel 1810. A first interface 1814A is formed between the first and second fluids 1812A and 1812B, and a second interface 1814B is formed between the first and third fluids 1812A and 1812C. In this embodiment, all the fluids 1812A to 1812C are photocurable, but some or all of the fluids 1812A to 1812C may not be photocurable. A second rail 1820B intersects the first interface 1814A to join a first rail 1820A, and a third rail 1820C intersects the second interface 1814B to join the first rail 1820A.

Figure 19:
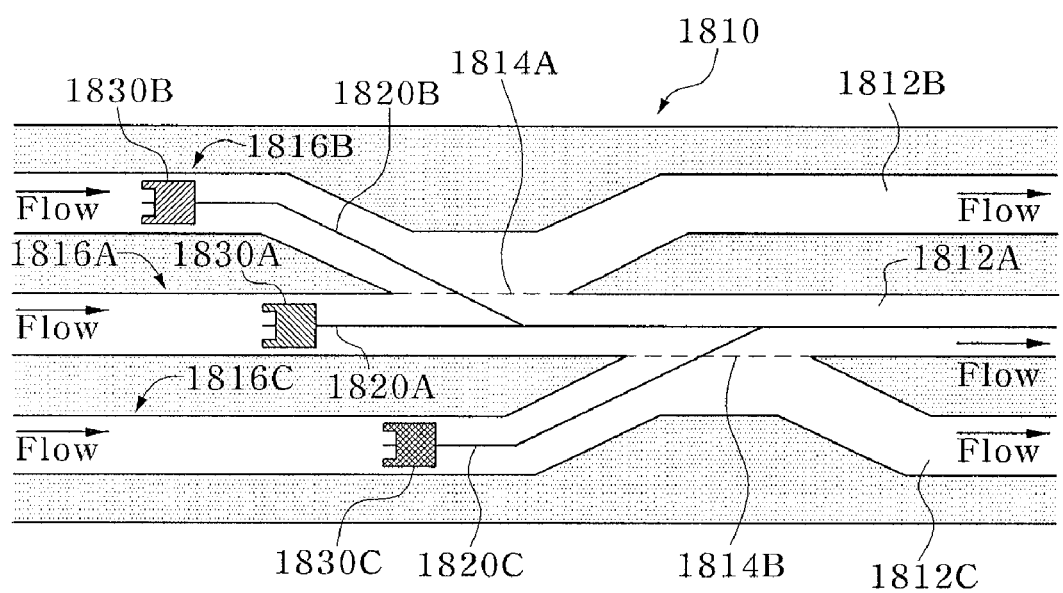

Referring to FIG. 19, light is radiated to form first to third fine structures 1830A to 1830C having a guide provided thereon. The first fine structure 1830A, the second fine structure 1830B, and the third fine structure 1830C are formed by curing the first photocurable fluid 1812A, the second photocurable fluid 1812B, and the third photocurable fluid 1812C, respectively. The fine structures 1830A to 1830C may be formed simultaneously or sequentially according to a specific order.

Figure 20:
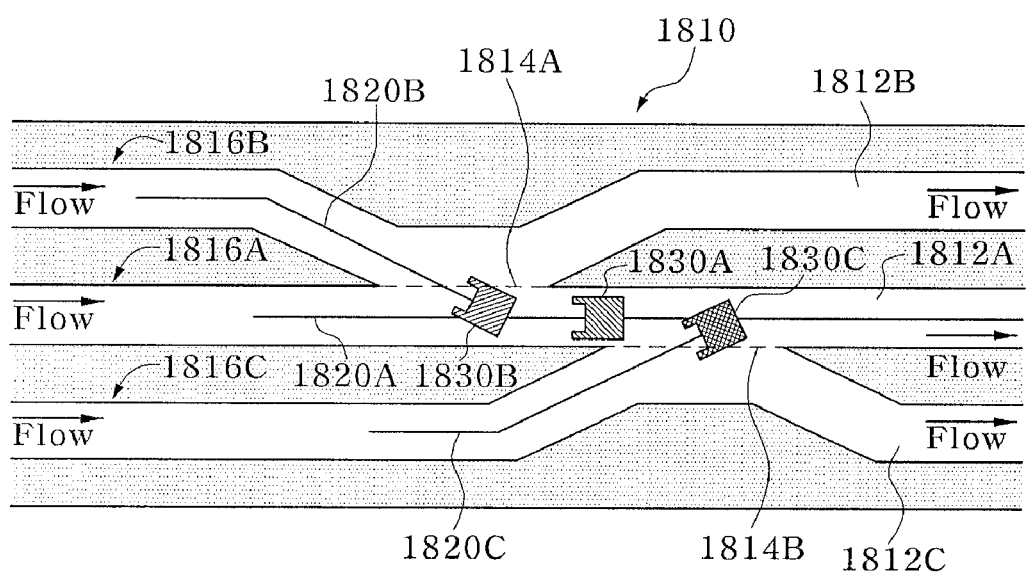

Referring to FIG. 20, as the second fine structure 1830B moves along the second rail 1820B, the second fine structure 1830 moves from the second fluid 1812B through the first interface 1814A to the first fluid 1812A. Further, as the third fine structure 1830C moves along the third rail 1820C, the third fine structure 1830C moves from the third fluid 1812C through the second interface 1814B to the first fluid 1812A. Further, the first fine structure 1830A moves along the first rail 1820A inside the first fluid 1812A. In this embodiment, since the rails 1820B and 1820C are formed to intersect the interfaces 1814A and 1814B, the fine structures 1830B and 1830C can move from the second and third fluids 1812B and 1812C through the interfaces 1814A and 1814B to the first fluid 1812A.

Figure 21:
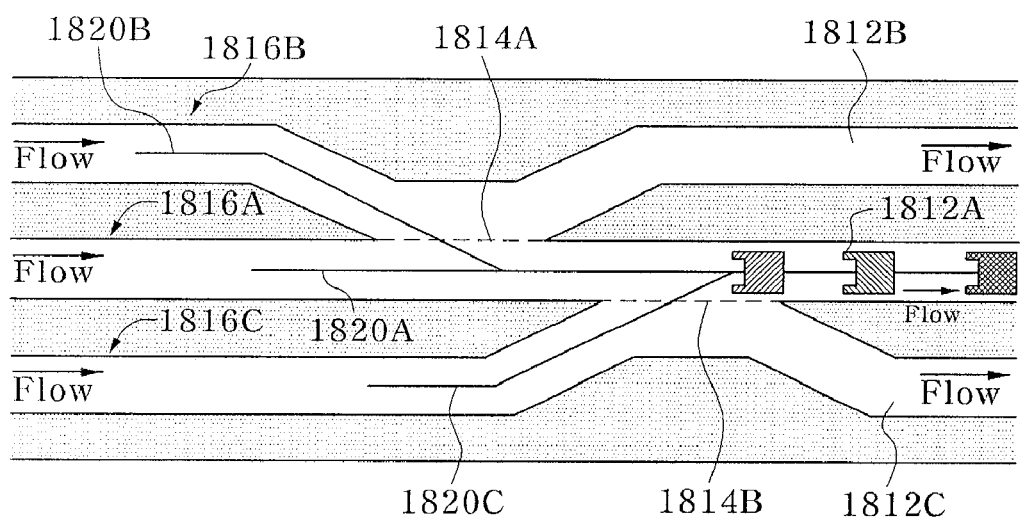

Referring to FIG. 21, since the second and third rails 1820B and 1820C are connected to the first rail 1820A, the second and third fine structures 1830B and 1830C move to the first rail 1820A to move along the first rail 1820A. The first fine structure 1830A also moves along the first rail 1820A.

As shown in the drawings, when the fluidic channel 1810 having the rails 1820A to 1820C provided therein is used, the fine structures 1830B and 1830C can be controlled to pass through the interfaces 1814A and 1814B. When the fluidic channel 1810 having the rails 1820A to 1820C provided therein is used, the fine structures 1830A to 1830C formed in the respective rails 1820A to 1820C can be controlled in such a manner that they move to one rail 1820A to move along the rail 1820A.

Figure 22:
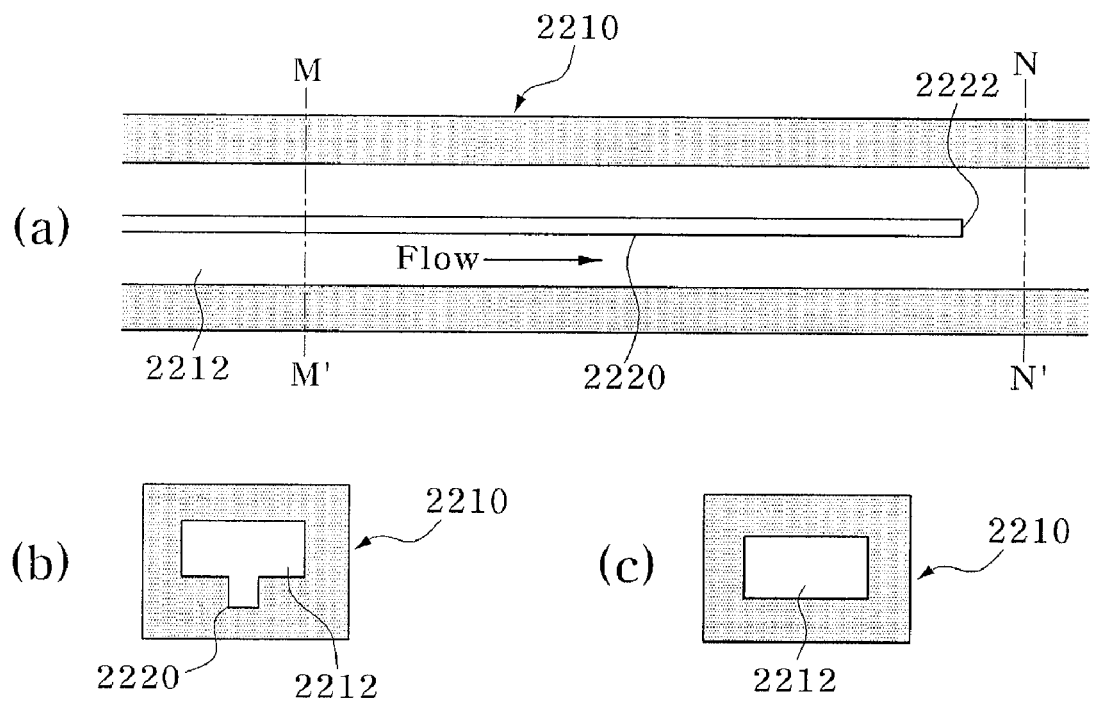
FIGS. 22 to 25 are diagrams for explaining another embodiment of the rail which can be adopted in the fluidic channel system shown in FIG. 1, and another embodiment of a method of fabricating a fine structure, which show an example in which a one-dimensional array of fine structures is formed at an end of a rail.
Figure 23:
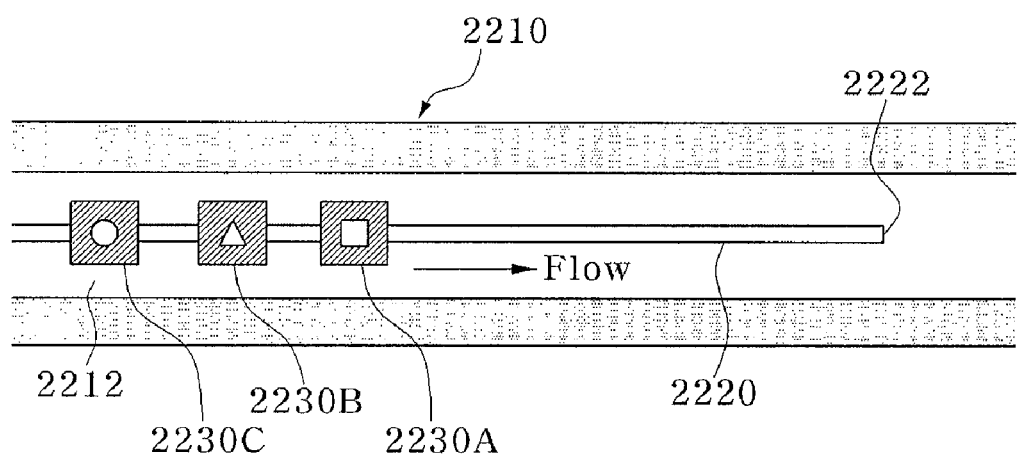
Figure 24:
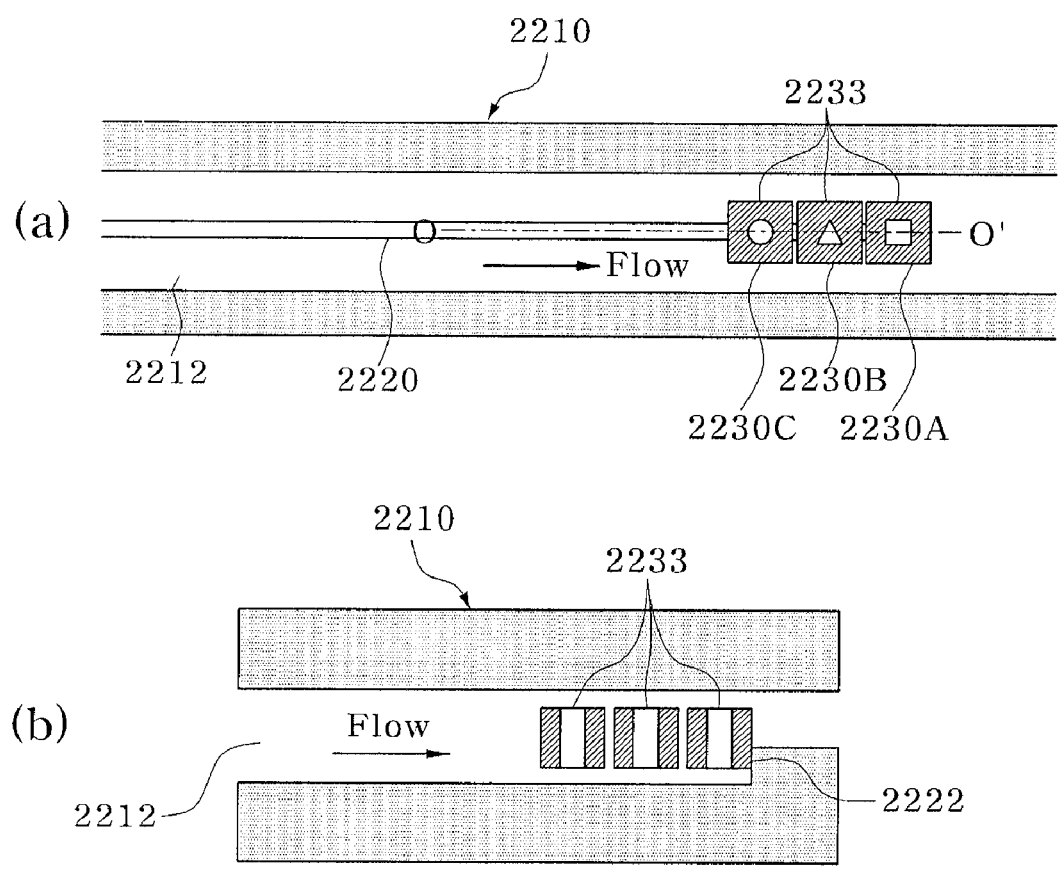

FIGS. 22 to 25 are diagrams for explaining another embodiment of the rail which can be adopted in the fluidic channel system shown in FIG. 1, and another embodiment of a method of fabricating a fine structure. In particular, FIGS. 22 to 25 show an example in which a one-dimensional array of fine structures is formed at an end of a rail. (a) of each of FIGS. 22, 23 and 24, and FIG. 25 are opened-up plan views of a fluidic channel. (b) and (c) of FIG. 22 are cross-sectional views of the fluidic channel shown in (a) of FIG. 22, taken along lines M-M' and N-N'. (b) of FIG. 24 is a cross-sectional view of the fluidic channel shown in (a) of FIG. 24, taken along line O-O'.

Referring to FIG. 22, a fluid 2212 flows through a fluidic channel 2210. The fluid 2212 may be a photocurable fluid. A rail 2220 is positioned inside the fluidic channel 2210, and the rail 2220 has an end 2222.

Referring to FIG. 23, light is radiated to form fine structures 2230A to 2230C having a guide. FIG. 23 shows an example in which the fine structures 2230A to 2230C are formed by curing the one fluid 2212. However, the fine structures 2230A to 2230C may be produced from a variety of fluids. For example, the first fine structure 2230A may be formed while a first photocurable fluid flows, the second fine structure 2230B may be formed while a second photocurable fluid flows, and the third fine structure 2230C may be formed while a third photocurable fluid flows. Similar to the embodiment shown in FIGS. 18 to 21, the fine structures 2230A to 2230C may be produced from different fluids in different passages positioned in the fluidic channel 2210, and the produced fine structures 2230A to 2230C may be moved to one passage.

Referring to FIG. 24, when the fine structures 2230A to 2230C meet the end 2222 of the rail 2220 while moving along the fluid 2212, they are stopped. More specifically, the first fine structure 2230A is stopped at the end of the rail 2222, the second fine structure 2230B is stopped behind the first fine structure 2230A, and the third fine structure 2230C is stopped behind the second fine structure 2230B. As shown in FIG. 24, when the rail 2220 having the end 2222 provided therein is used, it is possible to easily form a one-dimensional array 2233 of the fine structures 2230A to 2230C.

Figure 25:
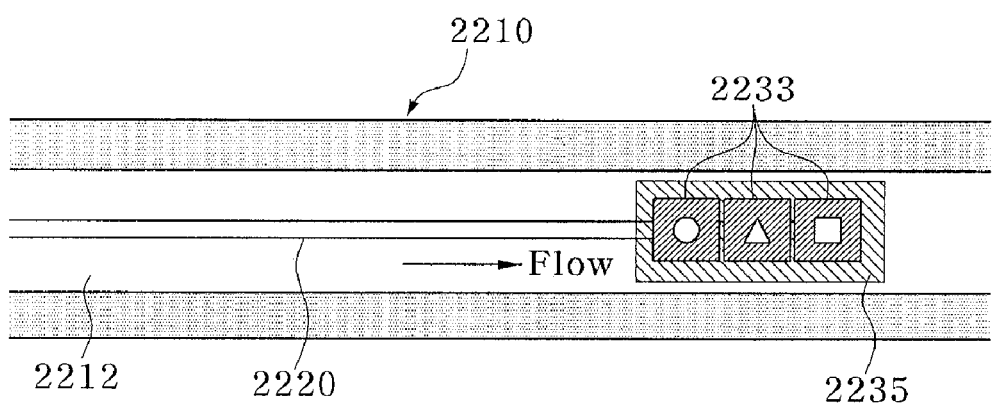

According to some other embodiments, additional light may be radiated to form a fine structure 2235 for fixation, which integrates the one-dimensional array 2233, as shown in FIG. 25. Fluid used for forming the fine structure 2235 for fixation may be the same as or different from the fluid used for forming the one-dimensional array 2233. In one example, the one-dimensional array 2233 may be formed while the first photocurable fluid flows, and the fine structure 2235 for fixation may be formed while the second photocurable fluid flows.

Figure 26:
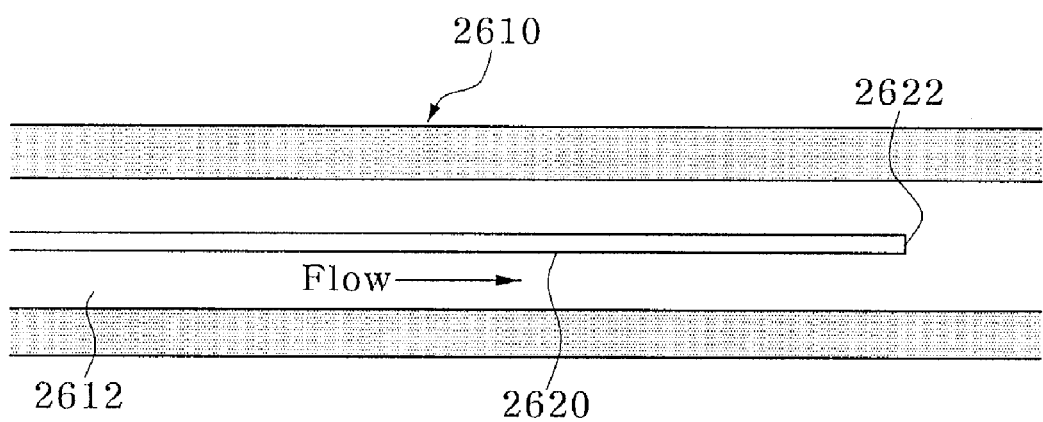
FIGS. 26 to 28 are diagrams for explaining another embodiment of the rail which can be adopted in the fluidic channel system shown in FIG. 1, and another embodiment of a method of fabricating a fine structure, which show another example in which a one-dimensional array of fine structures is formed at an end of a rail.
Figure 27:
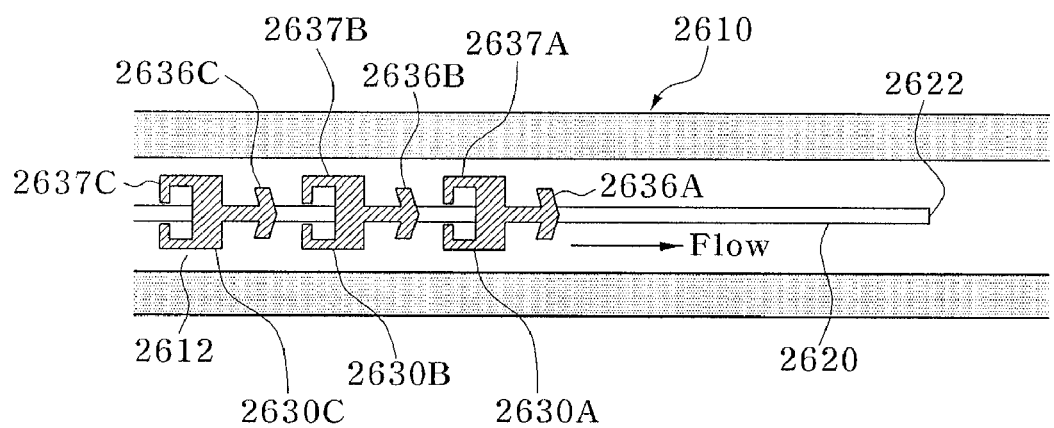
Figure 28:
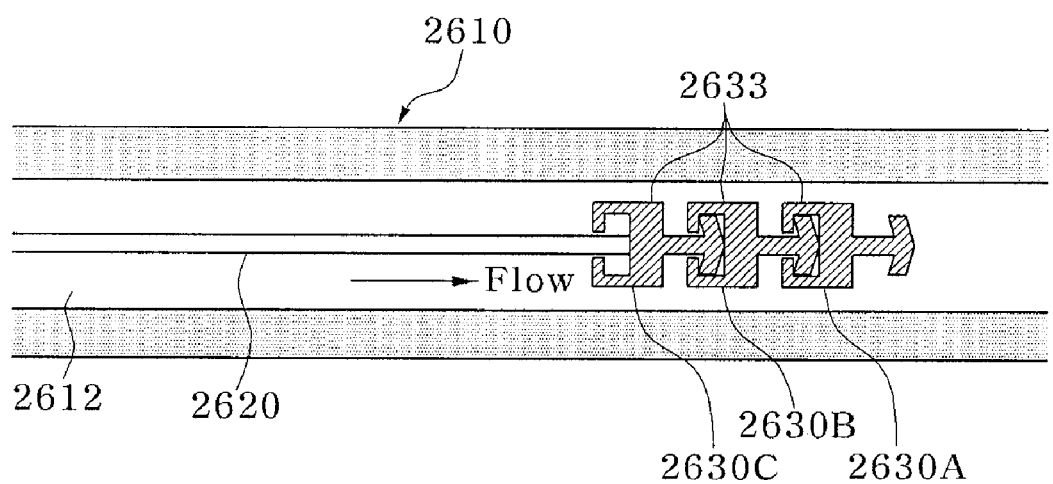

FIGS. 26 to 28 are diagrams for explaining another embodiment of the rail which can be adopted in the fluidic channel system shown in FIG. 1, and another embodiment of a method of fabricating a fine structure. In particular, FIGS. 26 to 28 show another example in which a one-dimensional array of fine structures is formed at an end of a rail. FIGS. 26 to 28 are opened-up plan views of a fluidic channel.

Referring to FIG. 26, a fluid 2612 flows through a fluidic channel 2610. The fluid 2612 may be a photocurable fluid. A rail 2620 is positioned inside the fluidic channel 2610, and the rail 2620 has an end 2622.

Referring to FIG. 27, light is radiated to form fine structures 2630A to 2630C having a guide. Each of the fine structures may have latches such that they are coupled to an adjacent fine structure. The fine structures 2630A to 2630C include male latches 2636A to 2636C and female latches 2637A to 2637C, respectively. The male latch 2636A, 2636B, or 2636C and the female latch 2637A, 2637B, or 2637C are shaped so that they are easy to couple and hard to separate.

Referring to FIG. 28, when the fine structures 2630A to 2630C meet the end 2622 of the rail 2620 while moving along the 2612, they are stopped. Then, a one-dimensional array of the fine structures 2630A to 2630C is formed. While the fine structures 2630A to 2630C are stopped at the end of the rail 2620, the first female latch 2637A is coupled to the second male latch 2636B, and the second female latch 2637A is coupled to the third male latch 2636C. Since the fine structures 2630A to 2630C are coupled through the male latches 2536A to 2636C and the female latches 2637A to 2637C, the fine structures 2630A to 2630C may be integrated, without such a separate integration process as shown in FIG. 25. Further, since the latches 2636A to 2636C and 2637A to 2637C are flexible, the male latches 2636A to 2636C and the female latches 2637A to 2637C can be easily coupled. To reinforce the coupling among the fine structures 2630A to 2630C, the integration process as shown in FIG. 25 may be additionally performed.

FIGS. 29 to 32 are diagrams for explaining another embodiment of the rail which can be adopted in the fluidic channel system shown in FIG. 1, and another embodiment of a method of fabricating a fine structure. In particular, FIGS. 29 to 32 show an example in which a two-dimensional array of fine structures is formed at ends of rails. FIGS. 29 to 32 are opened-up plan views of a fluidic channel.

Figure 29:
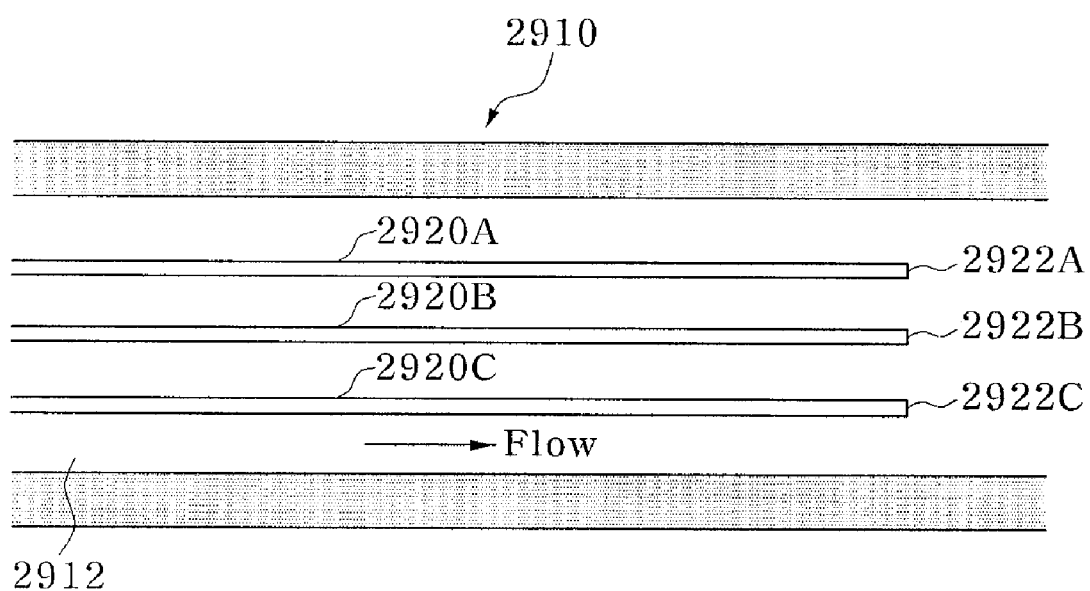
FIGS. 29 to 32 are diagrams for explaining another embodiment of the rail which can be adopted in the fluidic channel system shown in FIG. 1, and another embodiment of a method of fabricating a fine structure, which show an example in which a two-dimensional array of fine structures is formed at ends of rails.

Referring to FIG. 29, a fluid 2912 flows through a fluidic channel 2910. The fluid 2912 may be a photocurable fluid. Rails 2920A to 2920C are positioned inside the fluidic channel 2910, and have ends 2922A to 2922C, respectively.

Figure 30:
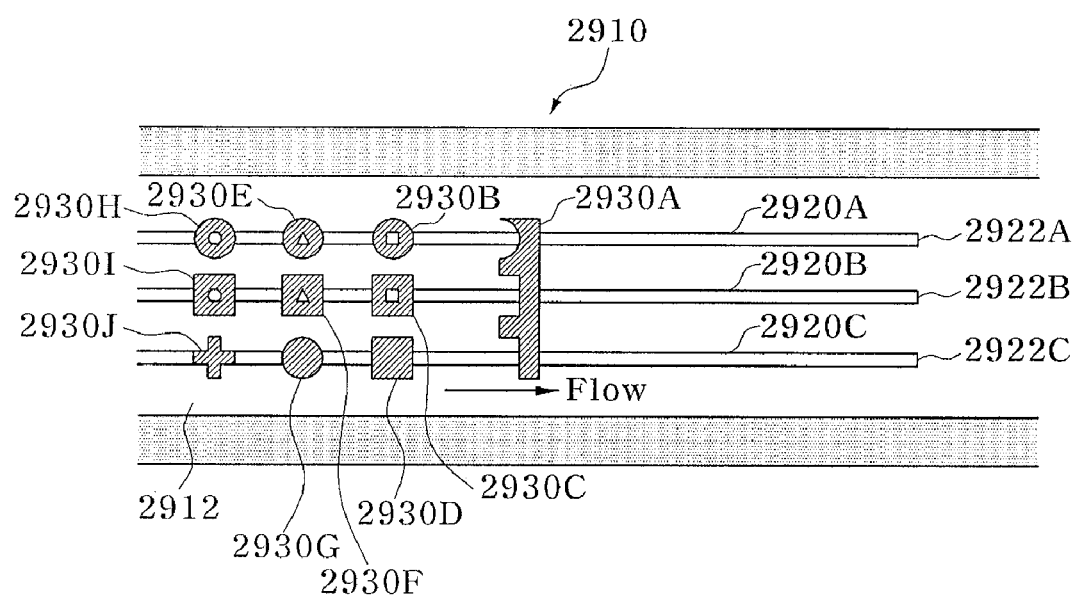

Referring to FIG. 30, light is radiated to form fine structures 2930A to 2930J having a guide. FIG. 30 shows an example in which the fine structures 2930A to 2930J are formed by curing one kind of fluid 2912. However, the fine structures 2930A to 2930J may be produced from various fluids. For example, while first to third photocurable fluids flow in parallel to one another, the fine structures 2930A to 2930J may be formed. In this case, the second, fifth, and eighth fine structures 2930B, 2930E, and 2930H may be formed by curing the first photocurable fluid, the third, sixth, and seventh fine structures 2930C, 2930F, and 2930I may be formed by curing the second photocurable fluid, the fourth, seventh, and tenth fine structures 2930D, 2930G, and 2930J may be formed by curing the third photocurable fluid, and the first fine structure 2930A may be formed by curing the first to third photocurable fluids.

Figure 31:
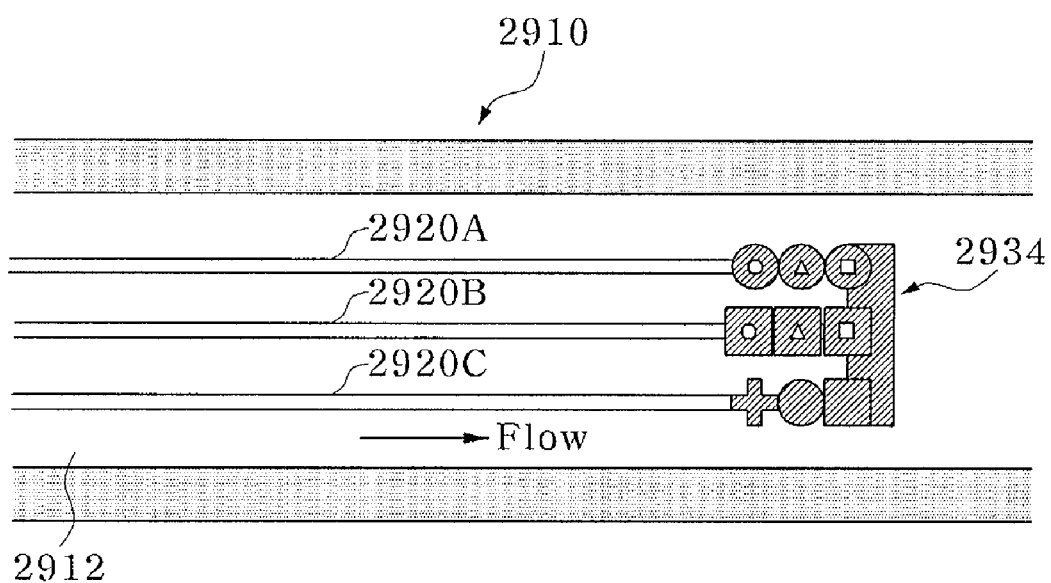

Referring to FIG. 31, when the fine structures 2930A to 2930J meet the ends 2922A to 2922C of the rails 2920A to 2920C while moving along the fluid 2912, they are stopped at the ends 2922A to 2922C. As shown in FIG. 31, when the rails 2920A to 2920C having the ends 2922A to 2922C, respectively, are used, it is possible to easily form a two-dimensional array 2934 of the fine structures 2930A to 2930J.

Figure 32:
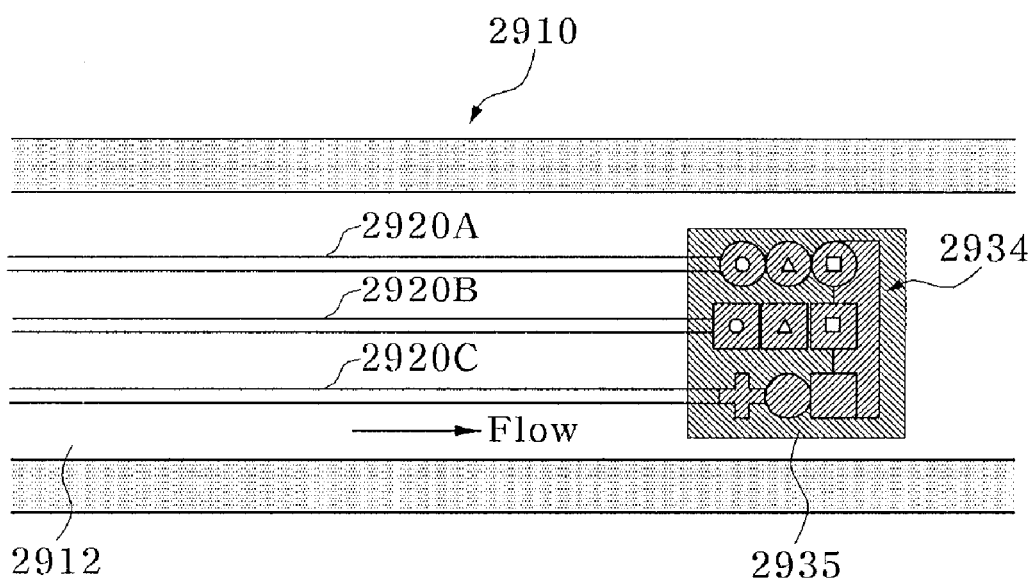

According to some other embodiments, additional light may be radiated to form a fine structure 2935 for fixation, which integrates the two-dimensional array 2934, as shown in FIG. 32. The fluid used for forming the fine structure 2935 for fixation may be the same as or different from the fluid used for forming the two-dimensional array 2934.

Figure 33:
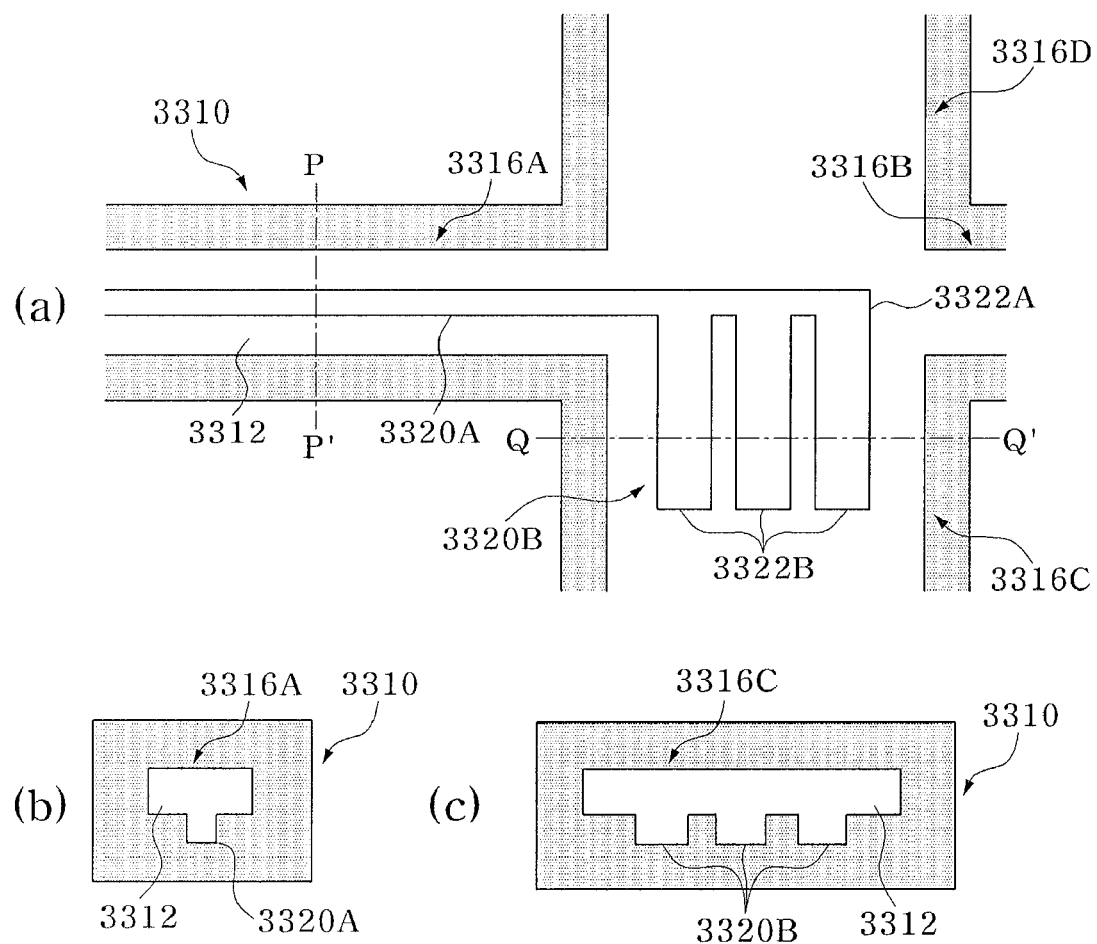
FIGS. 33 to 40 are diagrams for explaining another embodiment of the rail which can be adopted in the fluidic channel system shown in FIG. 1, and another embodiment of a method of fabricating a fine structure, which show another example in which a two-dimensional array of fine structures is formed at ends of rails.

FIGS. 33 to 40 are diagrams for explaining another embodiment of the rail which can be adopted in the fluidic channel system shown in FIG. 1, and another embodiment of a method of fabricating a fine structure. In particular, FIGS. 33 to 40 show another example in which a two-dimensional array of fine structures is formed at ends of rails. (a) of FIG. 33 and FIGS. 34 to 40 are opened-up plan views of a fluidic channel. (b) and (c) of FIG. 33 are cross-sectional views of the fluidic channel shown in (a) of FIG. 33, taken along lines P-P' and Q-Q'.

Referring to FIG. 33, a fluid 3312 flows through a fluidic channel 3310. First to fourth passages 3316A to 3316D are positioned inside the fluidic channel 3310. The fluid 3312 may be a photocurable fluid. Rails 3320A and 3320B are positioned inside the fluidic channel 3310 and have ends 3322A and 3322B, respectively.

Figure 34:
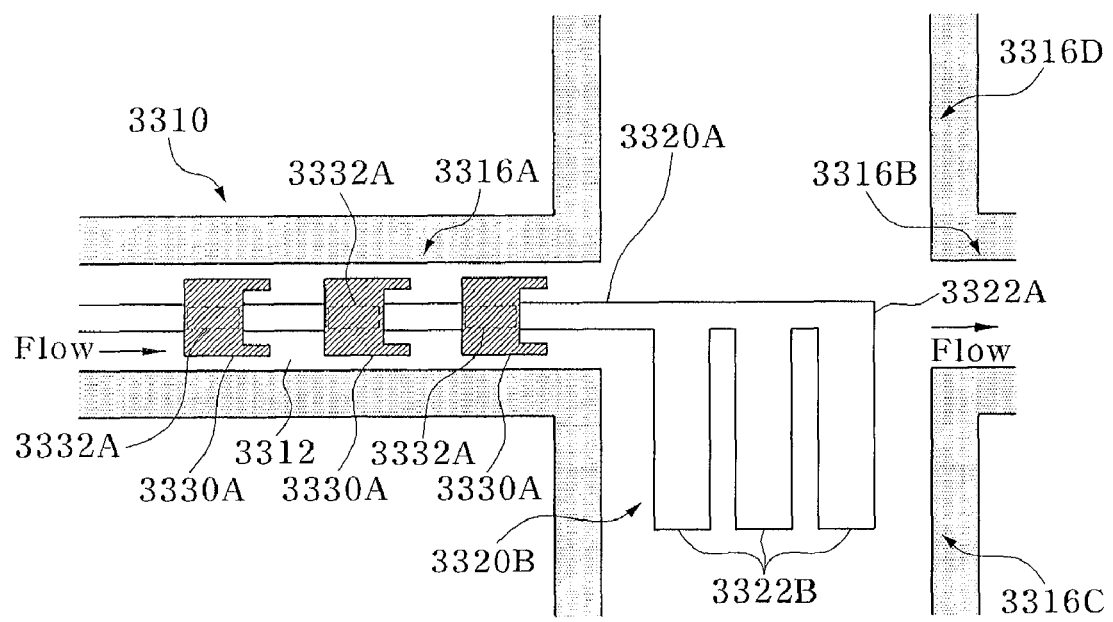
Figure 35:
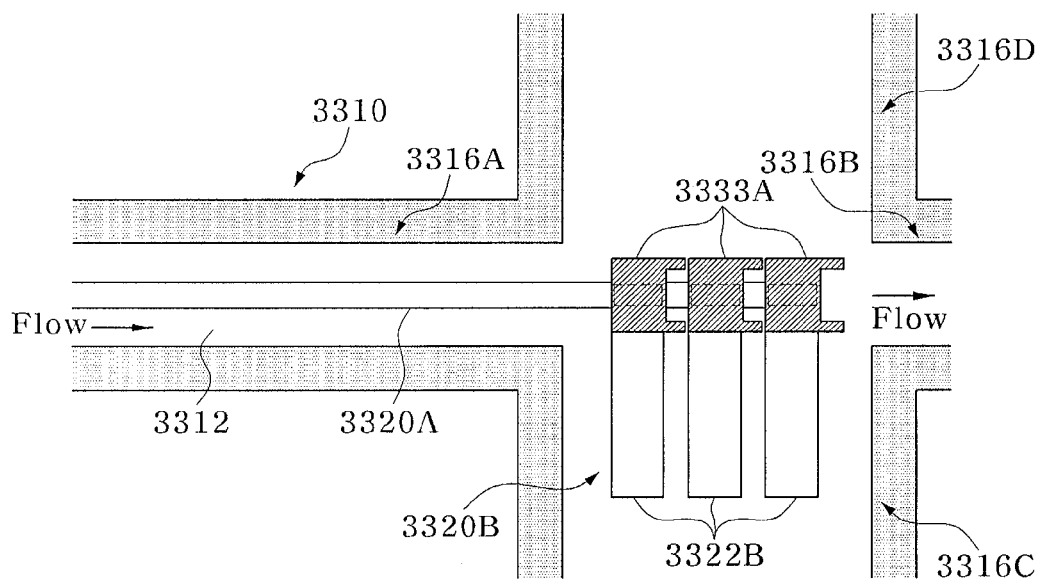
Figure 36:
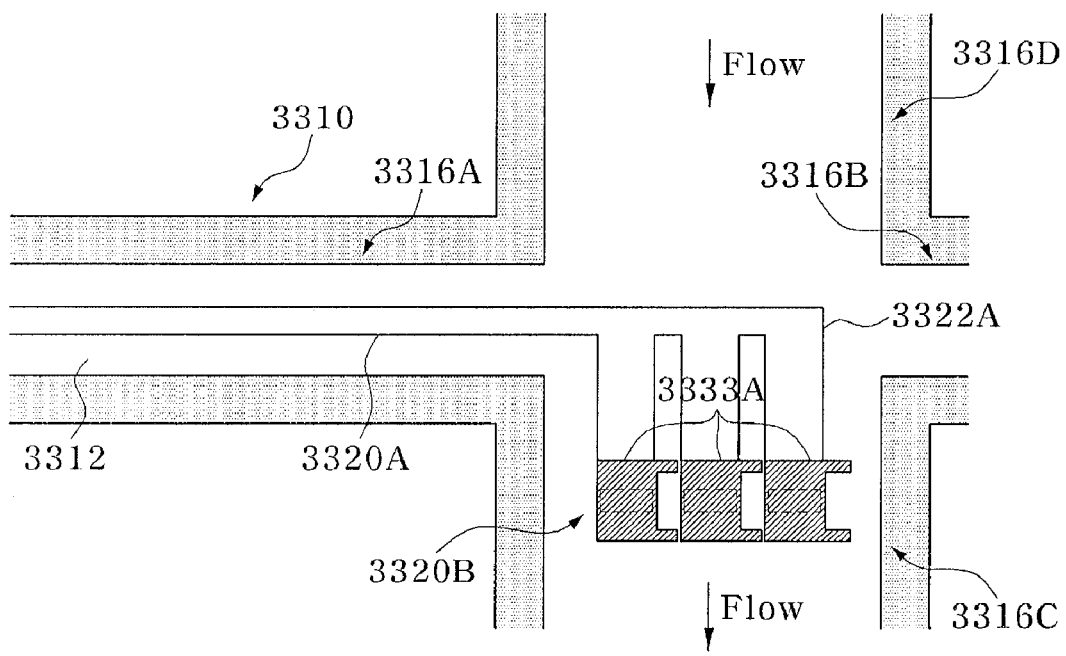

Referring to FIG. 34, light is radiated to form first fine structures 3330A having first guides 3332A. Referring to FIG. 35, the first fine structures 3330A move to the left side along the first rail 3320A and are then stopped at the end 3322A of the first rail 3320A. In this manner, a one-dimensional array 3333A of the first fine structures 3330A is formed. During this period, the fluid 3312 introduced through the first passage 3316A is discharged through the second passage 3316B. Referring to FIG. 36, the one-dimensional array 3333A of the first fine structures 3330A moves downward along the second rails 3320B and is then stopped at the ends 3322B of the second rails 3320B. During this period, the fluid 3312 introduced through the fourth passage 3316D is discharged through the third passage 3316C.

Figure 37:
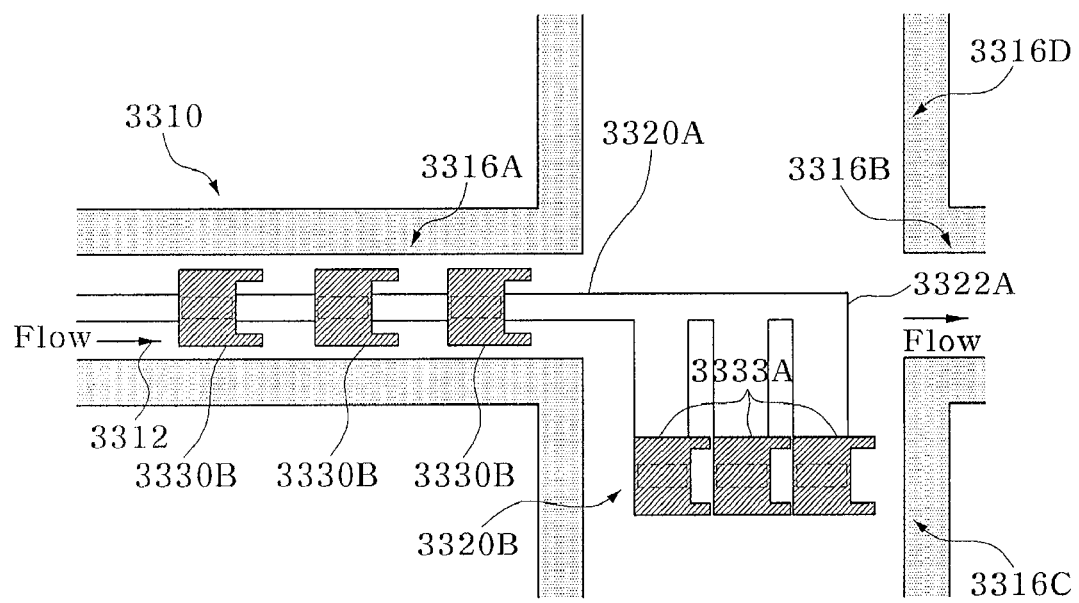
Figure 38:
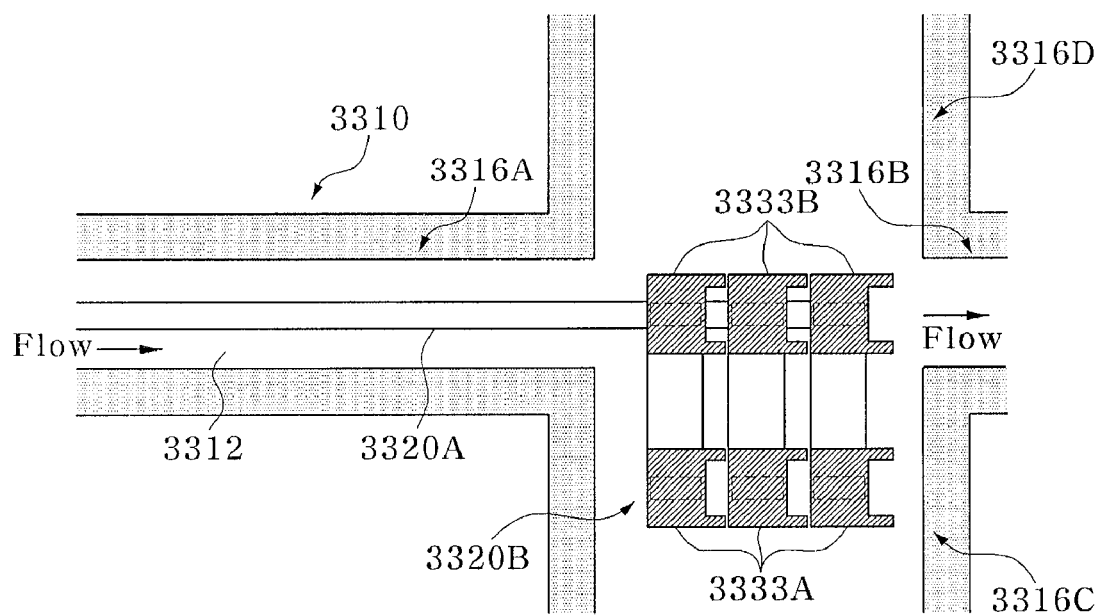
Figure 39:
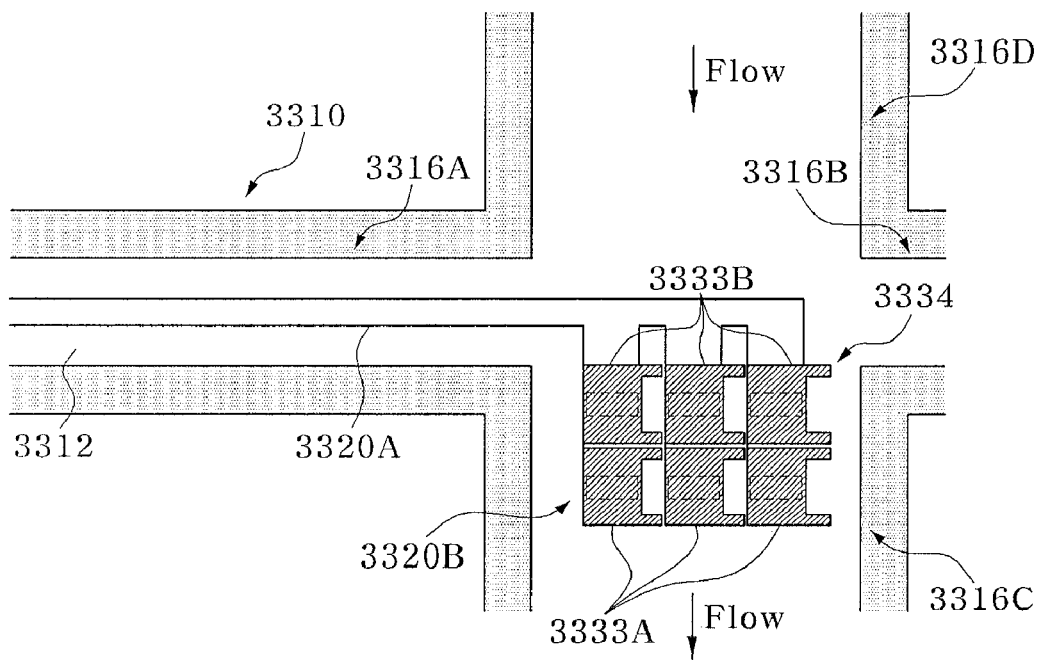

Referring to FIGS. 37 to 39, second fine structures 3330B are formed and then moved to the right side to form a one-dimensional array 3333B of the second fine structures 3330B. The one-dimensional array 3333B of the second fine structures 3330B is moved downward to come in contact with the one-dimensional array 3333A of the first fine structures 3330A. As such, when the rails 3320A and 3320B having the ends 3322A and 3322B are used, it is possible to form a two-dimensional array 3334 of the fine structures 3330A and 3330B.

Figure 40:
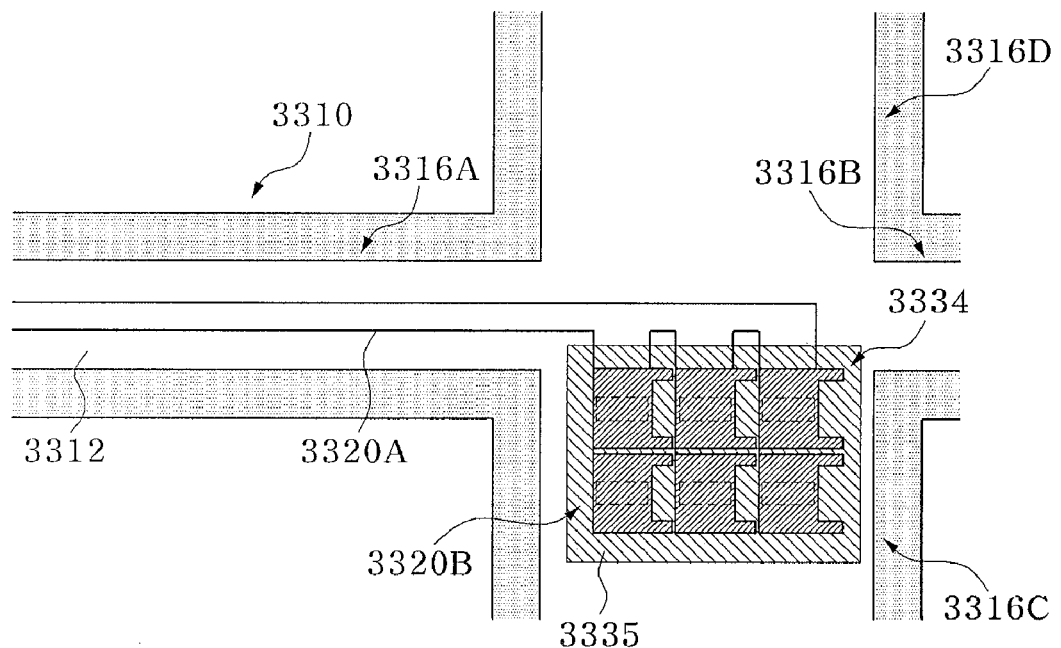

According to some other embodiments, additional light is radiated to form a fine structure 3335 for fixation which integrates the two-dimensional array 3334, as shown in FIG. 40. Fluid used for forming the fine structure 3335 for fixation may be the same as or different from the fluid used for forming the two-dimensional array 3334.

FIGS. 41 to 47 are diagrams for explaining another embodiment of the rail which can be adopted in the fluidic channel system shown in FIG. 1, and another embodiment of a method of fabricating a fine structure. In particular, FIGS. 41 to 47 show still another example in which a two-dimensional array of fine structures is formed at ends of rails. FIGS. 41 to 47 are opened-up plan views of a fluidic channel.

Figure 41:
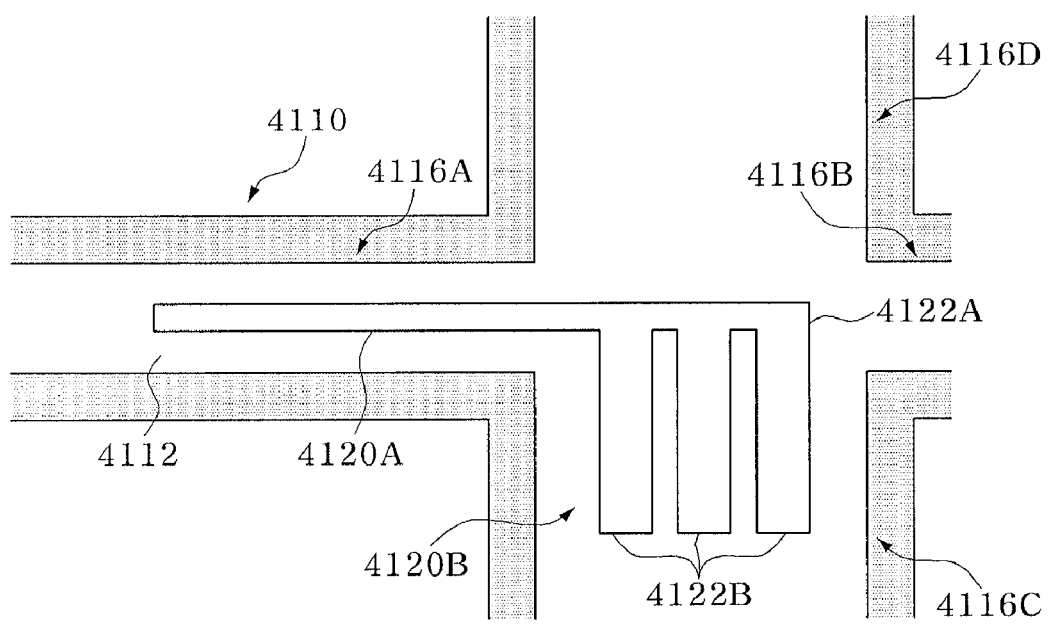
FIGS. 41 to 47 are diagrams for explaining another embodiment of the rail which can be adopted in the fluidic channel system shown in FIG. 1, and another embodiment of a method of fabricating a fine structure, which show still another example in which a two-dimensional array of fine structures is formed at ends of rails.

Referring to FIG. 41, a fluid 4112 flows through a fluidic channel 4110. First to fourth passages 4116A to 4116D are positioned inside the fluidic channel 4110. Rails 4120A and 4120B are positioned inside the fluidic channel 4110, and have ends 4122A and 4122B.

Figure 42:
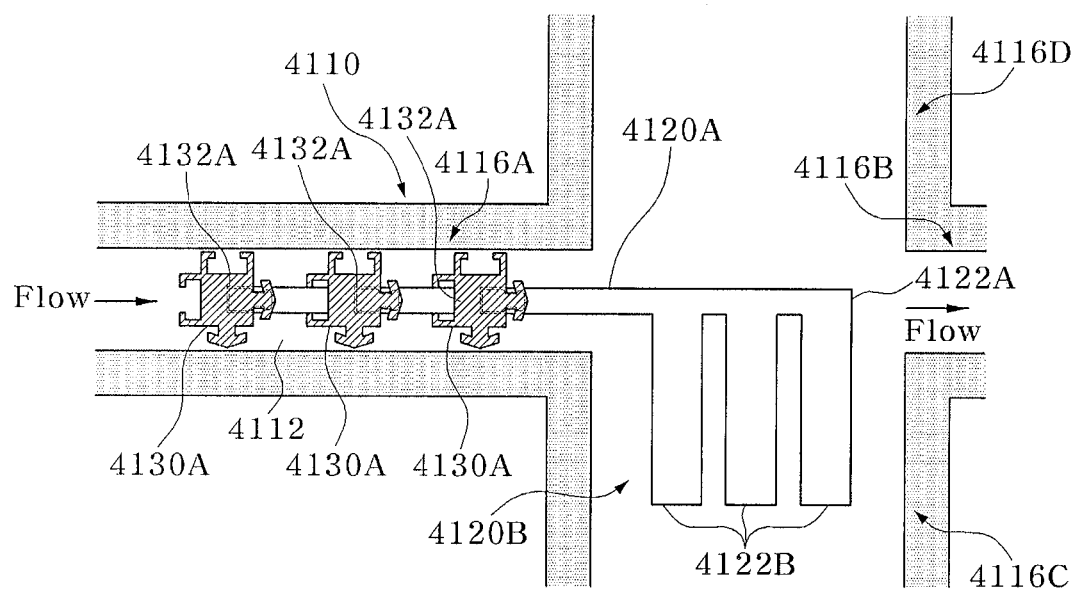
Figure 43:
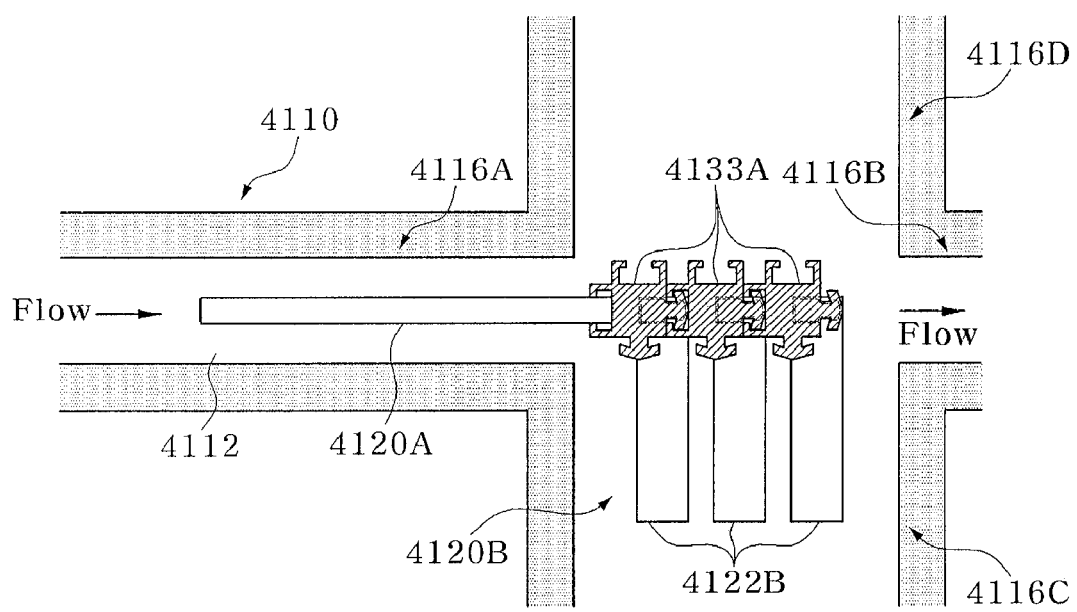
Figure 44:
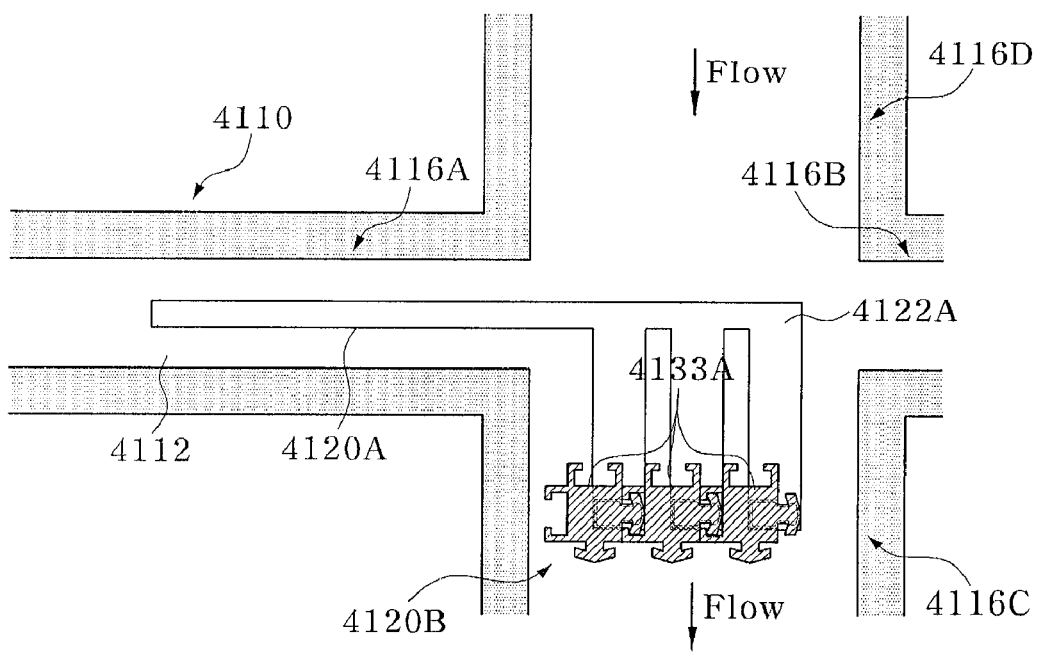

Referring to FIGS. 42 to 44, first fine structures 4130A having guides 4132A provided thereon are sequentially formed and then moved to the right side to form a one-dimensional array 4133A of the first fine structures 4130A. The one-dimensional array 4133A of the first fine structures 4130A is moved downward along the second rails 4120B and stopped at the ends 4122B of the second rails 4120B. FIGS. 42 to 44 show an example in which the first fine structures 4130A having the guides 4132A are sequentially formed at a start portion of the first rail 4120A. However, the first fine structures 4130A having the guides 4132A may be produced outside the fluidic channel 4120 to be delivered into the fluidic channel 4120.

Figure 45:
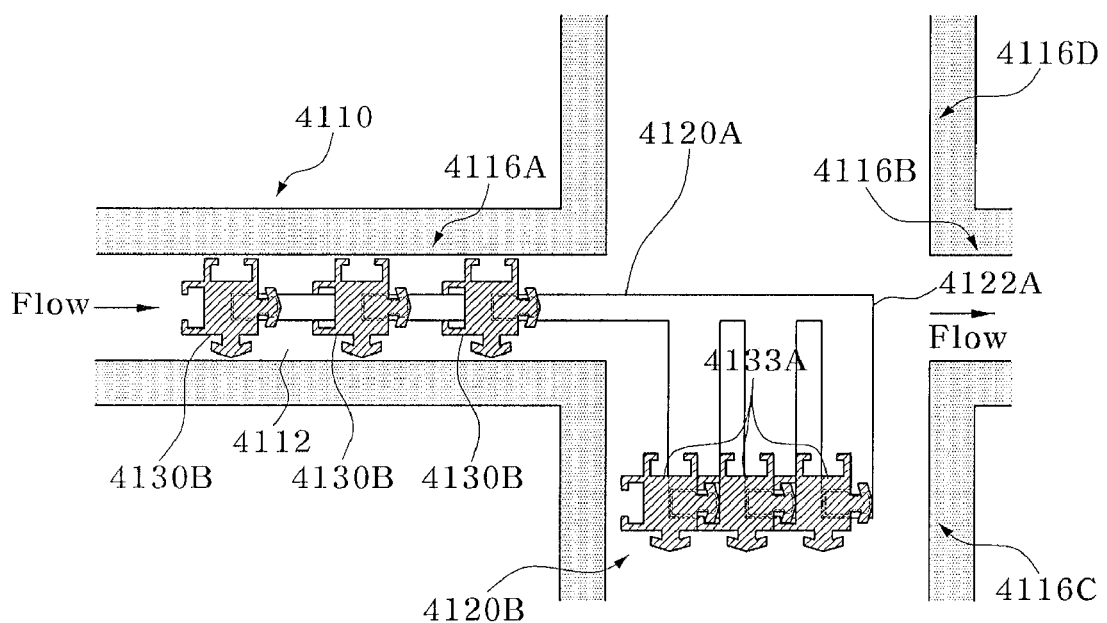
Figure 46:
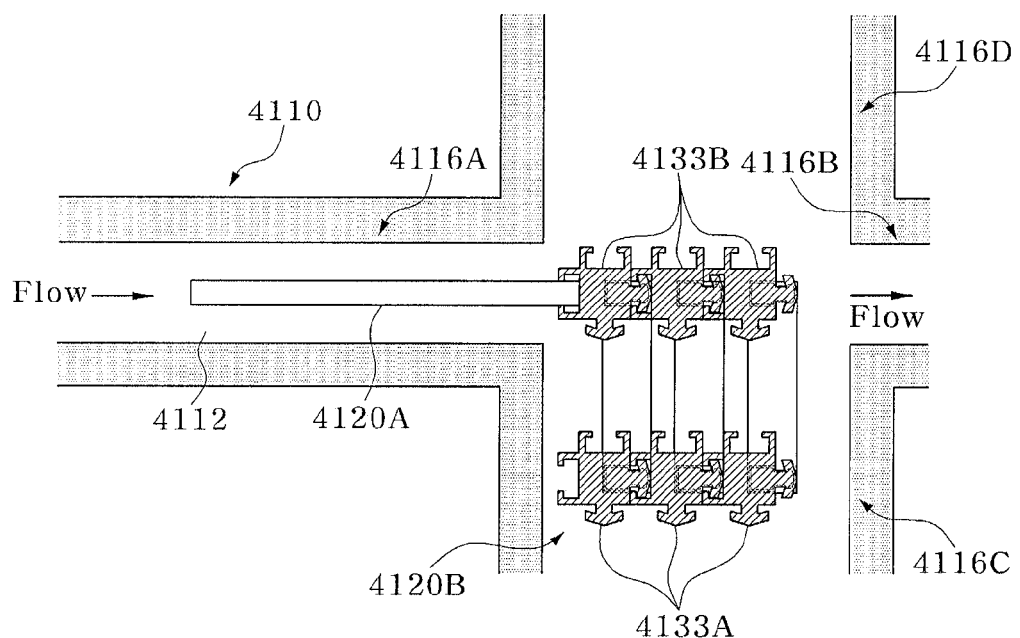
Figure 47:
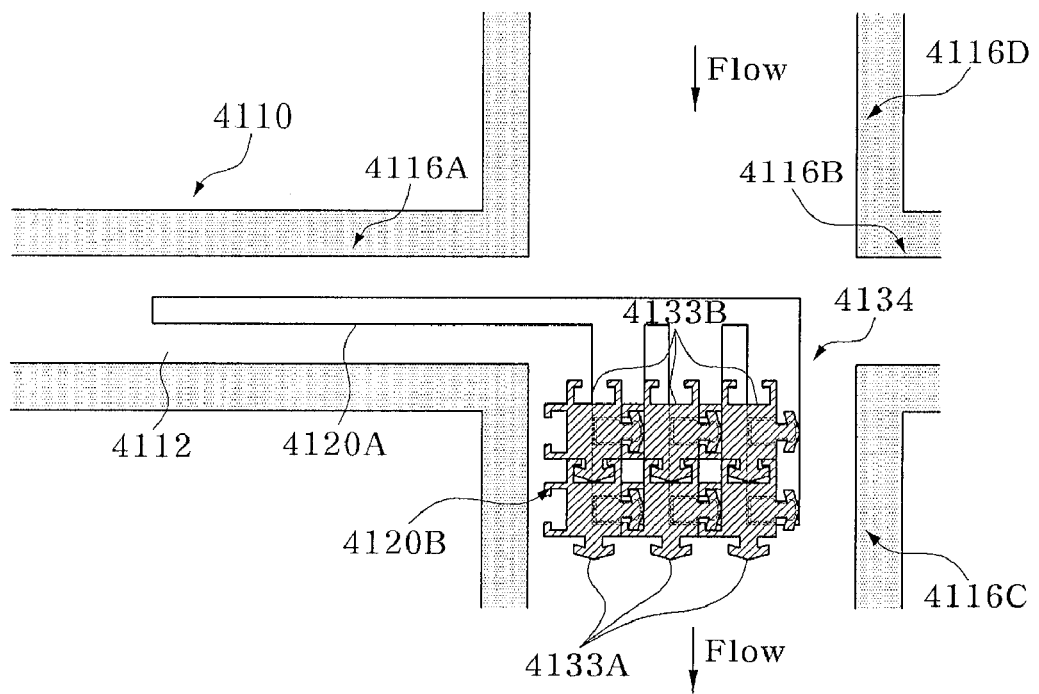

Referring to FIGS. 45 to 47, second fine structures 4130B are formed and moved to the right side to form a one-dimensional array 4133B of the second fine structures 4130B. The one-dimensional array 4133B of the second fine structures 4130B is moved downward to come in contact with the one-dimensional array 4133A of the first fine structures 4130A.

When the rails 4120A and 4120B having the ends 4122A and 4122B are used, it is possible to form a two-dimensional array 4134 of the fine structures 4130A and 4130B. Since the fine structures 4130A and 4130B are coupled through latches, the fine structures 4130A and 4130B can be integrated without the integration process shown in FIG. 40.

Figure 48:
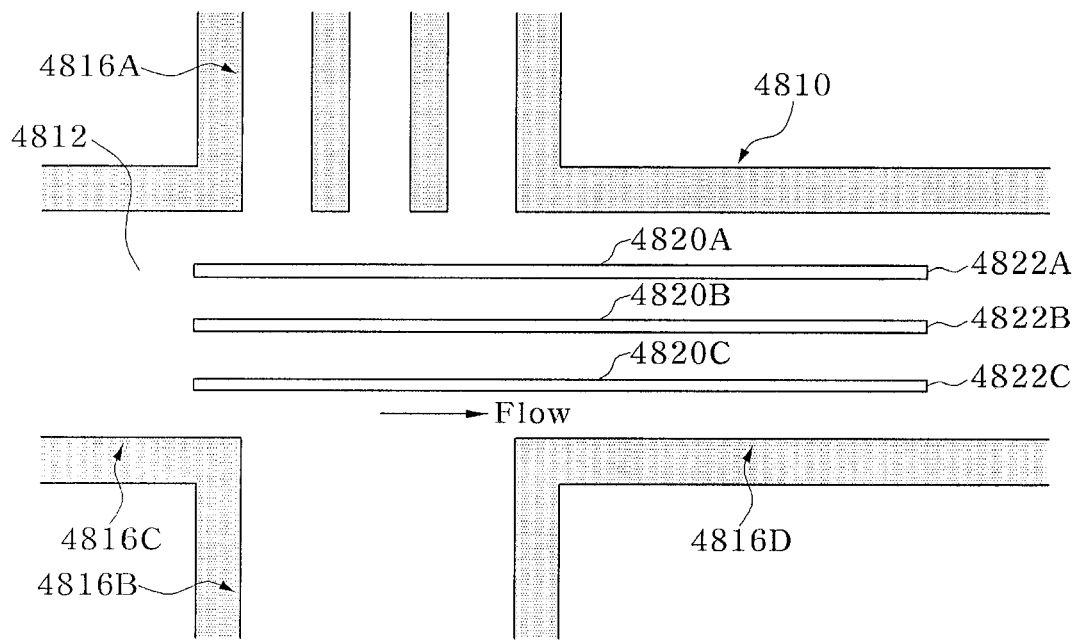
FIGS. 48 to 50 are diagrams for explaining another embodiment of the rail which can be adopted in the fluidic channel system shown in FIG. 1, and another embodiment of a method of fabricating a fine structure, which show still another example in which a two-dimensional array of fine structures is formed at ends of rails.
Figure 49:
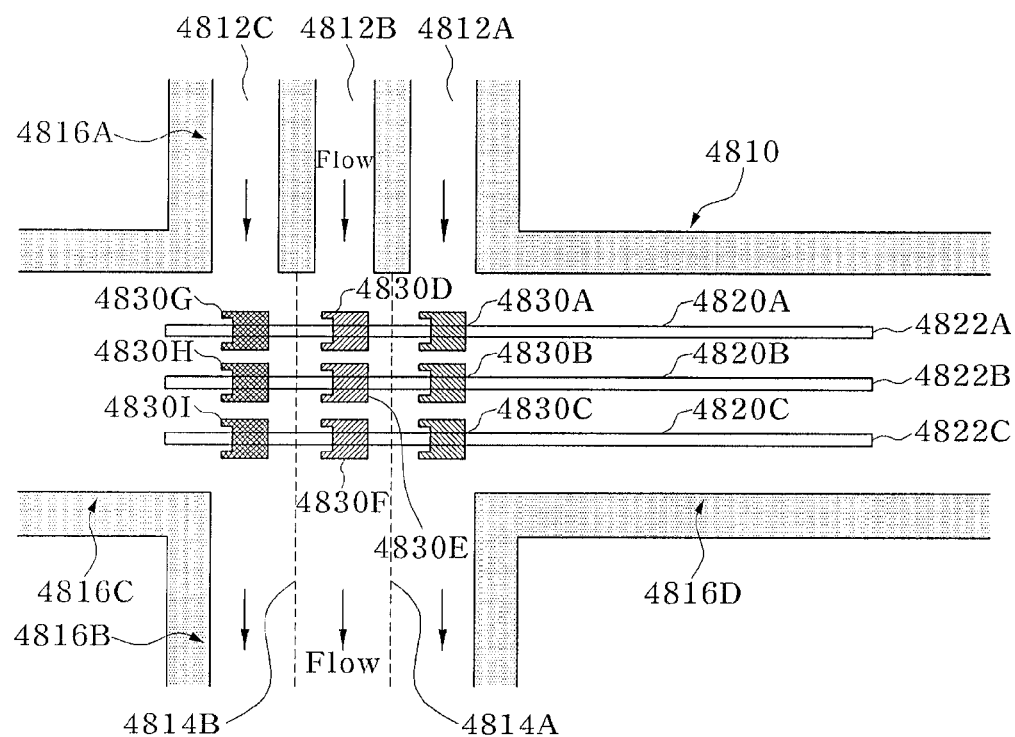
Figure 50:
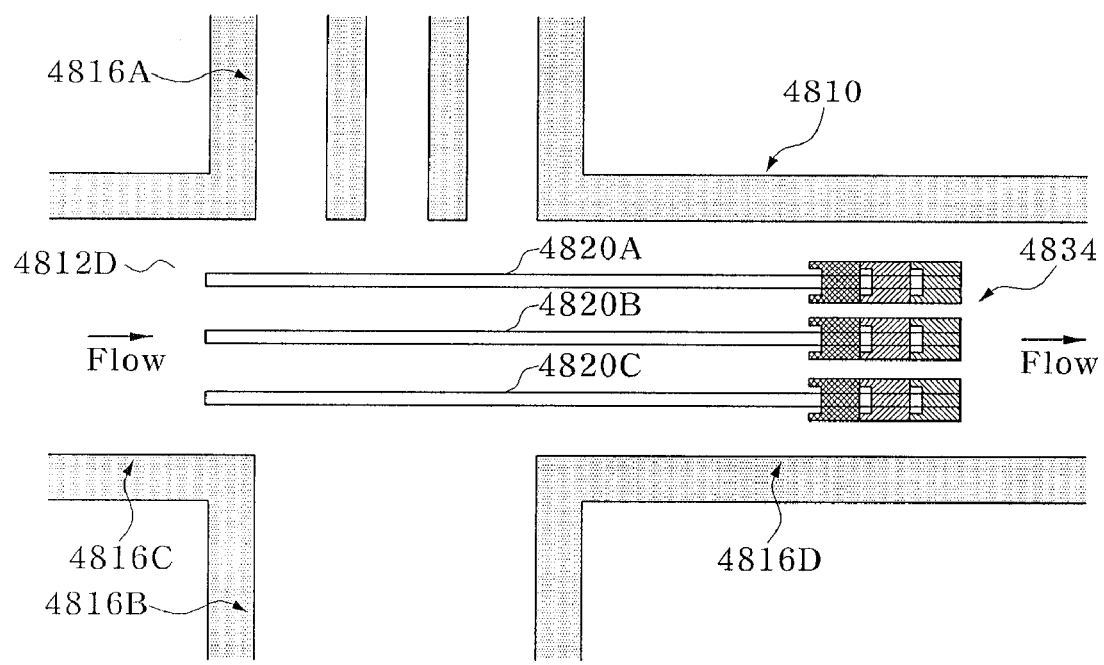

FIGS. 48 to 50 are diagrams for explaining another embodiment of the rail which can be adopted in the fluidic channel system shown in FIG. 1, and another embodiment of a method of fabricating a fine structure. In particular, FIGS. 48 to 50 show still another example in which a two-dimensional array of fine structures is formed at ends of rails. FIGS. 48 to 50 are opened-up plan views of a fluidic channel.

Referring to FIG. 48, a fluid 4812 is positioned inside a fluidic channel 4810. The fluid 4812 may be a photocurable fluid. First to fourth passages 4816A to 4816D are positioned inside the fluidic channel 4810. Inside the fluidic channel 4810, rails 4820A to 4820C are disposed in parallel to one another. The rails 4820A to 4820C have ends 4822A to 4822C.

Referring to FIG. 49, first to third fluids 4812A to 4812C delivered through the first passages 4816A are discharged through the second passage 4816B. Therefore, the first to third fluids 4812A to 4812C cross the rails 4820A to 4820C. An interface 4814A is formed between the first and second fluids 4812A and 4812B, and an interface 4814B is formed between the second and third fluids 4812B and 4812C. During this period, the same pressure is applied to the third and fourth passages 4816C and 4816D. In this state, light is radiated to form fine structures 4830A to 4830I. The first to third fine structures 4830A to 4830C are formed by photocuring the first fluid 4812A, the fourth to sixth fine structures 4830D to 4830F are formed by photocuring the second fluid 4812B, and the seventh to ninth fine structures 4830G to 4830I are formed by photocuring the third fluid 4812C.

Referring to FIG. 50, when the fine structures 4830A to 4830I meet the ends 4822A to 4822C of the rails 4820A to 4820C while moving along the fourth fluid 4812D, they are stopped at the ends 4822A to 4822C. The fluid 4812D may be the same as or different from any one of the first to third fluids 4812A to 4812C. In this way, a two-dimensional array 4834 of the fine structures 4830A to 4830I is formed. After the two-dimensional array 4834 is formed, an integration process similar to the process shown in FIG. 32 may be additionally performed.

In the drawing, the fine structures belonging to each line of the two-dimensional array 4834 are produced by photocuring the same fluid. Specifically, the fine structures 4830A to 4830C belonging to the first line are produced by photocuring the first fluid 4812A, the fine structures 4830D to 4830F belonging to the second line are produced by photocuring the second fluid 4812B, and the fine structures 4830G to 4830I belonging to the third line are produced by photocuring the third fluid 4812C. However, according to another embodiment, the fine structures belonging to each line of the two-dimensional array may be produced by the photocuring of different fluids. In one example, when a certain fine structure, for example, the fine structure 4830B, is not produced in the step described in FIG. 49, the fine structures 4830A, 4830E, and 4830C belonging to the first line in the step described in FIG. 50 are produced by photocuring the first, second, and first fluids 4812A, 4812B, and 4812A. In another example, when some fine structures, for example, the fine structures 4830B, 4830C, and 4830F are not produced in the step described in FIG. 49, the fine structures 4830A, 4840E, and 4830I belonging to the first line in the step described in FIG. 50 are produced by photocuring the first, second, and third fluids 4812A, 4812B, and 4812C.

The above-described methods for forming a two-dimensional array can be applied to bioanalysis in which various particles are manipulated and fluids are exchanged, self assembly by fluids, and fabrication of displays.

Figure 51:
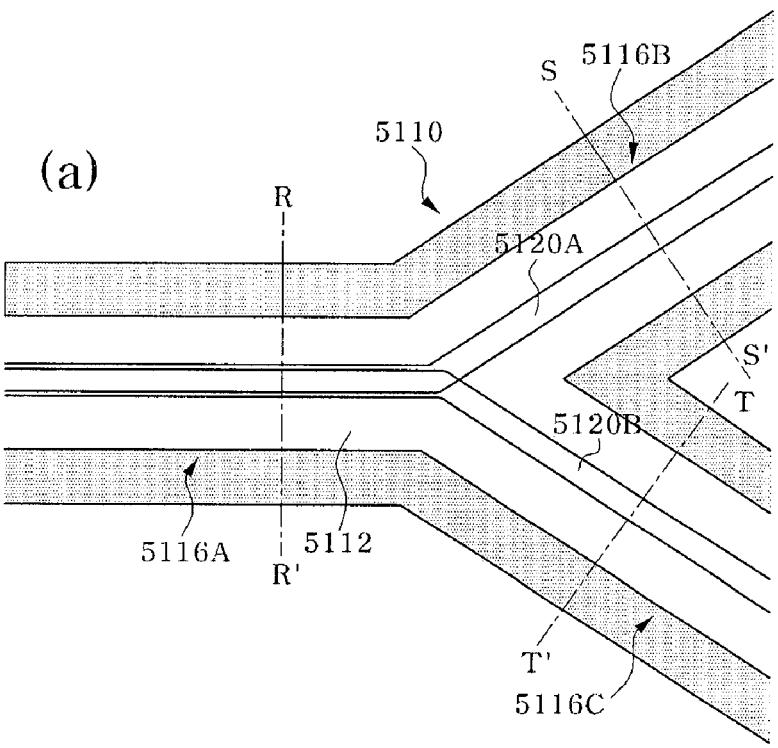
FIGS. 51 to 53 are diagrams for explaining another embodiment of the rail which can be adopted in the fluidic channel system shown in FIG. 1, and an example of a method for conveying a fine structure, which show an example in which the movement direction of a fine structure is determined in accordance with the position of a guide.
Figure 51:
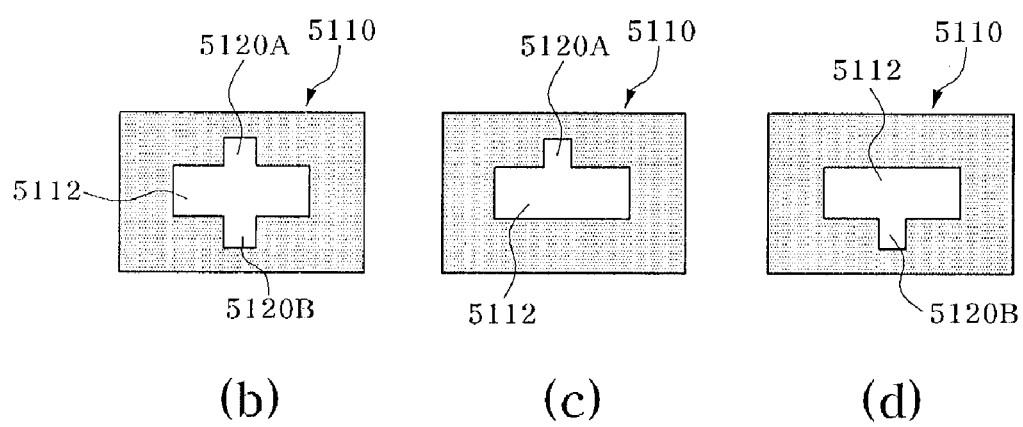
Figure 52:
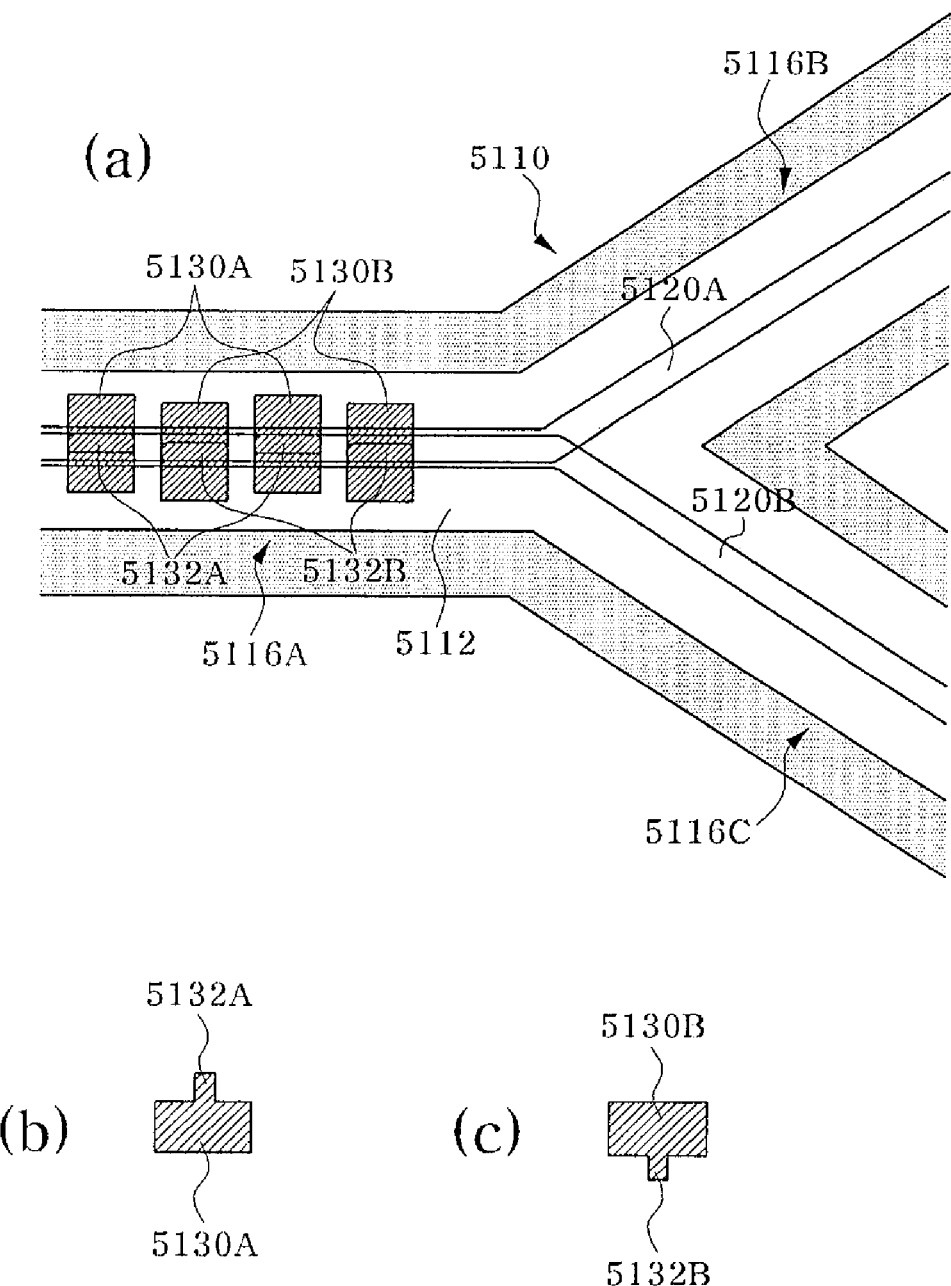
Figure 53:
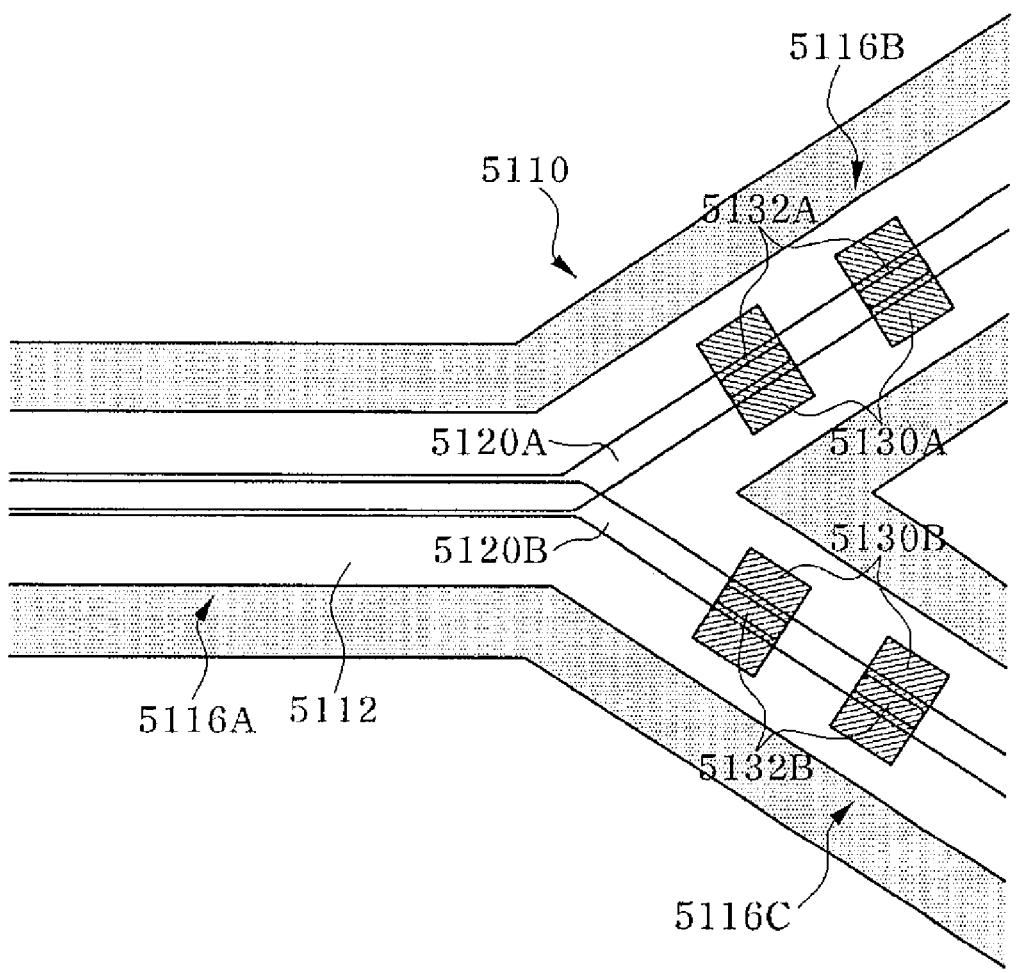

FIGS. 51 to 53 are diagrams for explaining another embodiment of the rail which can be adopted in the fluidic channel system shown in FIG. 1, and an example of a method for conveying a fine structure. In particular, FIGS. 51 to 53 show an example in which the movement direction of a fine structure is determined in accordance with the position of a guide. (a) of FIG. 51 is an opened-up plan view of a fluidic channel 5110, and (b) to (d) of FIG. 51 are cross-sectional views of the fluidic channel 5110 of (a) of FIG. 51, taken along lines R-R', S-S', and T-T', respectively. Referring to (a) of FIG. 51, a fluid 5112 is present inside the fluidic channel 5110. First to third passages 5116A to 5116C are positioned inside the fluidic channel 5110. The first rail 5120A is positioned in an upper portion of the fluidic channel 5110 and passes through the first and second passages 5116A and 5116B. The second rail 5120B is positioned in a lower portion of the fluidic channel 5110 and passes through the first and third passages 5116A and 5116C.

(a) of FIG. 52 is an opened-up plan view of the fluidic channel 5110, and (b) and (c) of FIG. 52 are cross-sectional views of first and second fine structures 5130A and 5130B. Referring to (a) of FIG. 52, at least one first fine structure 5130A and at least one second fine structure 5130B flow along the first passage 5116A of the fluidic channel 5110. The first fine structure 5130A has a guide 5132A positioned on the top surface thereof, and the second fine structure 5130B has a guide 5132B positioned on the bottom surface thereof.

FIG. 53 is an opened-up plan view of the fluidic channel 5110. Referring to FIG. 53, since the first fine structure 5130A has the guide 5132A positioned on the top surface thereof, the first fine structure 5130A moves along the first rail 5120A positioned in the upper portion of the fluidic channel 5110. Since the first rail 5120A is formed in the direction of the second passage 5116B, the first fine structure 5130A moves to the second passage 5116B. Further, since the second fine structure 5130B has the guide 5132B positioned on the bottom surface thereof, the second fine structure 5130B moves along the second rail 5120B positioned in the lower portion of the fluidic channel 5110. Since the second rail 5120B is formed in the direction of the third passage 5116C, the second fine structure 5130B moves to the third passage 5116C.

As described above, when the rails 5120A and 5120B are formed in the upper and lower portions of the fluidic channel 5110 such that their advancing directions are set to be different from each other, it is possible to divide the fine structures 5130A and 5130B depending on the position of the guide provided thereon. Further, when a large quantity of fine structures fabricated outside is injected into the fluidic channel, fine structures having a guide positioned on the top surface thereof and fine structures having a guide positioned on the bottom surface thereof may be mixed. In this case, when the above-described fluidic channel 5110 is used, it is possible to extract either the fine structures having a guide positioned on the top surface thereof or the fine structures having a guide positioned on the bottom surface thereof.

Figure 54:
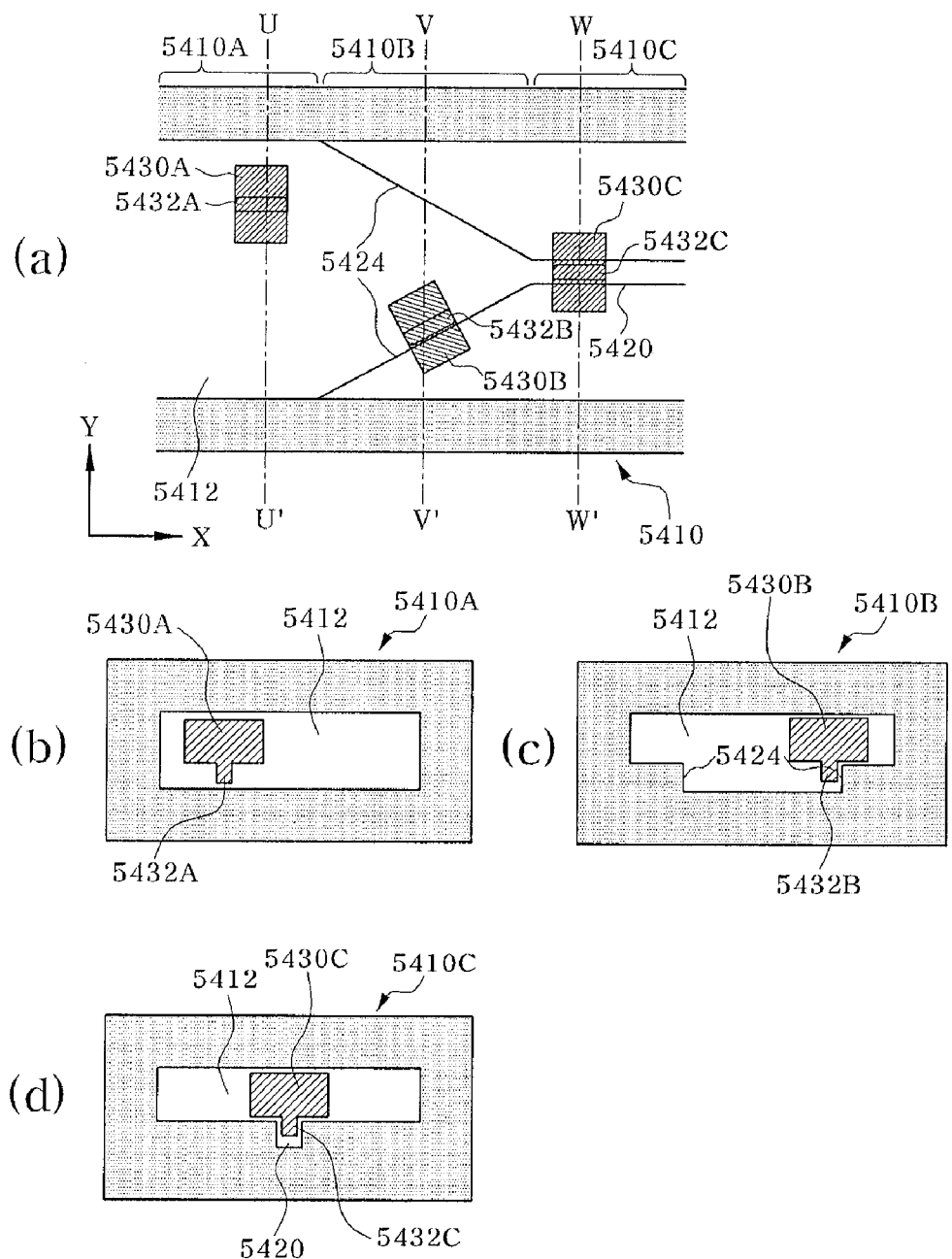
FIGS. 54 and 55 are diagrams for explaining another embodiment of the rail which can be adopted in the fluidic channel system shown in FIG. 1, which show an example of an entrance portion of a rail.

FIG. 54 is diagrams for explaining another embodiment of the rail which can be adopted in the fluidic channel system shown in FIG. 1, which show an example of an entrance portion of a rail. (a) of FIG. 54 is an opened-up plan view of a fluidic channel 5410. (b) to (d) of FIG. 54 are cross-sectional views of the fluidic channel 5410 of (a) of FIG. 54, taken along lines U-U', V-V', and W-W'. Referring to (a) of FIG. 54, fine structures 5430A to 5430C are positioned inside the fluidic channel 5401 and have guides 5432A to 5432C, respectively. The fluidic channel 5410 includes a region 5410A where a rail 5420 is not formed, an entrance portion 5410B, and a region 5410C where the rail 5420 is formed. The entrance portion 5410B has one or more inclined surfaces 5424. The inclined surfaces 5424 serve to lead the guides of the fine structures such that the guides enter into the rail. The Y-directional orientation of the fine structure 5430A positioned in the region 5410A where the rail 5420 is not formed is not limited. However, the orientation of the fine structure 5430B positioned in the entrance portion 5410B is limited by the inclined surfaces 5432. The distance between the inclined surfaces 5432 decreases toward the region 5410C where the rail 5420 is formed. Therefore, as the fine structure 5430B approaches the region 5410C where the rail 5420 is formed, the Y-directional orientation of the fine structure 5430B approaches the rail 5420. In the region 5410C where the rail 5420 is formed, the fine structure 5430C moves along the rail 5420.

Figure 55:
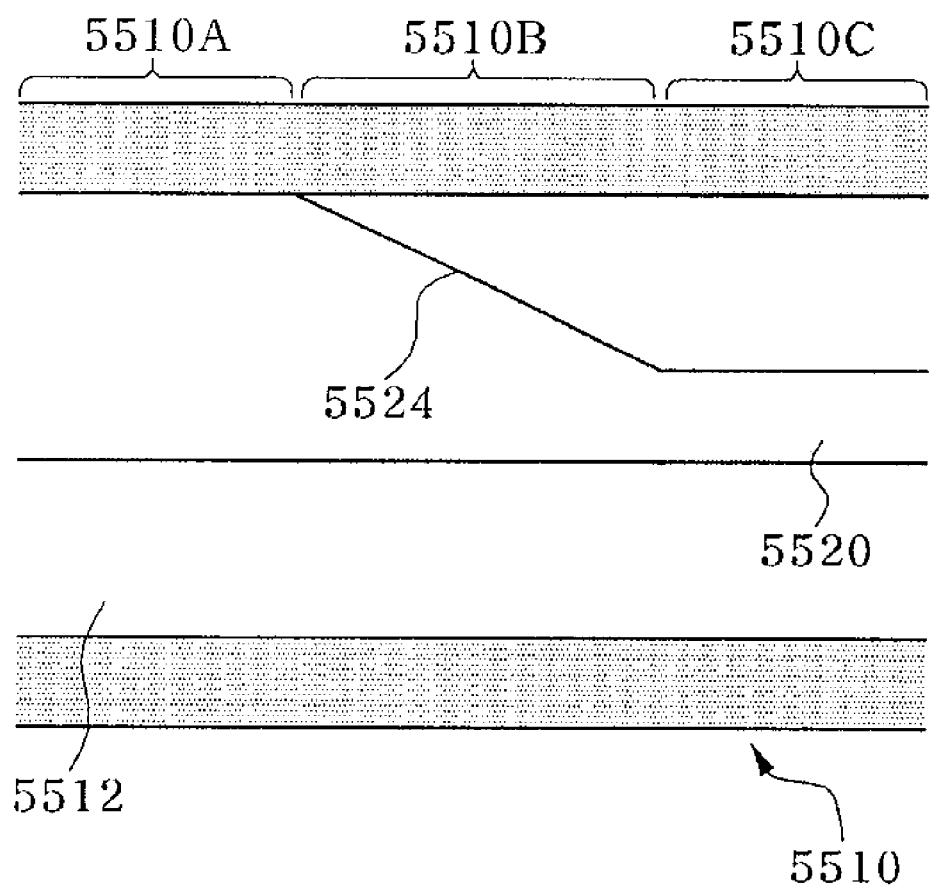

FIG. 55 is a diagram for explaining another embodiment of the rail which can be adopted in the fluidic channel system shown in FIG. 1, which show a modified example of the entrance portion of the rail of (a) of FIG. 54. Referring to FIG. 55, a fluid 5512 flows inside a fluidic channel 5510 which includes a region 5510A where the rail 5520 is not formed, an entrance portion 5510B, and a region 5510C where the rail 5520 is formed. Unlike the entrance portion 5410B shown in FIG. 54, the entrance portion 5510B shown in FIG. 55 has only one inclined surface 5524.

Figure 56:
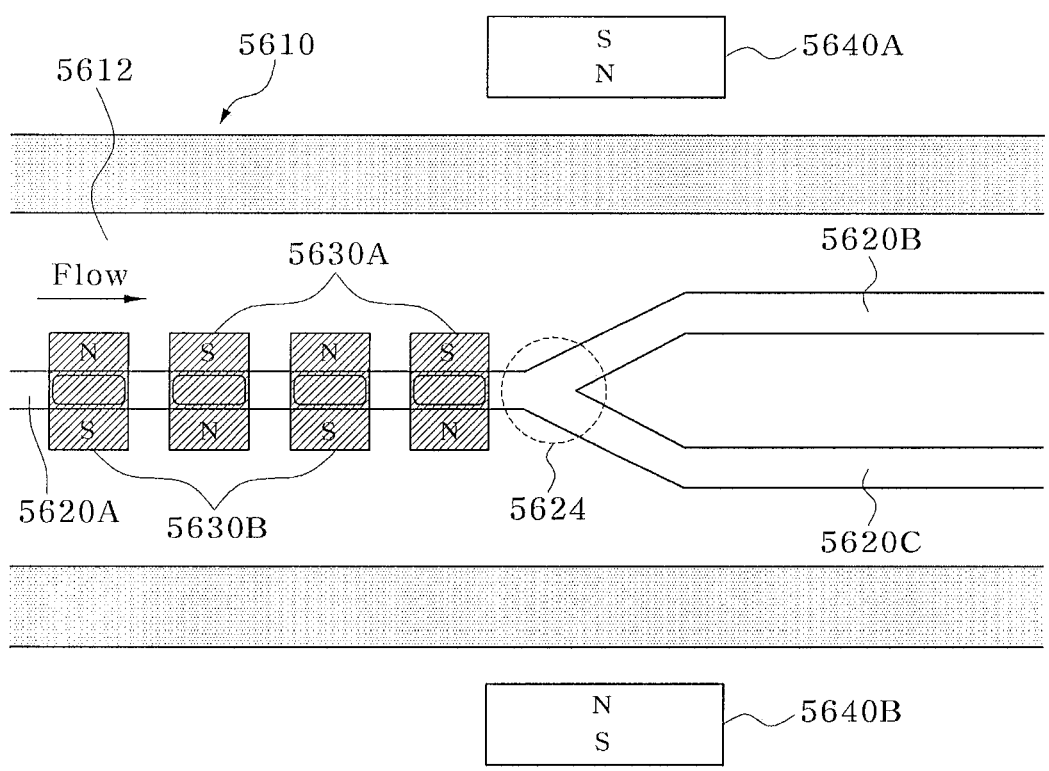
FIGS. 56 to 60 are diagrams for explaining another embodiment of the rail which can be adopted in the fluidic channel system shown in FIG. 1, which show an example in which a magnetic field is applied to a fluidic channel.
Figure 57:
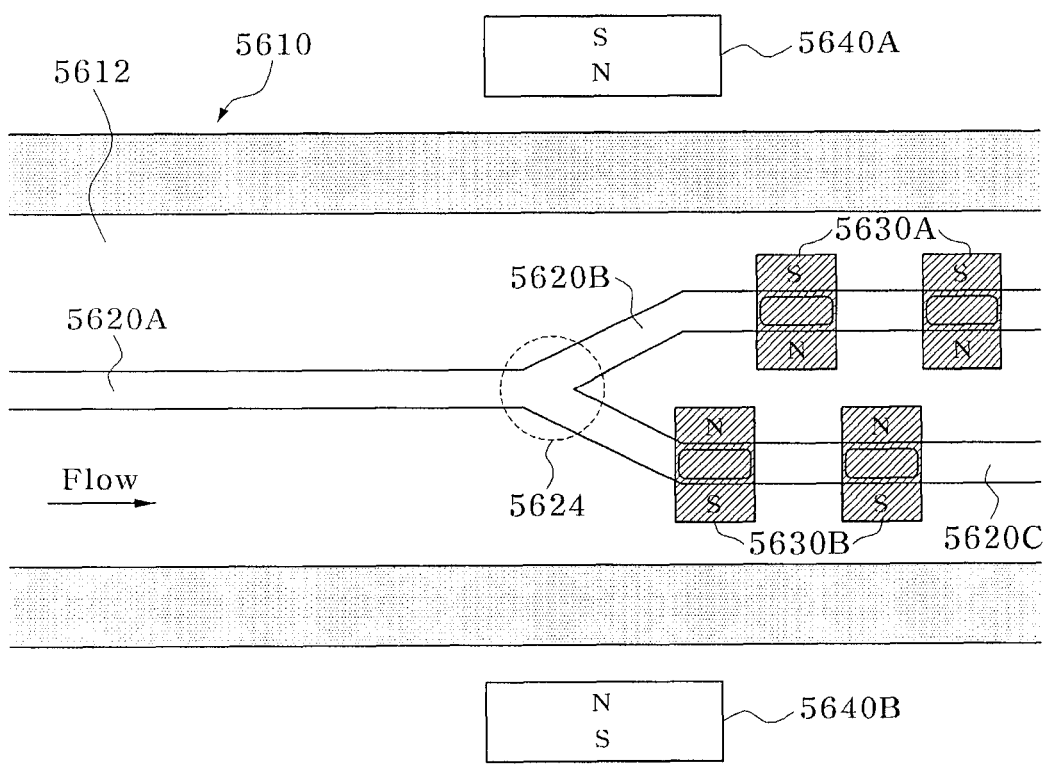

FIGS. 56 and 57 are diagrams for explaining another embodiment of the rail which can be adopted in the fluidic channel system shown in FIG. 1, which show an example in which a magnetic field is applied to a fluidic channel. FIG. 56 shows a state before fine structures 5630A and 5630B pass through a diverging point 5624. Referring to FIG. 56, a rail is positioned inside the fluidic channel 5610 and includes first to third branches 5620A to 5620C. The first to third branches 5620A to 5620C join together at the diverging point. The fine structures 5630A and 5630B move along a flow of a fluid 5612. The fine structures 5630A and 5630B have magnetic materials provided thereon. The magnetic materials may be formed in various shapes, such as particle shapes. At least one first fine structure 5830A and at least one second fine structure 5830B have different polarity from each other. A magnetic field is applied to the fluidic channel 5610, or specifically, around the diverging point 5624. FIG. 56 shows an example in which the magnetic field is applied by two magnets 5640A and 5640B positioned outside the fluidic channel 5610. However, this may be modified in various manners. In one modified example, only one magnet 5640A or 5640B may be used to apply a magnetic field. In another modified example, the magnet 5640A or 5640B may be positioned inside the fluidic channel 5610. The magnet 5640A or 5640B may be an electromagnet or permanent magnet. Since the fine structures 5630A and 5630B include magnetic materials, an attractive or repulsive force due to the magnetic field is applied to the fine structures. According to one embodiment, the first fine structure 5630A receives a magnetic force in the direction of the first magnet 5640A, and the second fine structure 5630B receives a magnetic force in the direction of the second magnet 5640B.

FIG. 57 shows a state after the fine structures 5630A and 5630B pass through the diverging point 5624. Referring to FIG. 57, the first fine structure 5630A which moves along the first branch 5620A to reach the diverging point 5624 is moved to the second branch 5620B by the magnetic force applied in the direction of the first magnet 5640A. Further, the second fine structure 5630B which moves along the first branch 5620A to reach the diverging point 5624 is moved to the third branch 5620C by the magnetic force applied in the direction of the second magnet 5640B. As described above, when the fine structures 5630 have magnetic materials provided thereon and a magnetic field is applied to the fluidic field, the advancing direction of the fine structures 5630A and 5630B at the diverging point 5624 can be controlled.

Figure 58:
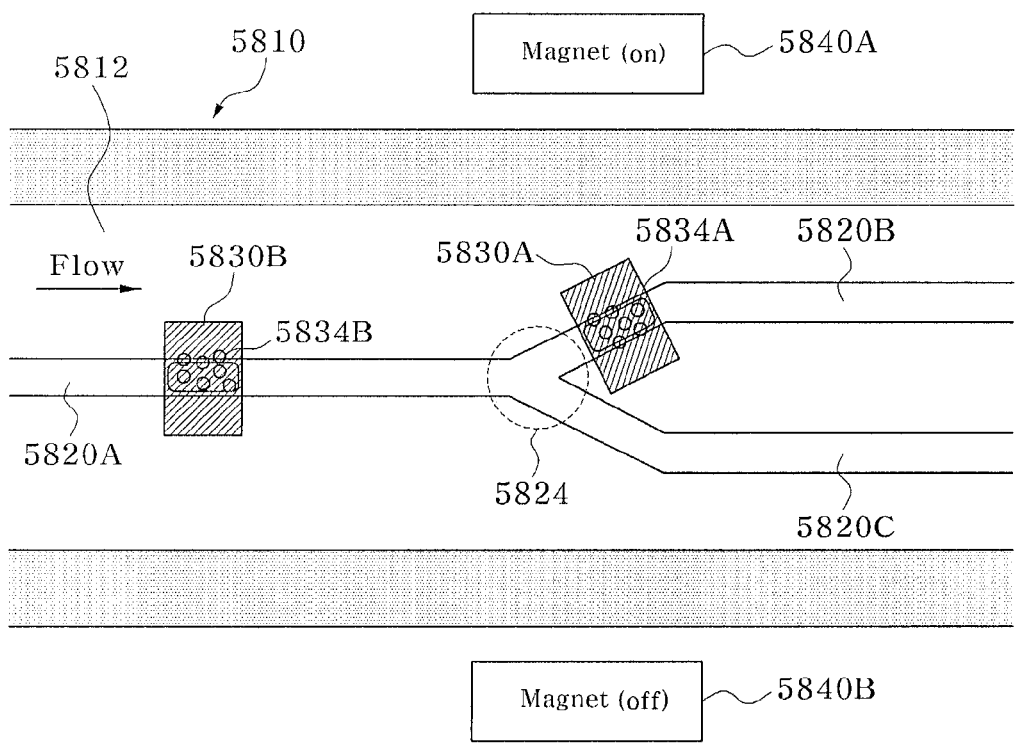
Figure 59:
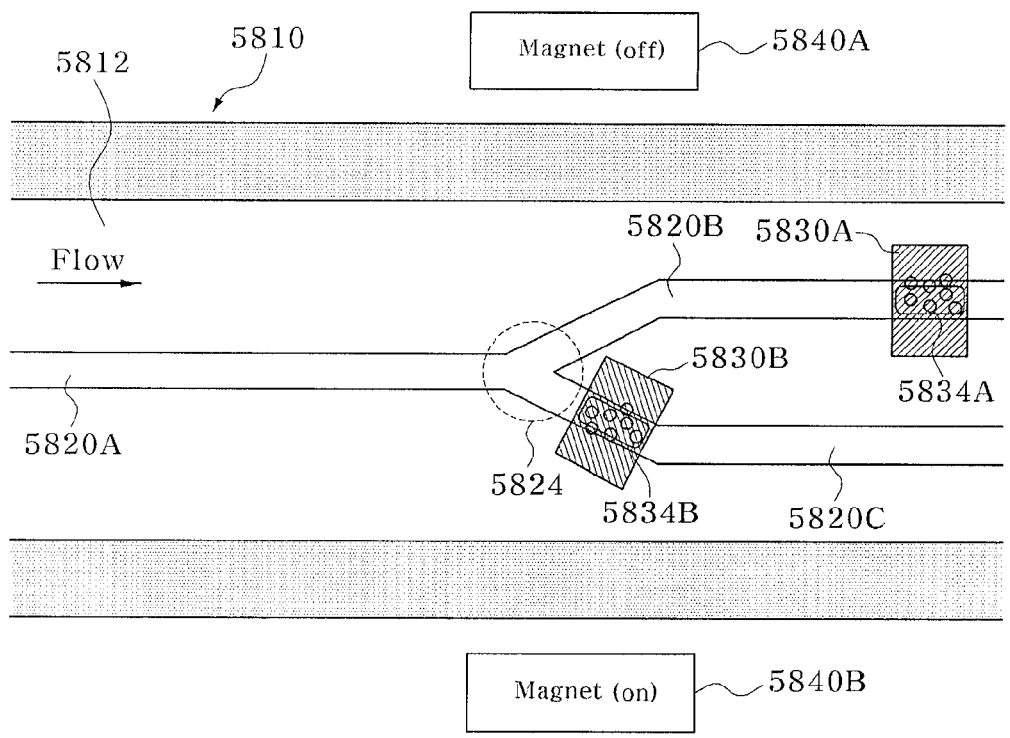

FIGS. 58 and 59 are diagrams for explaining another embodiment of the rail which can be adopted in the fluidic channel system shown in FIG. 1, which show another example in which a magnetic field is applied to a fluidic channel. FIG. 58 shows a state in which a first fine structure 5830A passes through a diverging point 5824. Referring to FIG. 58, a rail is positioned inside the fluidic channel 5810 and includes first to third branches 5820A to 5820C. The first to third branches 5820A to 5820C join at the diverging point 5824. The fine structures 5830A and 5830B move along a flow of a fluid 5812. The fine structures 5830A and 5830B include magnetic materials 5834A and 5834B, for example, magnetic particles, provided thereon. The magnetic materials 5834A and 5834B may be paramagnetic materials. A magnetic field which changes with time is applied to the fluidic channel 5810, more specifically, around the diverging point 5824. While the first fine structure 5830A passes through the diverging point 5824, a first magnet 5840A is turned on, and a second magnet 5840B is turned off. Therefore, as an attractive force is applied by the first magnet 5840A, the first fine structure 5830A moves to the second branch 5820B.

FIG. 59 shows a state in which the second fine structure 5830B passes through the diverging point 5824. Referring to FIG. 59, while the second fine structure 5830B passes through the diverging point 5824, the second magnet 5840B is turned on and the first magnet 5840A is turned off. Therefore, as an attractive force is applied by the second magnet 5840B, the second fine structure 5830B is moved to the third branch 5820C. As such, when the fine structures 5830 have magnetic materials provided thereon and a magnetic field is applied to the fluidic channel 5810, the advancing direction of the fine structures 5830A and 5830B at the diverging point 5824 can be controlled. FIG. 59 shows an example in which when the fine structure 5830A or 5830B passes through the diverging point 5824, any one of the two magnets 5840A and 5840B is turned on and the other turned off in order to control the advancing direction of the fine structure 5830A or 5830B through the attractive force generated by the magnet 5840A or 5840B. However, this example may be modified in various manners. In one modified example, the fine structures 5830A and 5830B include ferromagnetic materials having the same polarity, and the polarity of the electromagnet 5840A or 5840B is changed to change the direction of an attractive or repulsive force generated by the electromagnet 5840A or 5840B. Then, the advancing direction of the fine structure 5830A or 5830B can be controlled. The polarity of the electromagnet 5840A or 5840B can be changed by changing the direction of a current provided to the electromagnet 5840A or 5840B.

According to some other embodiments in connection with the embodiment shown in FIGS. 56 to 58, an electric field may be applied to the fluidic channel, instead of the magnetic field. In this case, the fine structure should have electric charge. The fine structures having electric charges are moved to any one of two branches in accordance with the electric field formed in the fluidic channel.

Figure 60:
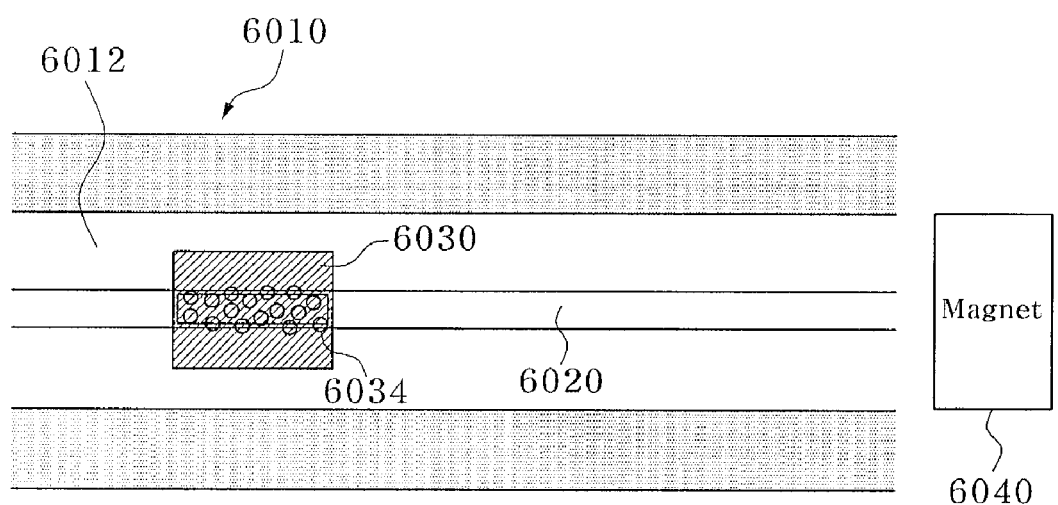

FIG. 60 is a diagram for explaining another embodiment of the rail which can be adopted in the fluidic channel system shown in FIG. 1, which shows still another example in which a magnetic field is applied to a fluidic channel. Referring to FIG. 60, a fine structure 6030 having magnetic materials 6034 provided thereon is moved by a magnetic field applied across a fluidic channel. The magnetic materials 6034 may be paramagnetic materials. In FIG. 60, as an attractive force is applied in the direction of a magnet 6040, the fine structure 6030 is moved toward the magnet 6040. Since the fine structure 6030 is moved by the magnetic field, the fine structure 6030 can be moved even when a fluid 6012 does not flow. Further, the fine structure 6030 can be moved against the flow of the fluid 6012. For example, the fluid 6012 may flow in the opposite direction to the direction of the magnet 6040, and the fine structure 6030 may be moved in the direction of the magnet 6040. Since a force moving the fine structure 6030 is provided by the magnet 6040 or the magnetic field, the fluid 6012 does not need to provide the force moving the fine structure 6030. Therefore, a gas may be used as the fluid 6012. In the case of gas, a rate at which a force moving the fine structure 6030 is provided is relatively low. By changing the magnetic field applied across the fluidic channel 6010 according to time, it is possible to control the movement direction of the fine structure 6030 according to time. Further, when a plurality of electromagnets are used, the movement of the fine structure 6030 can be controlled by a similar method as is used to control a magnetic levitation propulsion train.

According to some other embodiments in connection with the embodiment shown in FIG. 60, an electric field may be applied to the fluidic channel, instead of the magnetic field. In this case, the fine structure should have electric charges. Since an electric force causes the fine structure to move, the fluid does not need to provide a force to move the fine structure. Therefore, a gas may be used as the fluid. Since the fine structure is moved by the electric field, the fine structure can be moved even when the fluid does not flow. Further, the fine structure can be moved against the flow of the fluid.

Figure 61:
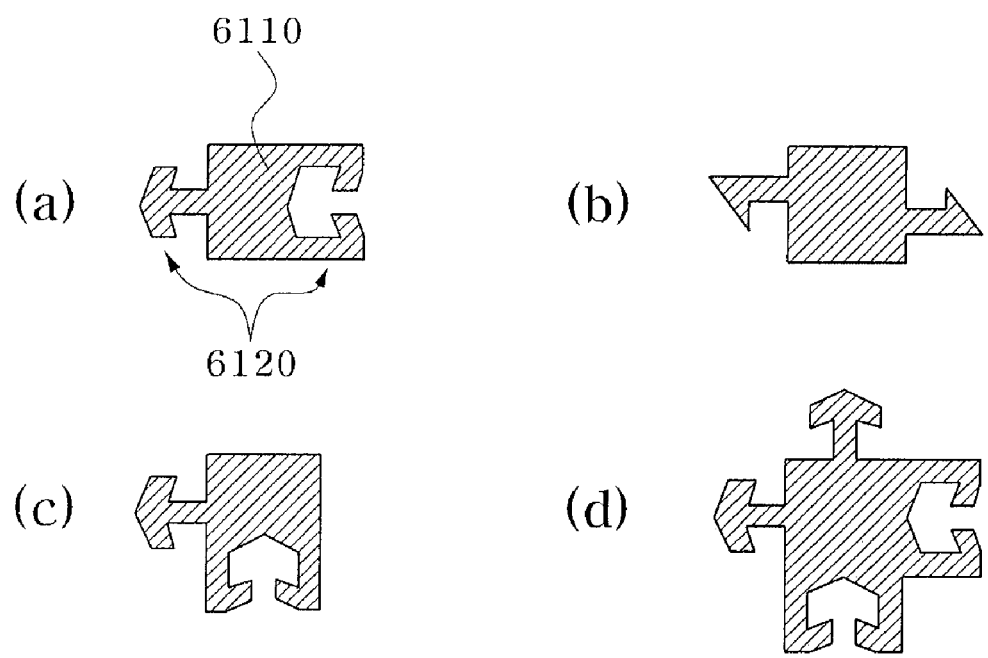
FIG. 61 is diagrams for explaining another embodiment of the fine structure which can be adopted in the fluidic channel system shown in FIG. 1, which show an example in which the fine structure includes a latch.

FIG. 61 is diagrams for explaining one embodiment of the fine structure which can be adopted in the fluidic channel system shown in FIG. 1, which show an example in which the fine structure includes a latch. (a) to (d) of FIG. 61 are opened-up plan views of a fine structure. Referring to (a) of FIG. 61, the fine structure 6110 includes a latch 6120. The fine structure 6110 can be coupled to at least one adjacent fine structure through the latch 6120. The shape of the latch 6120 can be modified in various manners. Modified examples of the latch are shown in (b) to (d) of FIG. 61.

Figure 62:
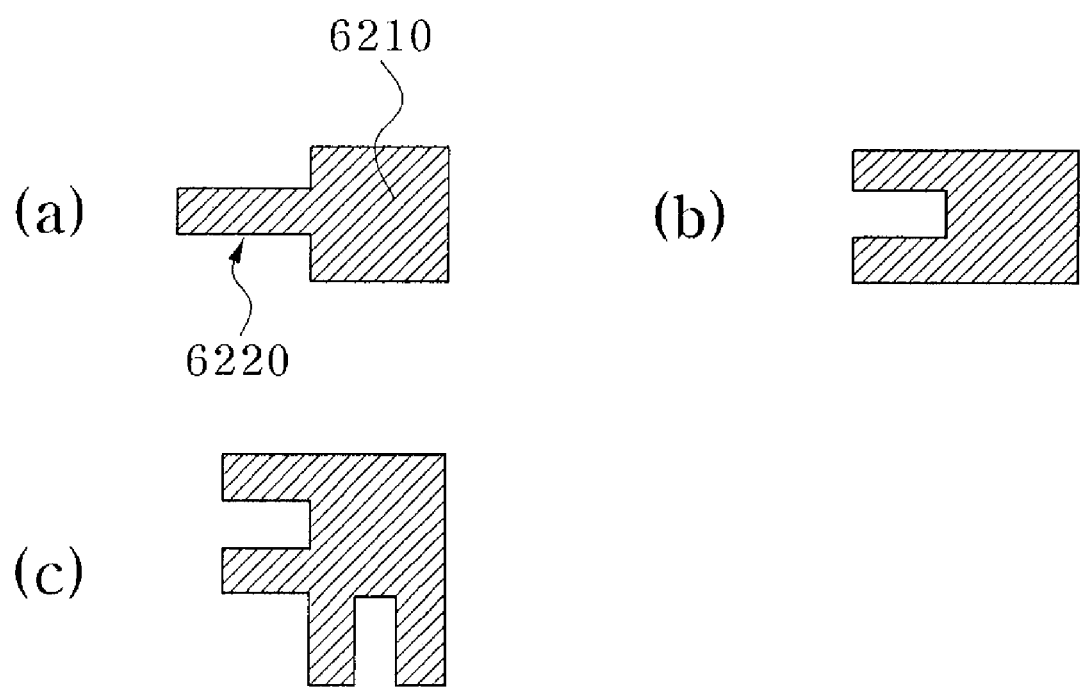
FIG. 62 is diagrams for explaining another embodiment of the fine structure which can be adopted in the fluidic channel system shown in FIG. 1, which show an example in which the fine structure includes a spacer.

FIG. 62 is diagrams for explaining another embodiment of the fine structure which can be adopted in the fluidic channel system shown in FIG. 1, which show an example in which the fine structure includes a spacer. (a) to (c) of FIG. 62 are opened-up plan views of fine structures. Referring to (a) of FIG. 62, a fine structure 6210 includes a spacer 6220. The spacer 6220 serves to adjust a distance between the fine structure 6210 and an adjacent fine structure, that is, a distance between the center of the fine structure 6210 and the center of an adjacent fine structure 6210. In (a) of FIG. 62, the spacer 6220 has a bar shape, but the shape of the spacer 6220 may be modified in various manners. Modified examples of the spacer 6220 are shown in (b) and (c) of FIG. 62.

Figure 63:
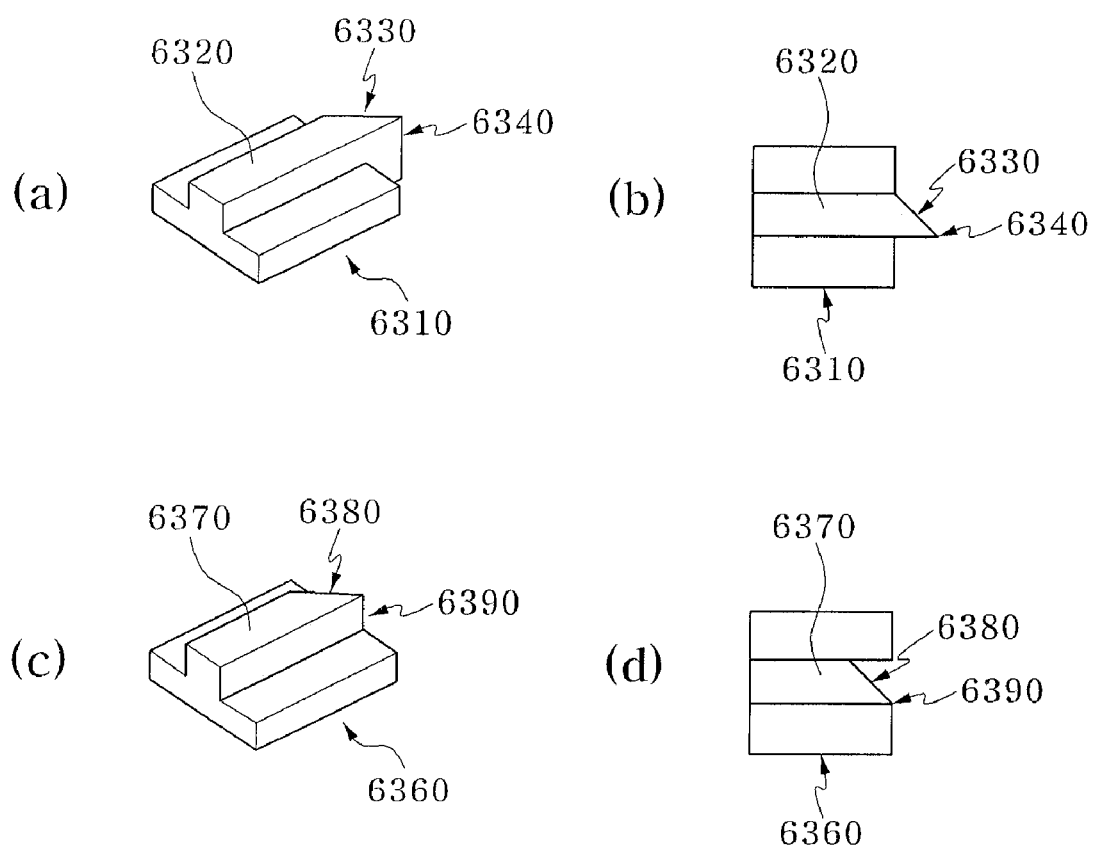
FIG. 63 is diagrams for explaining another embodiment of the fine structure which can be adopted in the fluidic channel system shown in FIG. 1, which show an example in which the guide includes a wedge-shaped end.

FIG. 63 is diagrams for explaining another embodiment of the fine structure which can be adopted in the fluidic channel system shown in FIG. 1, which show an example in which the guide includes a wedge-shaped end. (a) of FIG. 63 is a perspective view of a fine structure having a wedge-shaped end, and (b) of FIG. 63 is an opened-up plan view of the fine structure. Referring to (a) and (b) of FIG. 63, a guide 6320 of a fine structure 6310 has a wedge-shaped end 6330. A tip 6340 of the wedge-shaped end 6330 leans in any one direction of both side surfaces of the 6320. Depending on the direction in which the tip 6340 of the wedge-shaped end 6330 leans, it is determined to which branch the fine structure 6310 reaching a diverging point of a rail moves. (c) of FIG. 63 is a perspective view of a fine structure having a recessed wedge, and (d) of FIG. 63 is an opened-up plan view of the fine structure of (c) of FIG. 63. Referring to (c) and (d) of FIG. 63, a guide 6370 of the fine structure 6360 has a wedge-shaped end 6380, and a tip 6390 of the wedge-shaped end 6380 leans in any one direction of both side surfaces.

Figure 64:
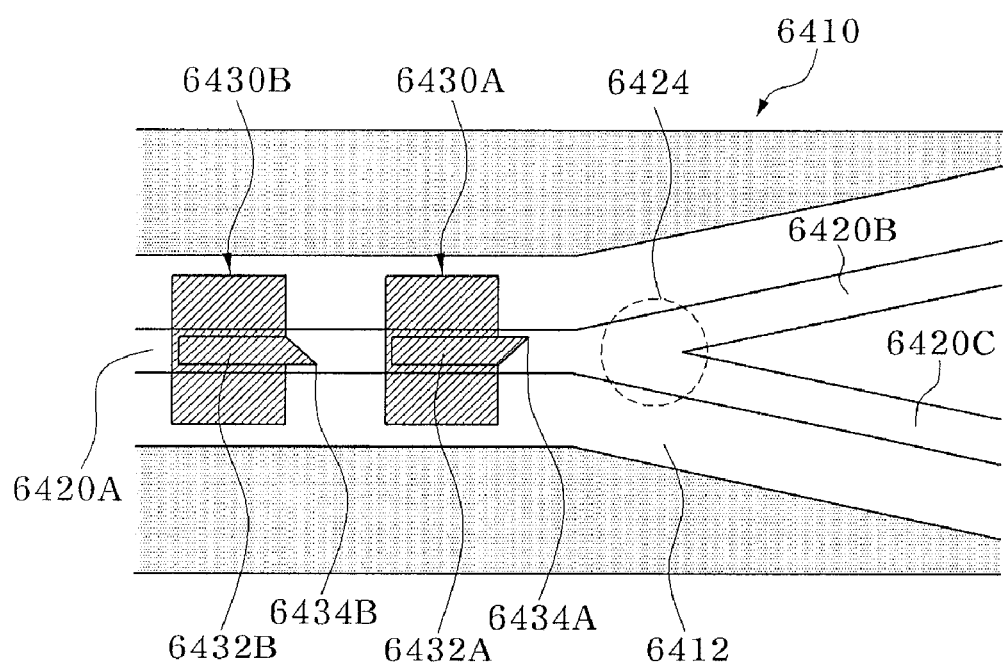
FIGS. 64 and 65 are diagrams for explaining the function of the wedge-shaped end of the guide according to one embodiment.
Figure 65:
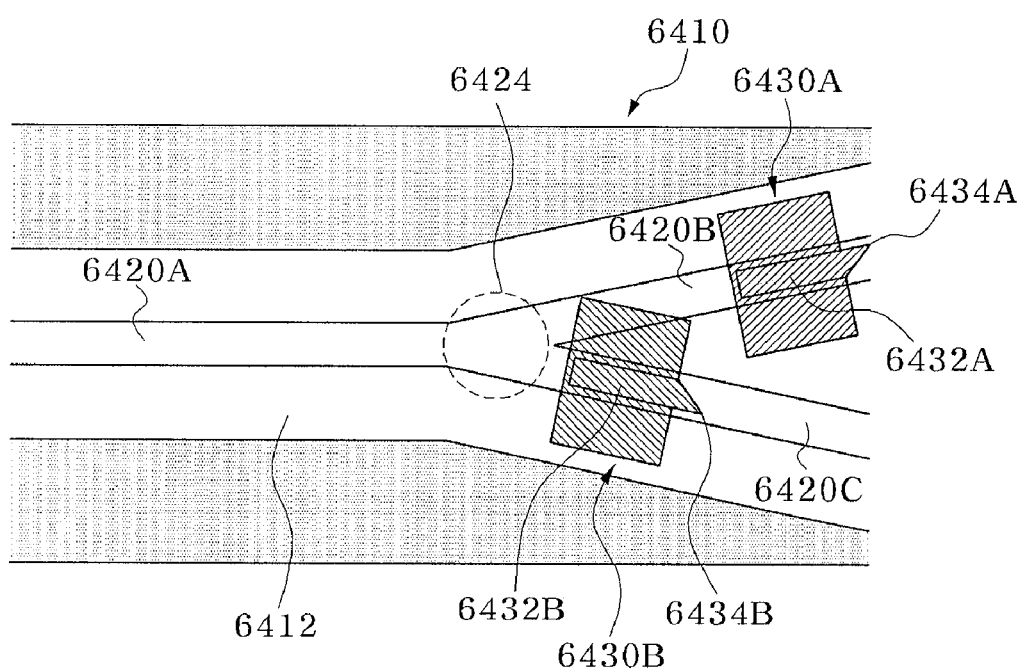

FIGS. 64 and 65 are diagrams for explaining the function of the wedge-shaped end of the guide according to one embodiment. FIG. 64 is an opened-up plan view of a fluidic channel, showing a state before fine structures 6430A and 6430B pass through a diverging point 6424. FIG. 65 is an opened-up plan view of the fluidic channel, showing a state after the fine structures 6430A and 6430B pass through the diverging point 6424.

Referring to FIG. 64, a fluid 6412 flows inside a fluidic channel 6410. The fluid 6412 may be a photocurable fluid. A rail 6420 includes first to third branches 6420A to 6420C. The first to third branches 6420A to 6420C join at the diverging point 6424. The first fine structure 6430A includes a guide 6432A having a wedge-shaped end, and a tip 6434A of the wedge-shaped end leans toward the second branch 6420B. Further, the second fine structure 6430B includes a guide 6432B having a wedge-shaped end, and a tip 6434B of the wedge-shaped end leans toward the third branch 6420C.

Referring to FIG. 65, the first fine structure 6430A having the tip 6434A leaning toward the second branch 6420B is moved to the second branch 6420B. Further, the second fine structure 6430B having the tip 6434B leaning toward the third branch 6420C is moved to the third branch 6420C. In this way, the advancing direction of the fine structures 6430A and 6430B at the diverging point 6424 can be controlled.

Figure 66:
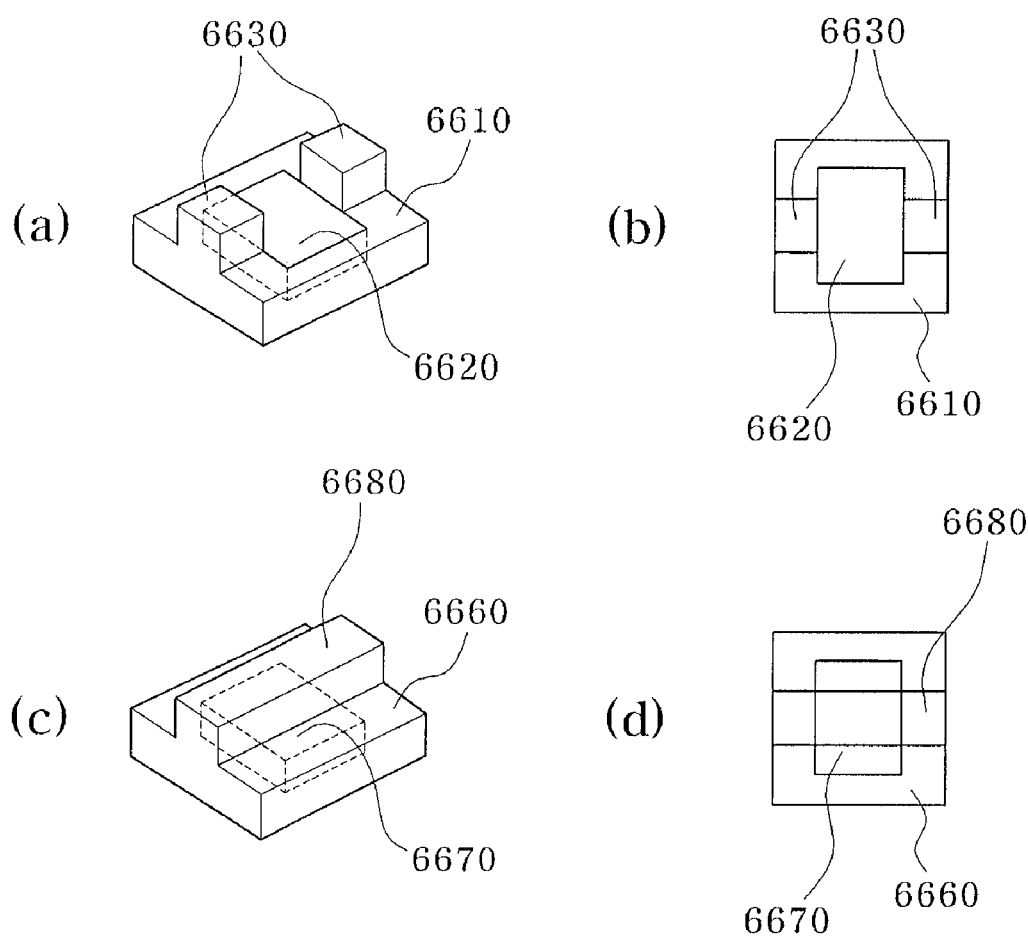
FIG. 66 is diagrams for explaining another embodiment of the fine structure which can be adopted in the fluidic channel system shown in FIG. 1, which show an example in which a fine structure is used as a package of a microchip.

FIG. 66 is diagrams for explaining another embodiment of the fine structure which can be adopted in the fluidic channel system shown in FIG. 1, which show an example in which a fine structure is used as a package of a microchip. (a) of FIG. 66 is a perspective view of a fine structure formed by radiating light from the bottom of a microchip, and (b) of FIG. 66 is an opened-up plan view of the fine structure of (a) of FIG. 66. (c) of FIG. 66 is a perspective view of a fine structure formed by radiating light from the top of a microchip, and (d) of FIG. 66 is an opened-up plan view of the fine structure of (c) of FIG. 66. Referring to FIG. 66, a package 6610 or 6660 covers the bottom and side surfaces of the microchip 6620 or 6670. A microchip means a chip which has an area of less than 1 mm². The microchip may have a size of 100 μm×100 μm×20 μm. Further, the microchip 6620 or 6670 may be a light emitting diode (LED) chip, a radio frequency identification (RFID) chip, or a complementary metal-oxide semiconductor (CMOS) chip. The package 6610 or 6660 includes a guide 6630 or 6680.

Figure 67:
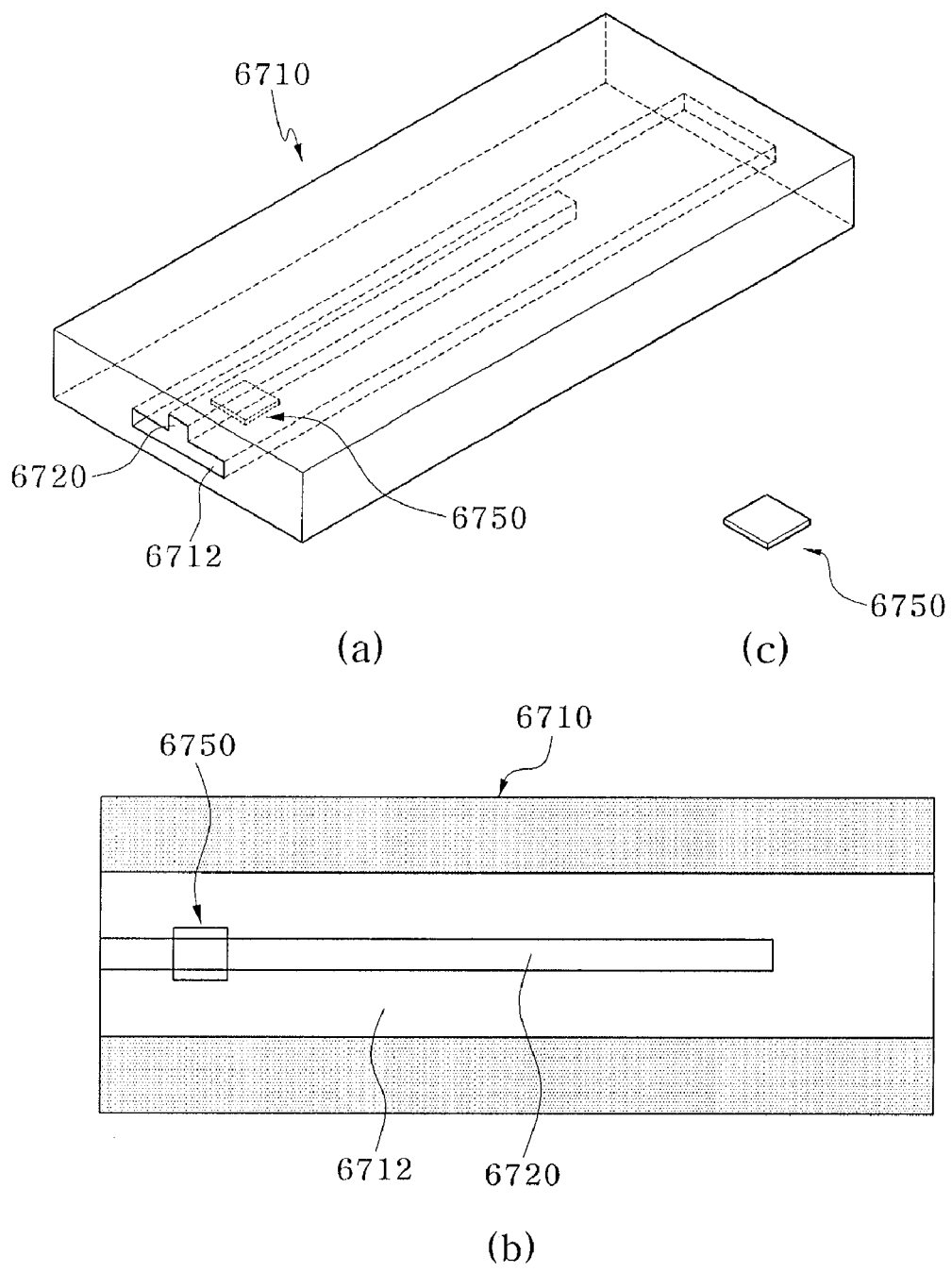
FIGS. 67 to 69 are diagrams for explaining an example of a method for fabricating a package.
Figure 68:
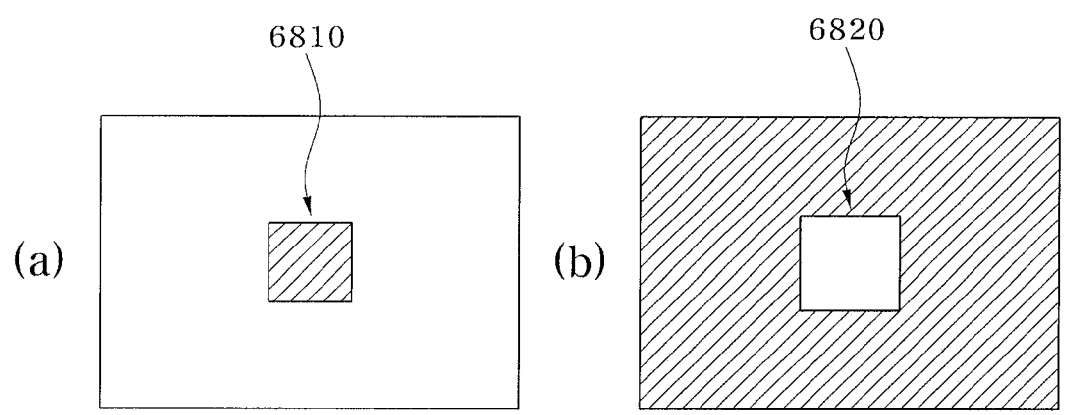
Figure 69:
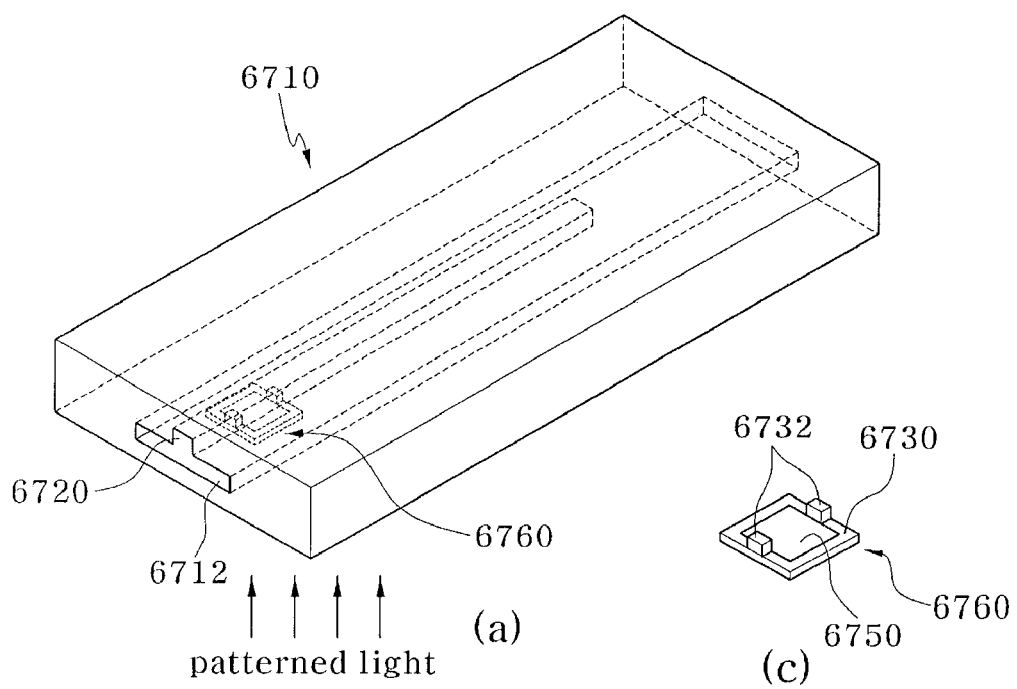
Figure 69:
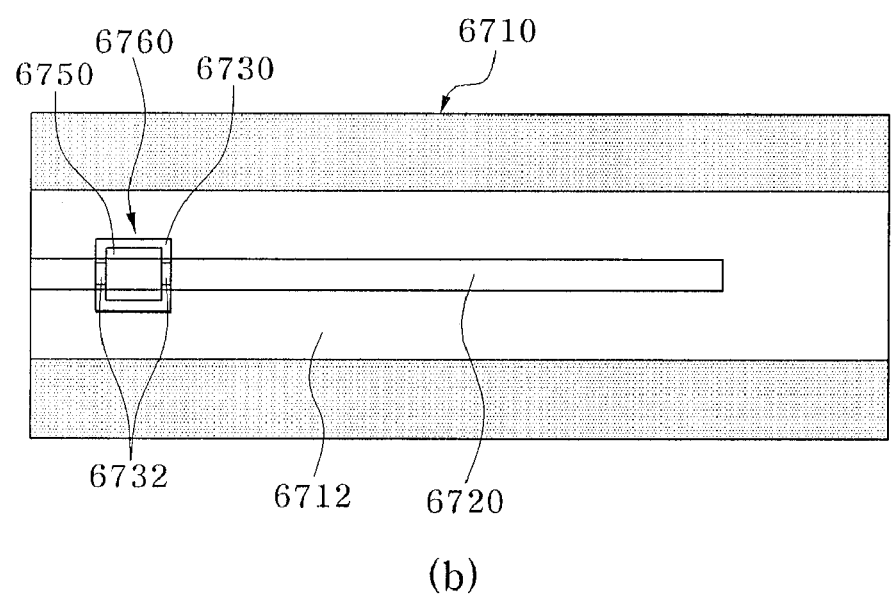

FIGS. 67 to 69 are diagrams for explaining an example of a method of fabricating a package. (a) of FIG. 67 is a perspective view of a fluidic channel 6710, (b) of FIG. 67 is an opened-up plan view of the fluidic channel 6710, and (c) of FIG. 67 is a perspective view of a microchip 6750. Referring to FIG. 67, a microchip 6750 is provided inside the fluidic channel 6710. A fluid 6712 flows inside the fluidic channel 6710. The fluid 6712 may be a photocurable fluid. The fluidic channel 6710 includes a rail 6720. (a) of FIG. 68 is a diagram showing an example of an image photographed by the camera 410 (refer to FIG. 4), and (b) of FIG. 68 is a diagram showing an example of the shape of light determined by the processor 420 (refer to FIG. 4). Referring to FIG. 68, the shape 6820 of light suitable for a package may be obtained by expanding a region 6810 corresponding to the microchip into a predetermined range. (a) of FIG. 69 is a perspective view of the fluidic channel 6710 receiving light having the determined shape 6820, (b) of FIG. 69 is an opened-up plan view of the fluidic channel 6710, and (c) of FIG. 69 is a perspective view of a packaged chip 6730. Referring to FIG. 69, the package 6730 may be formed by providing light to the fluidic channel 6710. The package 6730 may be formed by curing the fluid 6712. A guide 6732 may be formed at the same time as the package 6730.

Figure 70:
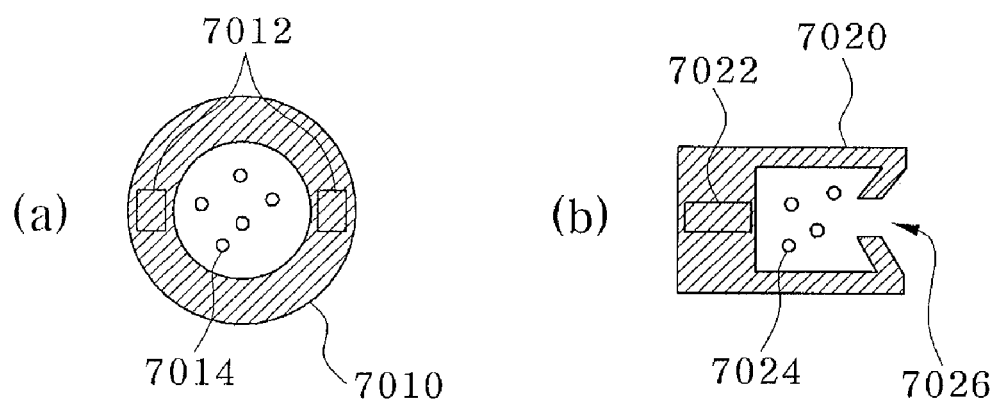
FIG. 70 is a diagram for explaining another embodiment of the fine structure which can be adopted in the fluidic channel system shown in FIG. 1, which show an example in which a fine structure is used as a carrier.

FIG. 70 is a diagram for explaining another embodiment of the fine structure which can be adopted in the fluidic channel system shown in FIG. 1, which show an example in which a fine structure is used as a carrier. (a) and (b) of FIG. 70 are opened-up plan views of fine structures. For example, microbeads, cells, nanostructures, or particles may be carried by a carrier.

Referring to (a) of FIG. 70, the carrier 7010 surrounds microbeads 7014. For example, as the carrier 7010 is formed by radiating light onto a fluid in which the microbeads 7014 are dispersed, the carrier 7010 surrounding the microbeads 7014 can be formed as shown in the drawing. Since the carrier 7010 surrounds the microbeads 7014, the microbeads 7014 are moved by the movement of the carrier 7010. The position of the carrier 7010 can be easily controlled by a guide 7012 and a rail. As a result, the positions of the microbeads 7014 can be easily controlled.

Referring to (b) of FIG. 70, a carrier 7020 surrounds microbeads 7024. The carrier 7020 includes an entrance 7026. The entrance 7026 is shaped so that the microbeads 7024 easily enter the carrier 7020 but have difficulty coming out. For example, the microbeads 7024 enter the carrier 7020 through the entrance 7026, are moved together with the carrier 7020, and then are discharged from the carrier 7020.

Figure 71:
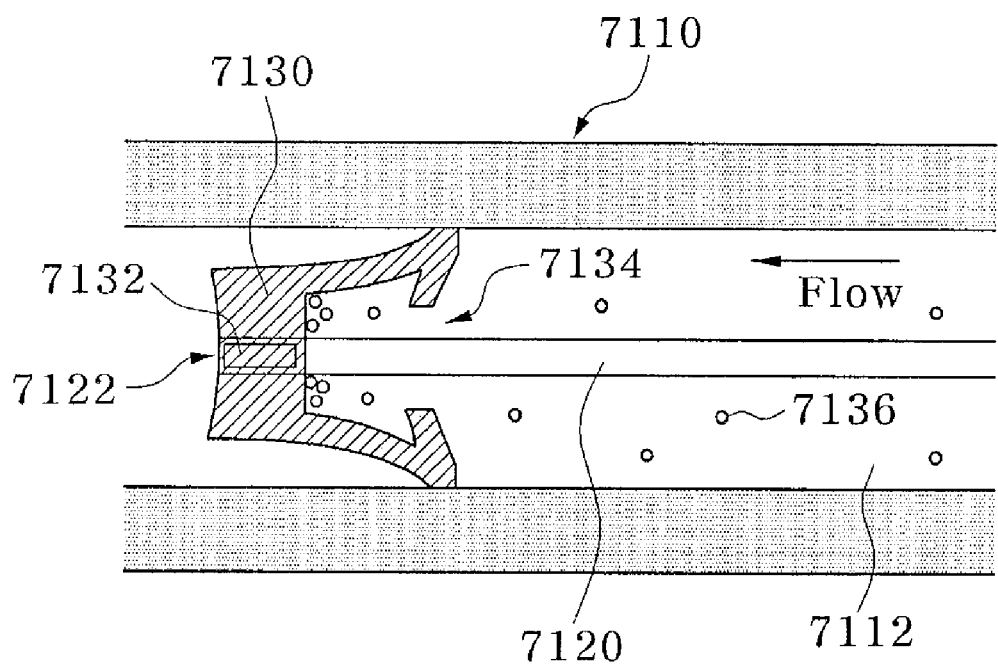
FIGS. 71 and 72 are diagrams for explaining an example in which microbeads are carried by a carrier.
Figure 72:
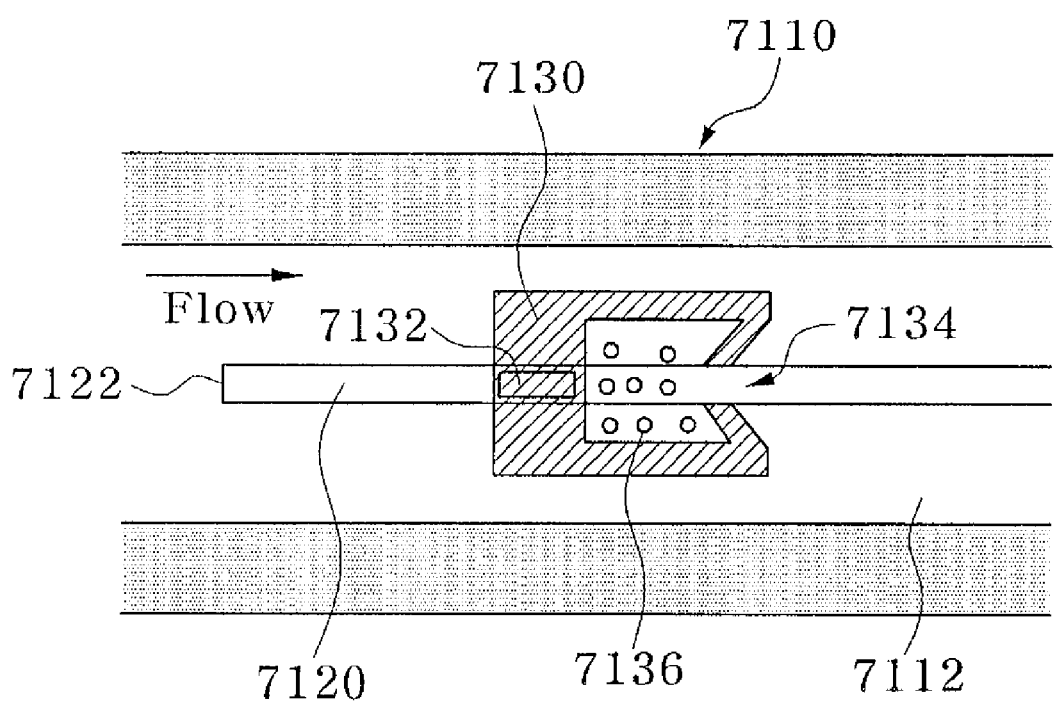

FIGS. 71 and 72 are diagrams for explaining an example in which microbeads are carried by a carrier. FIGS. 71 and 72 are opened-up plan views of a fluidic channel. Referring to FIG. 71, a carrier 7130 having a guide 7132 is positioned at an end 7122 of a rail 7120. Microbeads 7136 are dispersed in a fluid 7112. The fluid 7112 flows to the left side along the fluidic channel 7110. An entrance 7134 of the carrier 7130 is opened by the fluid 7112 flowing to the left side, and the microbeads 7136 are accumulated in the carrier 7130. Referring to FIG. 72, no microbeads 7136 are dispersed in the fluid 7112. The fluid 7112 flows to the right side along the fluidic channel 7110. The entrance 7134 of the carrier 7130 is closed by the fluid 7112 flowing to the right side, and the microbeads 7136 are moved to the right side together with the carrier 7130.

Figure 73:
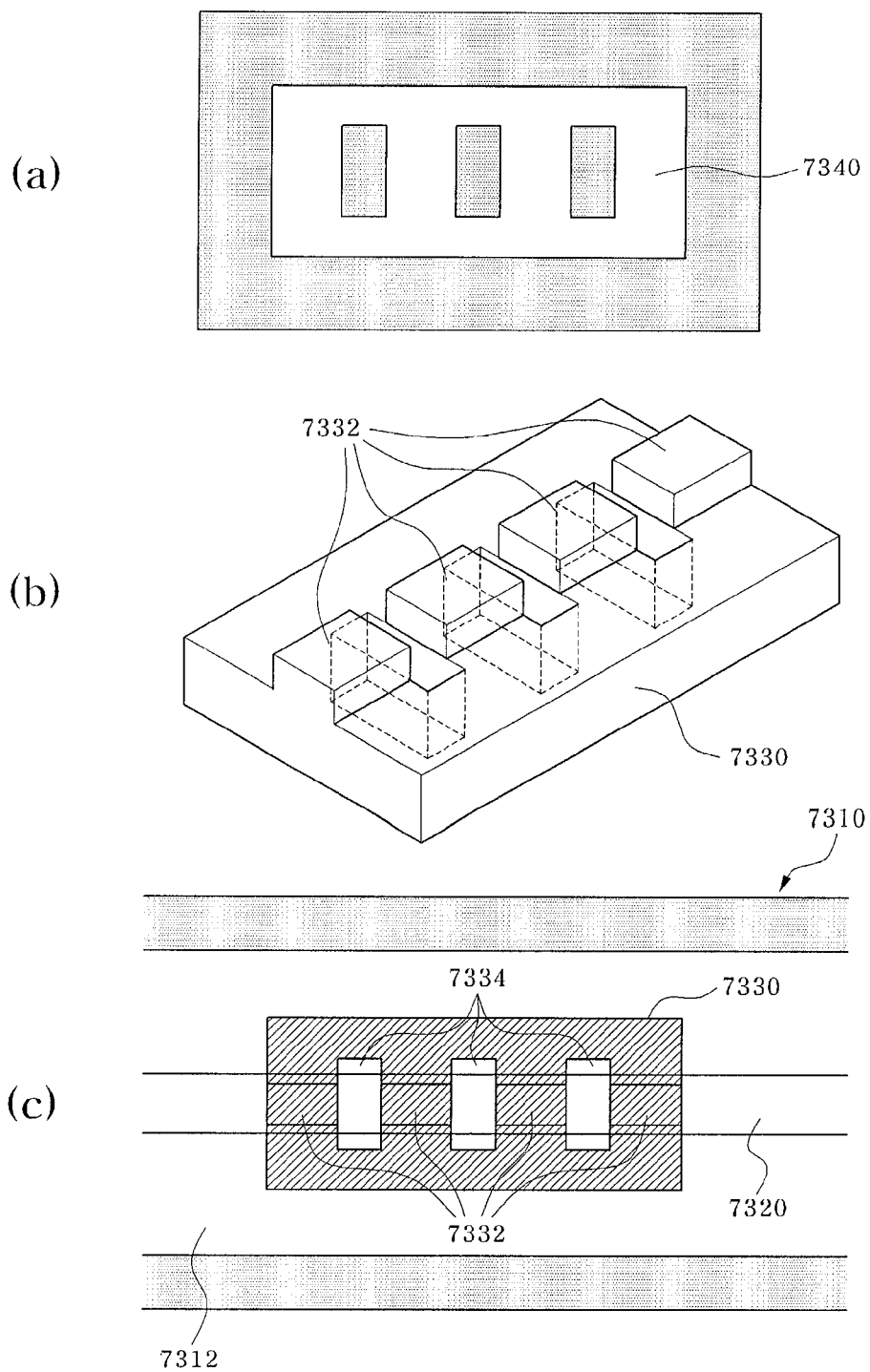
FIGS. 73 and 74 are diagrams for explaining another embodiment of the fine structure which can be adopted in the fluidic channel system shown in FIG. 1, which show an example of a fine structure which can reduce friction with a rail.

FIG. 73 is diagrams for explaining another embodiment of the fine structure which can be adopted in the fluidic channel system shown in FIG. 1, which show an example of a fine structure which can reduce friction with a rail. (a) of FIG. 73 is a diagram showing a shape 7340 of light radiated onto a fluidic channel 7310. (b) of FIG. 73 is a diagram showing a fine structure 7330 formed by photocuring a fluid 7312. (c) of FIG. 73 is an opened-up plan view of the fluidic channel 7310. Referring to FIG. 73, when light having the shape 7340 shown in (a) of FIG. 73 is radiated onto the fluidic channel 7310, the fine structure 7330 having an opening 7334 passing through the fine structure 7330 shown in (b) of FIG. 73 is formed by photocuring the fluid 7312. As shown in the drawings, since the fine structures 7330 have a discontinuous guide 7332, friction between the guide 7332 and the rail 7320 decreases. Further, the discontinuity of the guide 7332 increases flexibility. When the flexibility of the guide 7332 increases, the fine structure 7330 can pass through a curved rail more easily.

Figure 74:
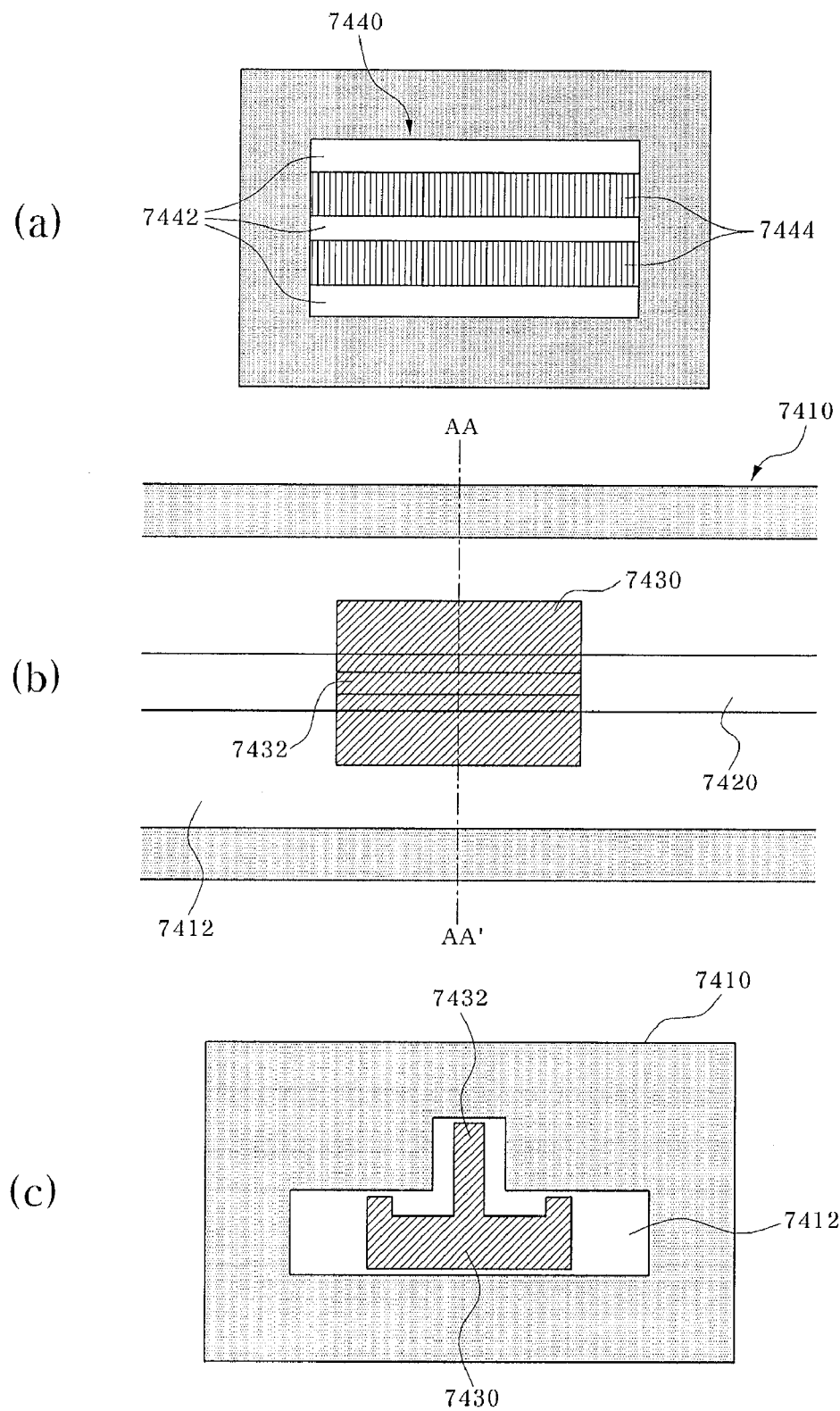

FIG. 74 is diagrams for explaining another embodiment of the fine structure which can be adopted in the fluidic channel system shown in FIG. 1, which show another example of a fine structure which can reduce friction with a rail. (a) of FIG. 74 is a diagram showing a shape 7440 of light radiated onto a fluidic channel 7410. (b) of FIG. 74 is an opened-up plan view of the fluidic channel 7410 in which a fine structure formed by photocuring a fluid 7412 is disposed. (c) of FIG. 74 is a cross-sectional view of the fluidic channel 7410 of (b) of FIG. 74, taken along a line AA-AA'. Referring to FIG. 74, light provided to the fluidic channel 7410 includes a transparent region 7442 and a semi-transparent region 7444. The semi-transparent region 7444 may be implemented using cross stripes, for example. When the fine structure 7430 is formed by the photocuring, a portion of the fluid 7412 onto which the semi-transparent region 7444 of light is radiated is cured to have a smaller thickness than a portion of the fluid 7412 onto which the transparent region 7442 of light is radiated. Therefore, when the photocuring is performed, a guide 7432 having a small width is formed as shown in (c) of FIG. 74. Forming the guide 7432 in such a manner reduces friction between the guide 7432 and the rail 7420. Even when the rail 7420 has a curved shape, the guide 7432 can easily pass through the rail 7420.

Figure 75:
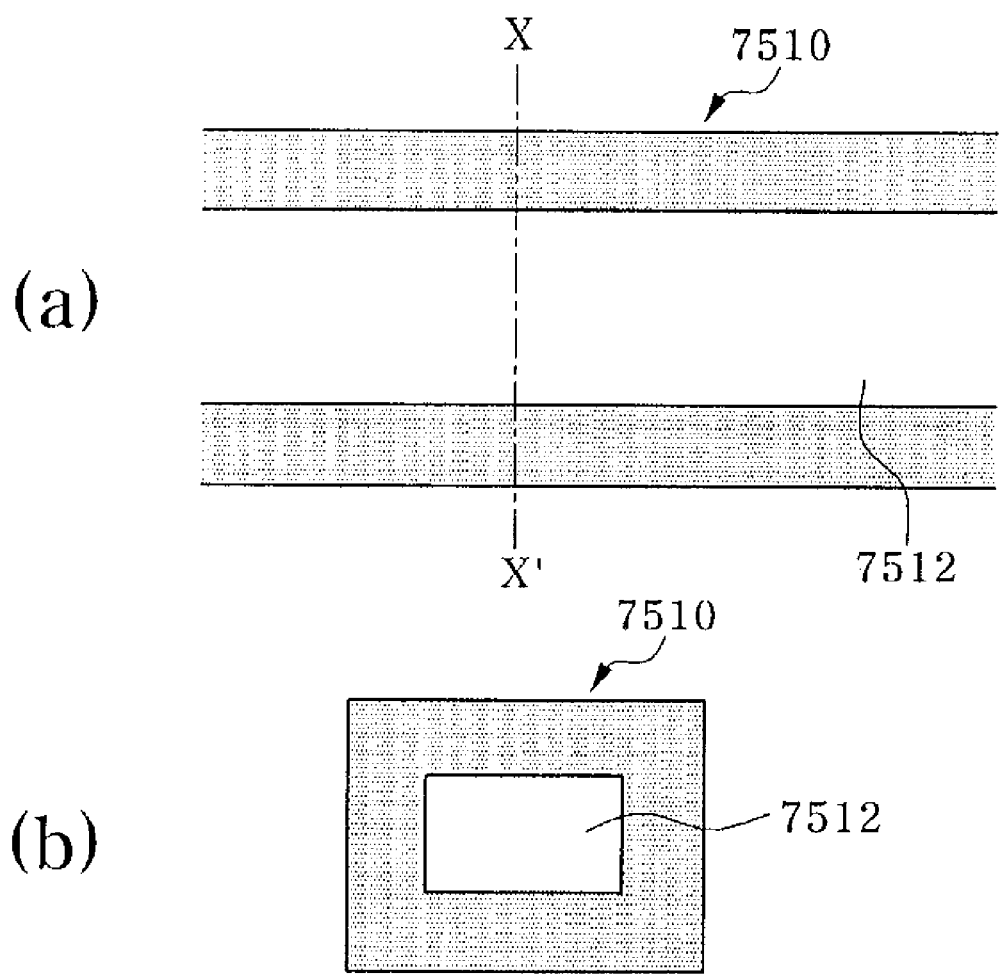
FIGS. 75 and 76 are diagrams for explaining another embodiment of the fine structure which can be adopted in the fluidic channel system shown in FIG. 1, which show an example in which a fine structure having a guide is formed inside a fluidic channel in which no rail is disposed.
Figure 76:
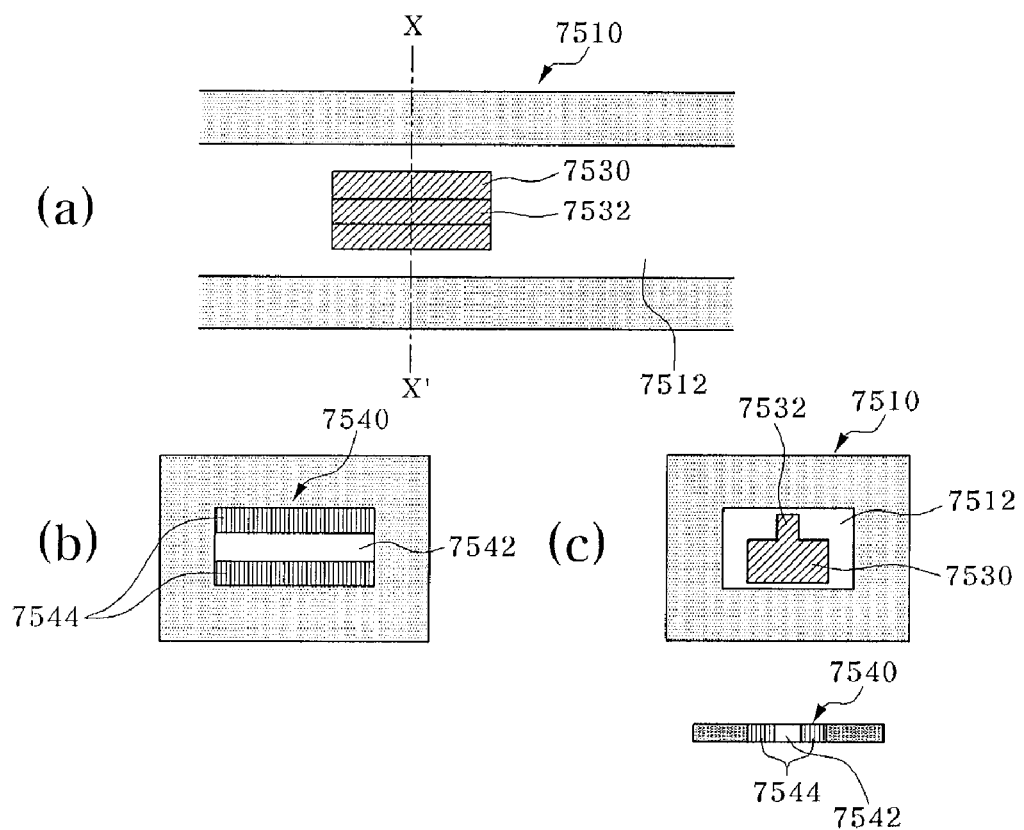

FIGS. 75 and 76 are diagrams for explaining another embodiment of the fine structure which can be adopted in the fluidic channel system shown in FIG. 1. In FIG. 1, the fine structure is formed inside the fluidic channel having the rail disposed therein. In FIGS. 75 and 76, however, a fine structure having a guide is formed inside a fluidic channel in which no rail is disposed. (a) of FIG. 75 is an opened-up plan view of the fluidic channel 7510, and (b) of FIG. 75 is a cross-sectional view of the fluidic channel 7510 of (a) of FIG. 75, taken along a line X-X'. Referring to FIG. 75, a fluid 7512 is present inside the fluidic channel 7510 and no rail is positioned. (a) of FIG. 76 is an opened-up plan view of the fluidic channel 7510.

(b) of FIG. 76 is a diagram showing an example of the shape 7540 of light provided to the fluidic channel 7510 shown in (a) of FIG. 76. (c) of FIG. 76 is a cross-sectional view of the fluidic channel 7510 of (a) of FIG. 76, taken along a line X-X'. Referring to FIG. 76, light provided to the fluidic channel 7510 includes a transparent region 7542 and a semi-transparent region 7544. The semi-transparent region 7544 may be implemented using cross stripes, for example. When the fine structure 7530 is formed by the photocuring, a potion of the fluid 7512 to which the semi-transparent region 7544 of light is provided is cured to have a smaller thickness than a portion of the fluid 7512 to which the transparent region 7542 of light is provided. Therefore, when the light having the transparent region 7542 and the semi-transparent region 7544 is radiated onto the fluidic channel 7510, the fine structure having a guide 7532 can be formed even through no rail is formed in the fluidic channel 7510.

Figure 77:
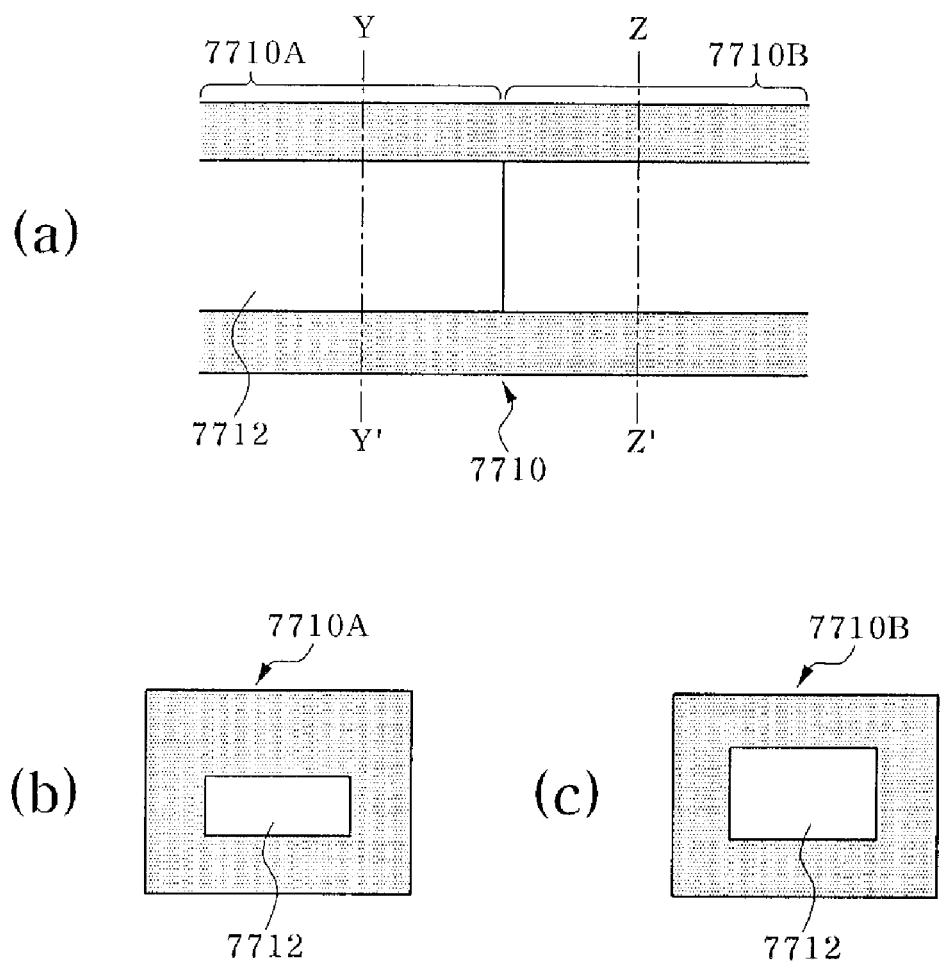
FIGS. 77 to 79 are diagrams for explaining another embodiment of the fine structure which can be adopted in the fluidic channel system shown in FIG. 1, which show another example in which a fine structure having a guide is formed inside a fluidic channel in which no rail is disposed.
Figure 78:
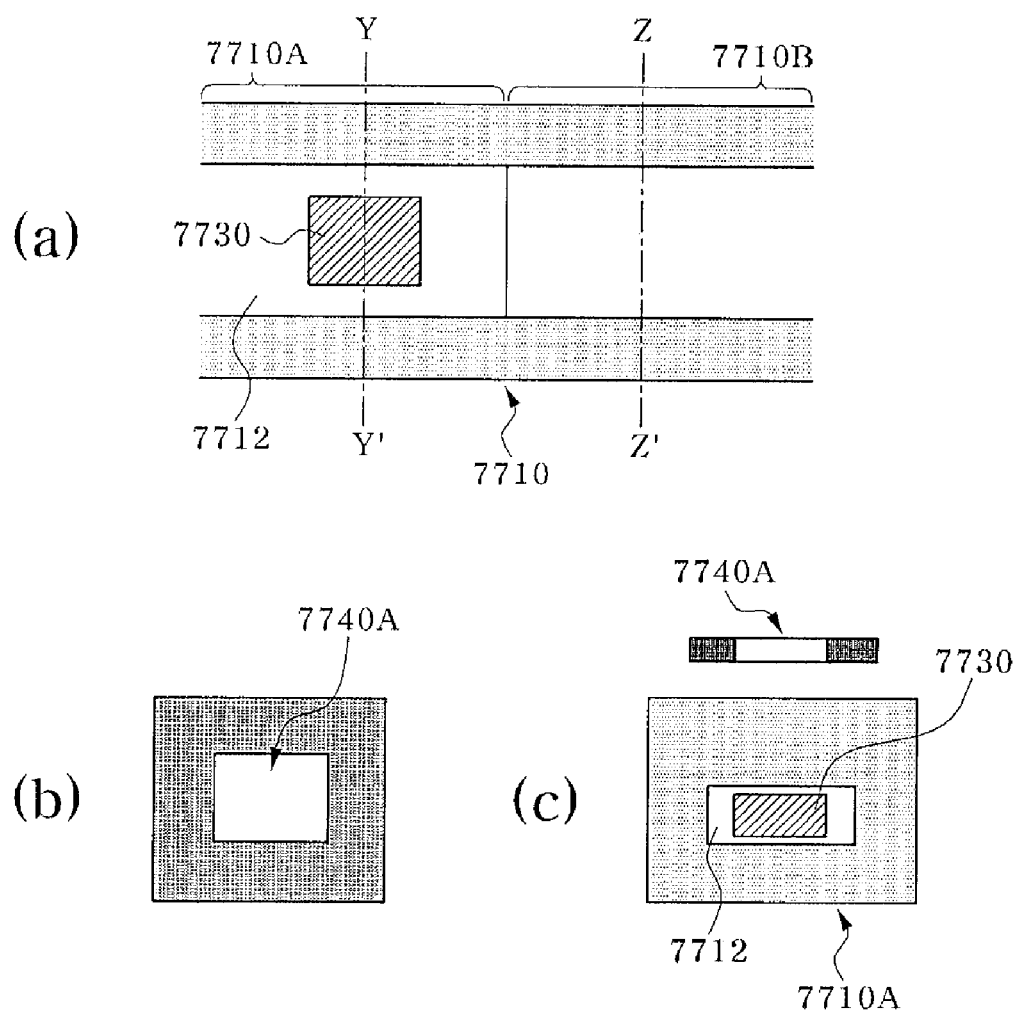
Figure 79:
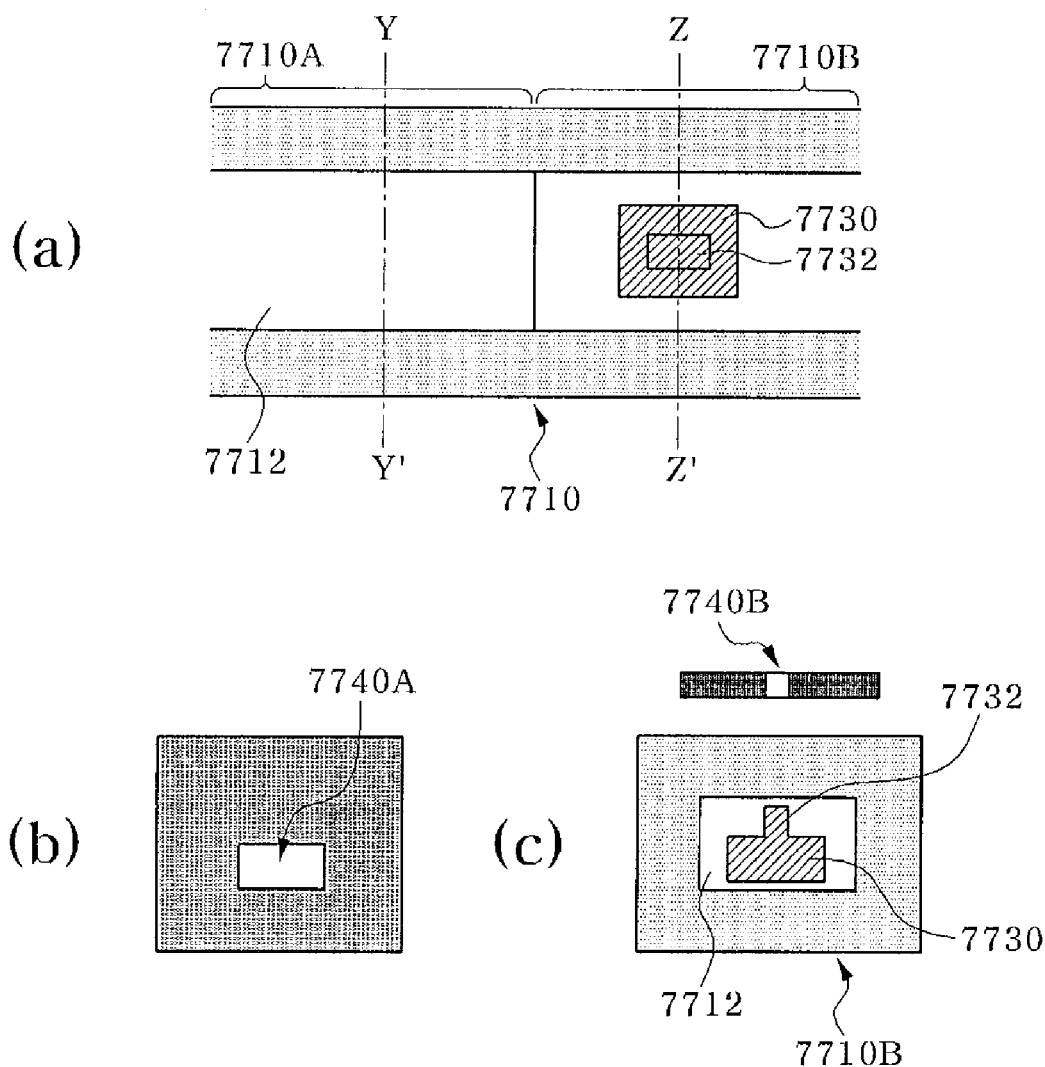

FIGS. 77 to 79 are diagrams for explaining another embodiment of the fine structure which can be adopted in the fluidic channel system shown in FIG. 1. In FIGS. 77 to 79, a fine structure having a guide is formed inside a fluidic channel in which no rail is disposed. (a) of FIG. 77 is an opened-up plan view of a fluidic channel 7710. (b) of FIG. 77 is a cross-sectional view of the fluidic channel 7710 of (a) of FIG. 77, taken along a line Y-Y'. (c) of FIG. 77 is a cross-sectional view of the fluidic channel 7710 of (a) of FIG. 77, taken along a line Z-Z'. Referring to FIG. 77, a fluid 7712 is positioned inside the fluidic channel 7710 and no rail is disposed. The fluidic channel 7710 includes a first region 7710A where the internal height is relatively small and a second region 7710B where the internal height is relatively large. (a) of FIG. 78 is an opened-up plan view of the fluidic channel 7710. (b) of FIG. 78 is a diagram showing an example of the shape 7740A of light provided to the fluidic channel 7710 shown in (a) of FIG. 78. (c) of FIG. 78 is a cross-sectional view of the fluidic channel 7710 of (a) of FIG. 78, taken along a line Y-Y'. Referring to FIG. 78, light having the shape 7740A corresponding to the fine structure 7730 is provided to a first region 7710A, thereby forming a portion corresponding to a body of the fine structure 7730. Since the fine structure 7730 is formed in the first region 7710A, the fine structure 7730 has a thickness corresponding to the internal height of the first region 7710A. (a) of FIG. 79 is an opened-up plan view of the fluidic channel 7710. (b) of FIG. 79 is a diagram showing an example of the shape 7740B of light provided to the fluidic channel 7710 shown in (a) of FIG. 79. (c) of FIG. 79 is a cross-sectional view of the fluidic channel 7710 of (a) of FIG. 79, taken along a line Z-Z'. Referring to FIG. 79, light having the shape B corresponding to a guide 7732 is provided to the fine structure 7730 moved to the second region 7710B along the flow of the fluid 7712, thereby forming a guide 7732.

Figure 80:
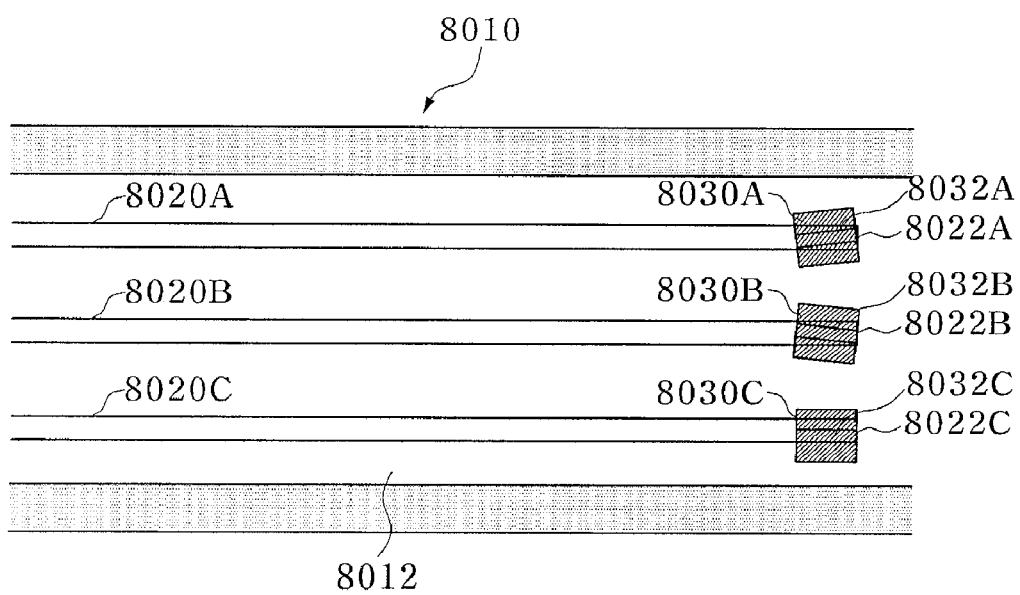
FIGS. 80 and 81 are diagrams for explaining another example of a method of fabricating a fine structure, which show a method for aligning a fine structure with a rail by expanding a guide.
Figure 81:
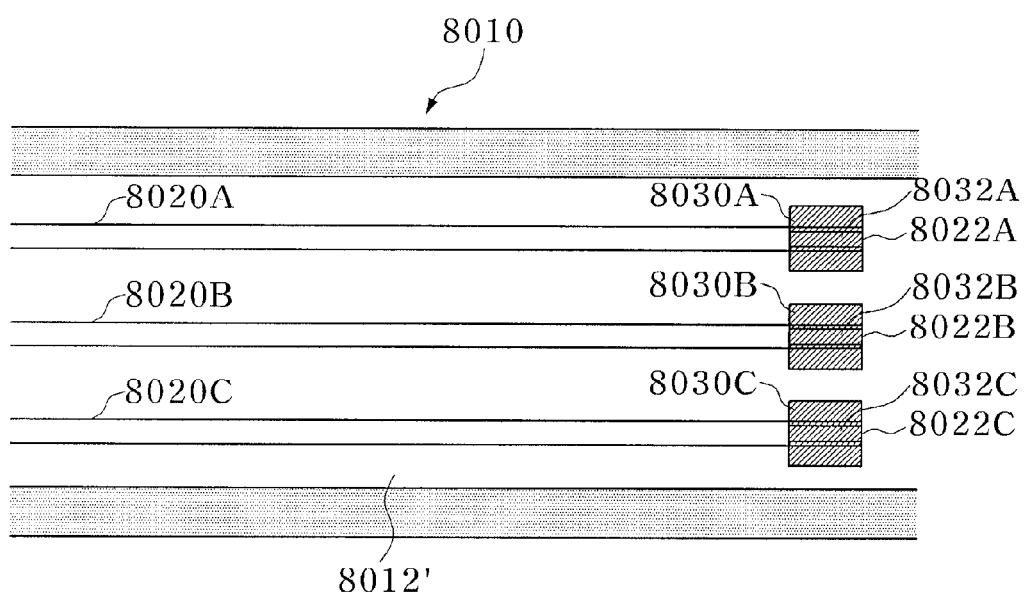

FIGS. 80 and 81 are diagrams for explaining another example of a method of fabricating a fine structure, which show a method for aligning a fine structure with a rail by expanding a guide. FIGS. 80 and 81 are opened-up plan views of a fluidic channel 8010. Referring to FIG. 80, fine structures 8030A to 8030C are positioned at ends 8022A to 8022C of rails 8020A to 8020C. Since the width of guides 8032A to 8032C is considerably smaller than that of the rails 8020A to 8020C, some guides 8032A and 8032B may not be aligned with the rails 8020A and 8020B. That is, the guides 8032A and 8032B may not be disposed in parallel to the rails 8020A and 8020B.

In this case, when the guides 8032A to 8032C are expanded, the guides 8032A to 8032C can be aligned with the rails 8020A to 8020C. Such an example is shown in FIG. 81. The guides 8032A to 8032C may be expanded by various methods. In one example, the guides 8032A to 8032C may be fabricated by photocuring PEG-DA as an example of the fluid 8012, and a separate fluid 8012' having higher acidity than PEG-DA may be introduced into the fluidic channel 8010 to react with the guides 8032A to 8032C. As a result, the guides 8032A to 8032C can be expanded. The expansion process may be performed on one fine structure or on a one- or two-dimensional array of fine structures.

Figure 82:
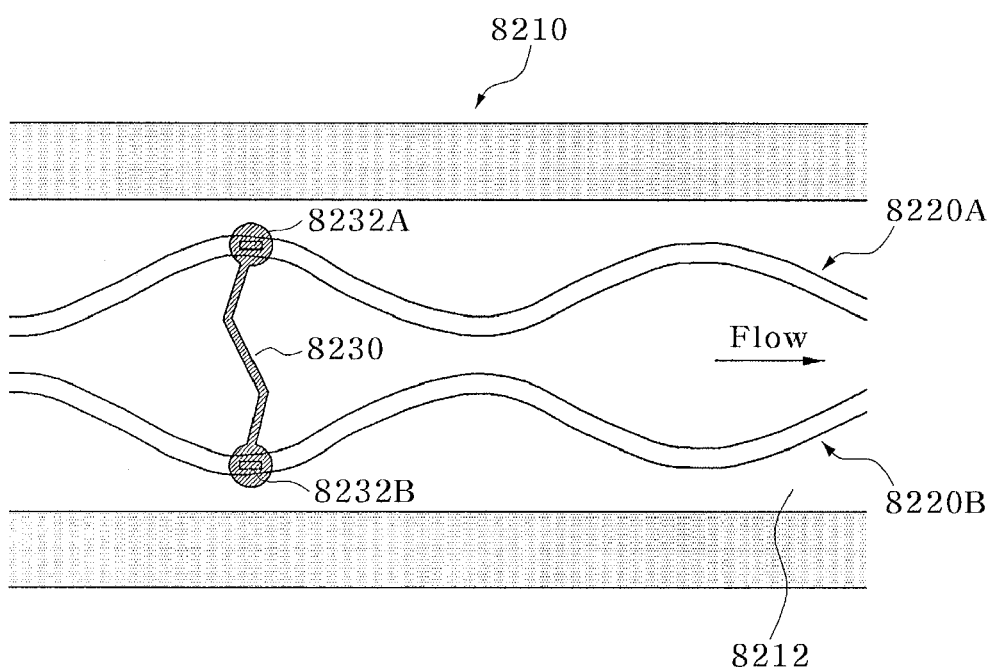
FIGS. 82 to 85 are diagrams for explaining another embodiment of the rail which can be adopted in the fluidic channel system shown in FIG. 1, and another embodiment of a method of fabricating a fine structure, which show an example in which a fine structure moves along a plurality of rails.
Figure 83:
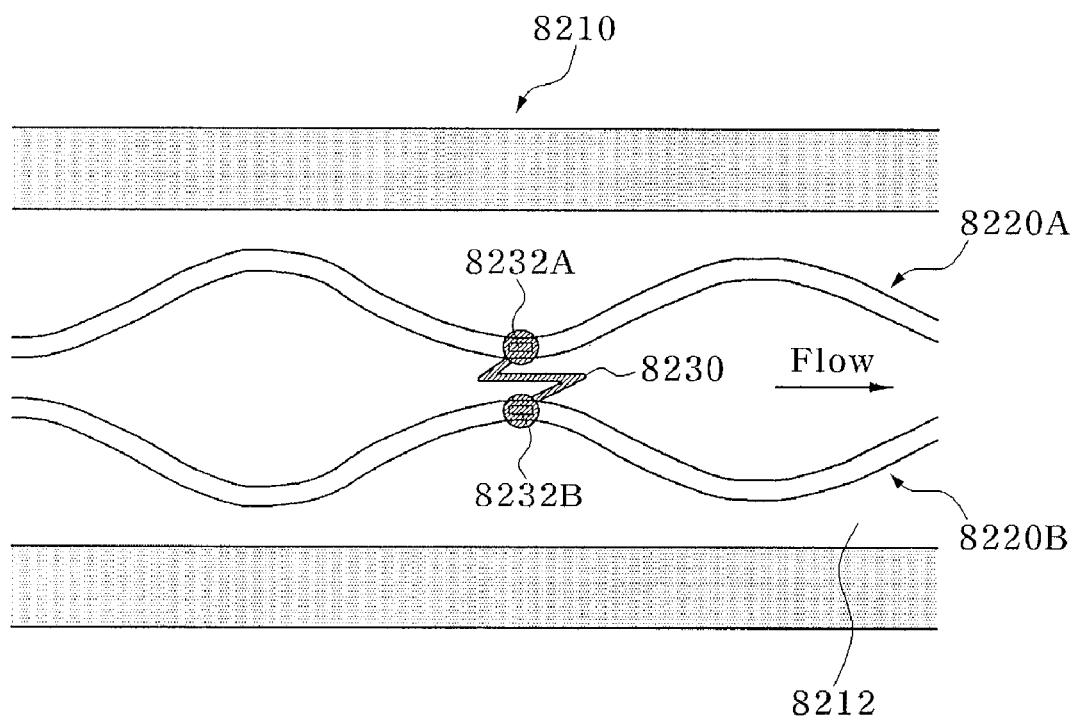

FIGS. 82 and 83 are diagrams for explaining another embodiment of the rail which can be adopted in the fluidic channel system shown in FIG. 1, and another embodiment of a method of fabricating a fine structure, which show an example in which a fine structure moves along a plurality of rails. Referring to FIGS. 82 and 83, a fluid 8212 flows inside a fluidic channel 8210. Two rails 8220A and 8220B are positioned inside the fluidic channel 8210, and a distance between the rails 8220A and 8220B changes. A fine structure 8230 has a spring shape and is positioned across the two rails 8220A and 8220B. The fine structure 8230 has two guides 8232A and 8232B. When the fine structure 8230 is positioned in a region where the distance between the rails 8220A and 8220B is relatively large (FIG. 82), the fine structure 8230 extends. When the fine structure 8203 is positioned in a region where the distance between the rails 8220A and 8220B is relatively small (FIG. 83), the fine structure 8230 contracts. As such, when the fine structure 8230 is positioned across the plurality of rails 8220A and 8220B, the spring-type fine structure 8230 capable of extending and contracting may be applied. As a result, the fine structure 8230 can be moved along the rails 8220A and 8220B, regardless of increase or decrease in the distance between the rails 8220A and 8220B.

Figure 84:
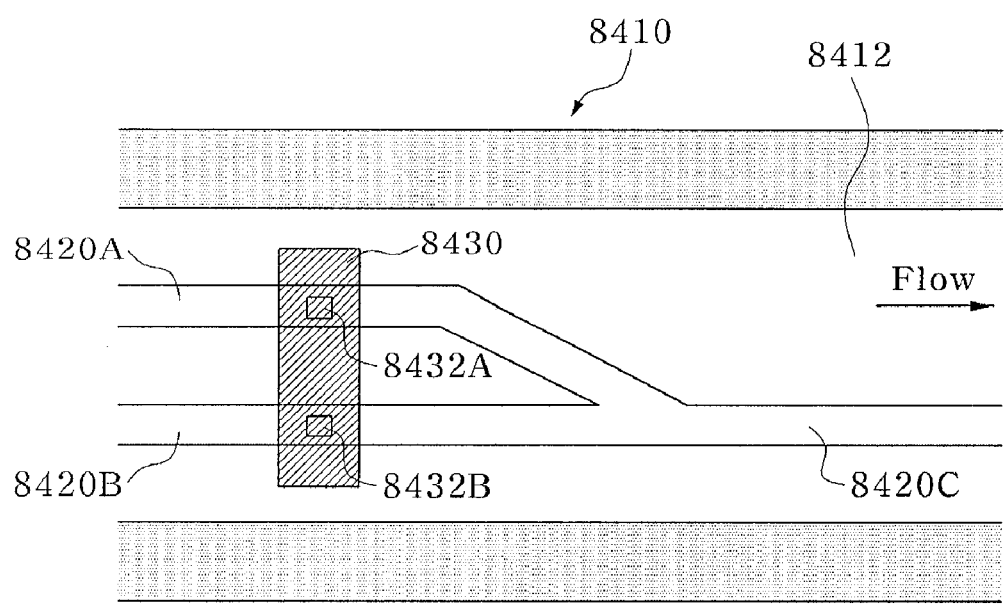
Figure 85:
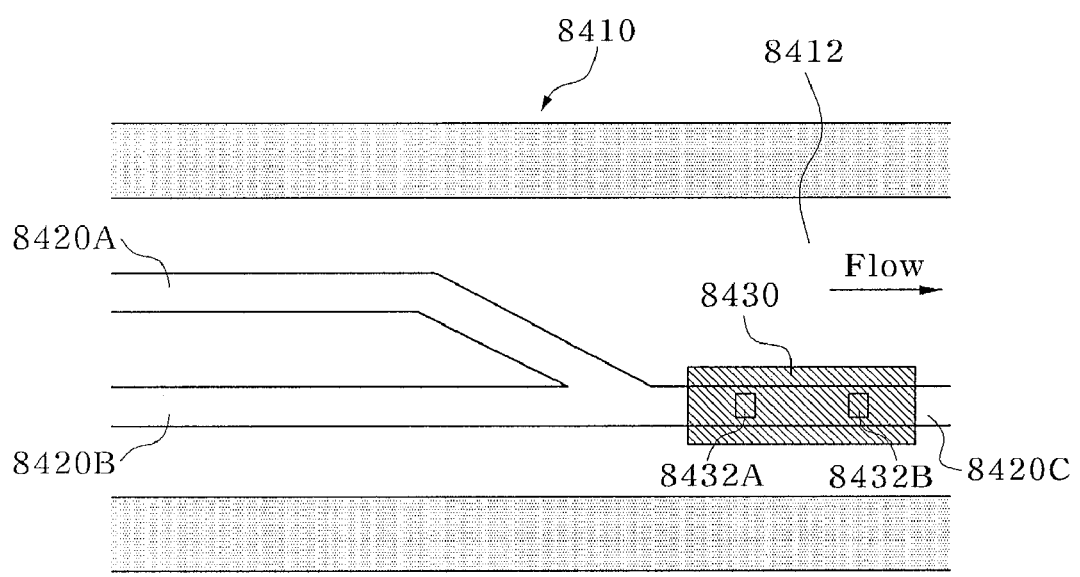

FIGS. 84 and 85 are diagrams for explaining another embodiment of the rail which can be adopted in the fluidic channel system shown in FIG. 1, and another embodiment of a method of fabricating a fine structure, which show another example in which a fine structure moves along a plurality of rails. Referring to FIG. 84, a fluid 8412 flows inside a fluidic channel 8410. Two rails 8420A and 8420B positioned inside the fluidic channel 8410 join to connect to one rail 8420C. The fine structure 8430 is positioned across the two rails 8420A and 8420B and has two guides 8432A and 8432B.

Referring to FIG. 85, the fine structure 8430 is moved along the flow of the fluid 8412 into the one rail 8420C at a diverging point, and the two guides 8432A and 8432B are positioned in one rail 8420C. In this state, the fine structure 8430 is turned about 90 degrees compared with the state of FIG. 84. As described above, the fine structure 8430 positioned across the two rails 8420A and 8420B can be moved to one rail 8420C along the flow of the fluid 8412. At this time, the fine structure 8430 is turned about 90 degrees.

FIGS. 86 to 89 are diagrams for explaining another embodiment of the rail which can be adopted in the fluidic channel system shown in FIG. 1, and another embodiment of a method of fabricating a fine structure, which show an example in which a fine structure is erected.

Figure 86:
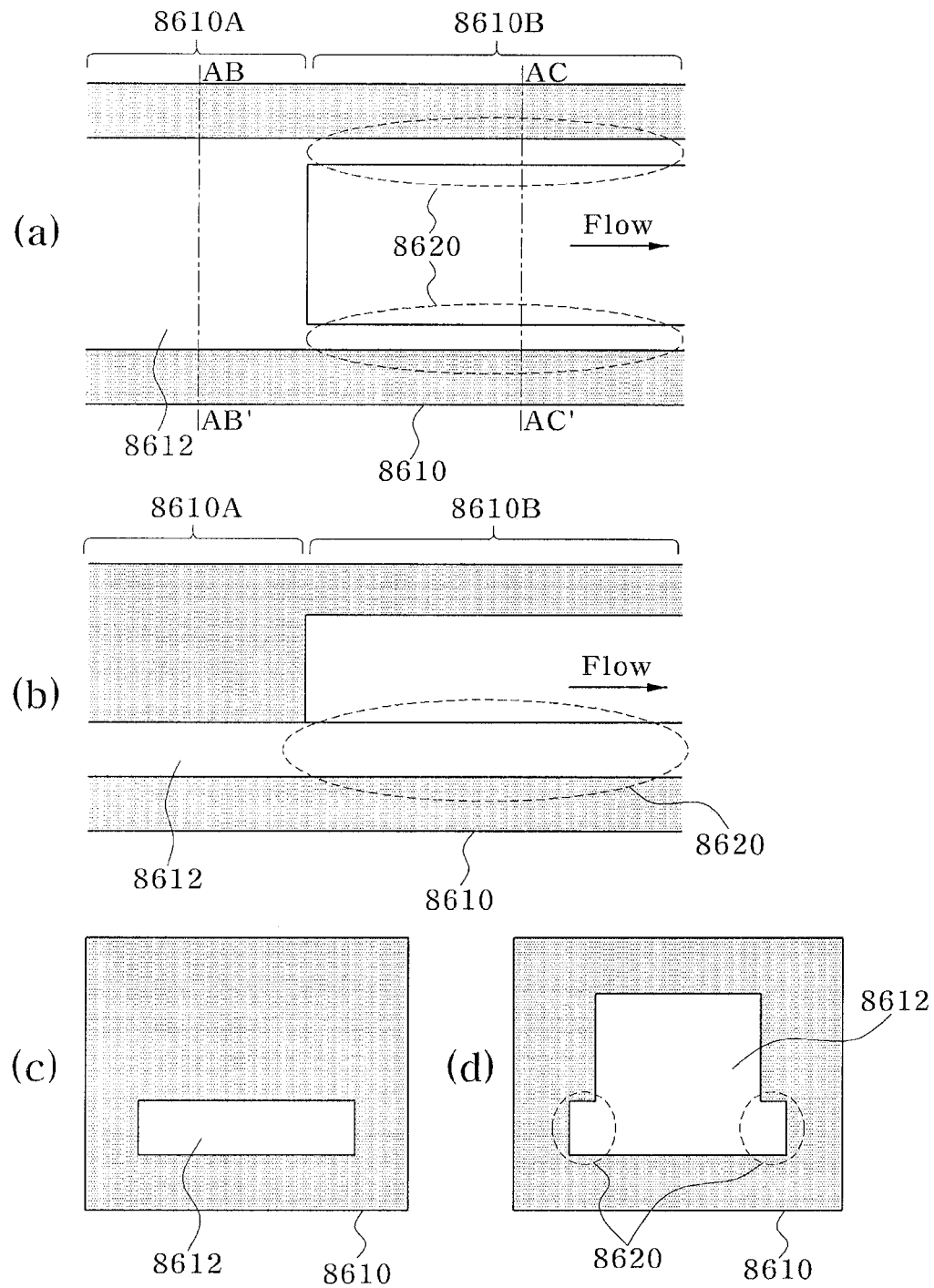
FIGS. 86 to 89 are diagrams for explaining another embodiment of the rail which can be adopted in the fluidic channel system shown in FIG. 1, and another embodiment of a method of fabricating a fine structure, which show an example in which a fine structure is erected.

(a) of FIG. 86 is an opened-up plan view of a fluidic channel 8610. (b) of FIG. 86 is an opened-up side view of the fluidic channel 8610 shown in (a) of FIG. 86. (c) of FIG. 86 is a cross-sectional view of the fluidic channel 8610 of (a) of FIG. 86, taken along a line AB-AB'. (d) of FIG. 86 is a cross-sectional view of the fluidic channel 8610 of (a) of FIG. 86, taken along a line AC-AC'. Referring to FIG. 86, a fluid 8612 flows inside the fluidic channel 8610. The fluidic channel 8610 includes first and second regions 8610A and 8610B. A groove-shaped rail 8620 is formed in either side of the second region 8610B, and the internal height of the second region 8610B is larger than that of the first region 8610A.

Figure 87:
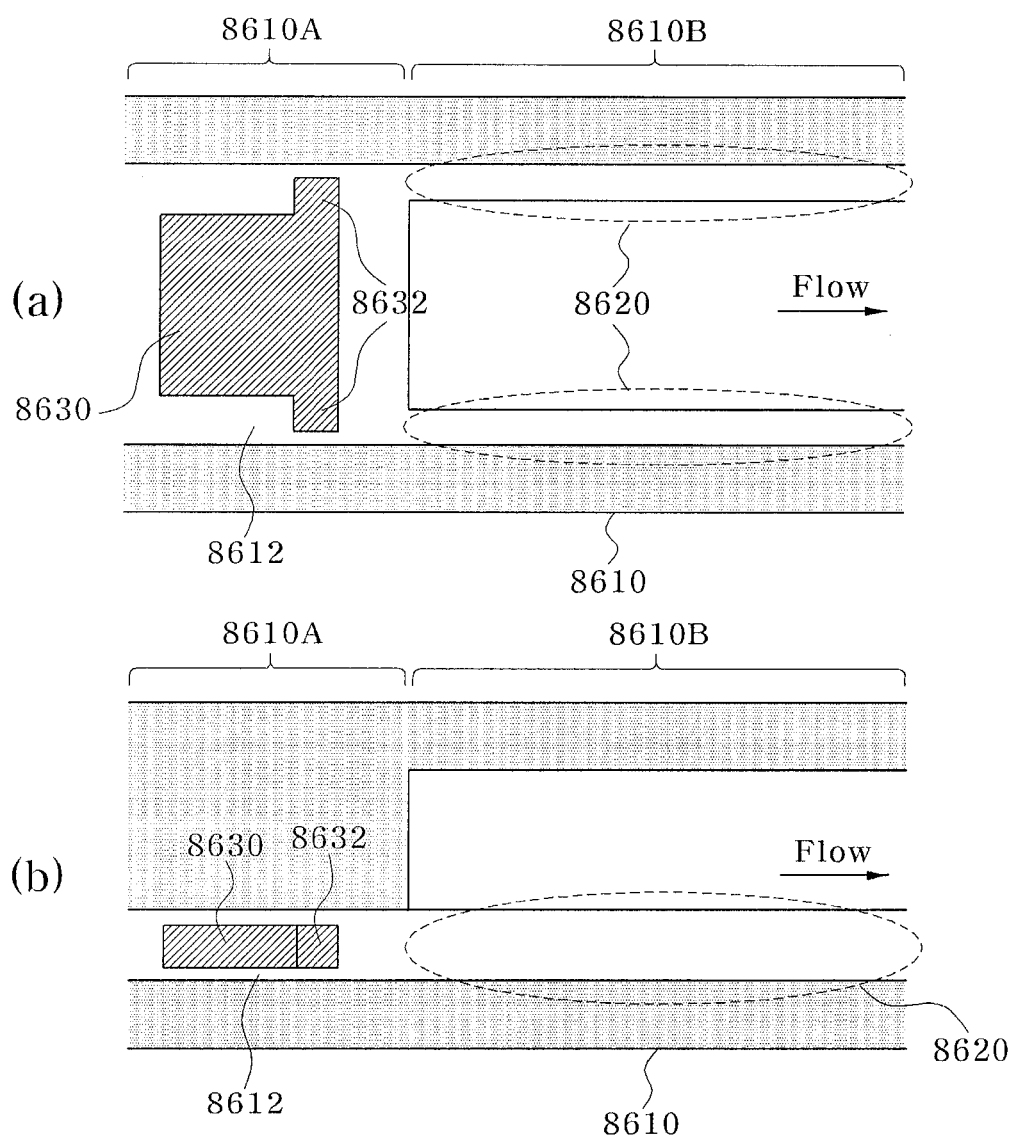

(a) of FIG. 87 is an opened-up plan view of the fluidic channel 8610. (b) of FIG. 87 is an opened-up side view of the fluidic channel 8610 shown in (a) of FIG. 87. Referring to FIG. 87, a fine structure 8630 moves along the flow of the fluid 8612 in the first region 8610A of the fluidic channel 8610. As shown in the drawings, the fine structure 8630 is laid inside the rail of the first region 8610A, and has a guide 8632 positioned at either side surface thereof.

Figure 88:
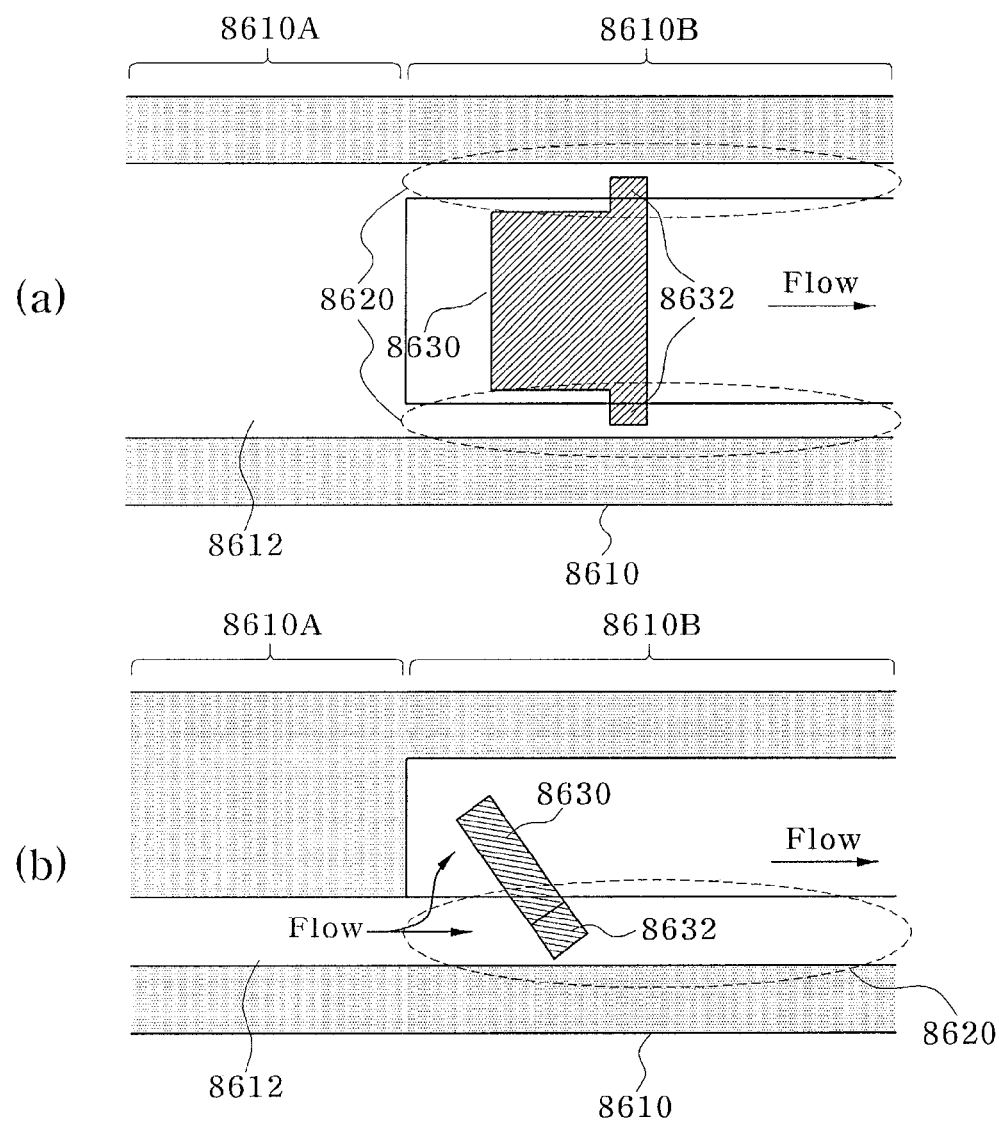

(a) of FIG. 88 is an opened-up plan view of the fluidic channel 8610, and (b) of FIG. 88 is an opened-up side view of the fluidic channel 8610 shown in (a) of FIG. 88. Referring to FIG. 88, when the fine structure 8630 enters the second region 8610B of the fluidic channel 8610, the fine structure 8610 is erected. As shown in (b) of FIG. 88, some of the fluid 8612 entering the second region 8610B from the first region 8610A flows in the upward direction of the second region 8610B. Such a flow of the fluid 8612 erects the fine structure 8630. At this time, the rail 8620 and the guide 8632 serve to set a path of the fine structure 8630 and to rotate the fine structure 8630.

Figure 89:
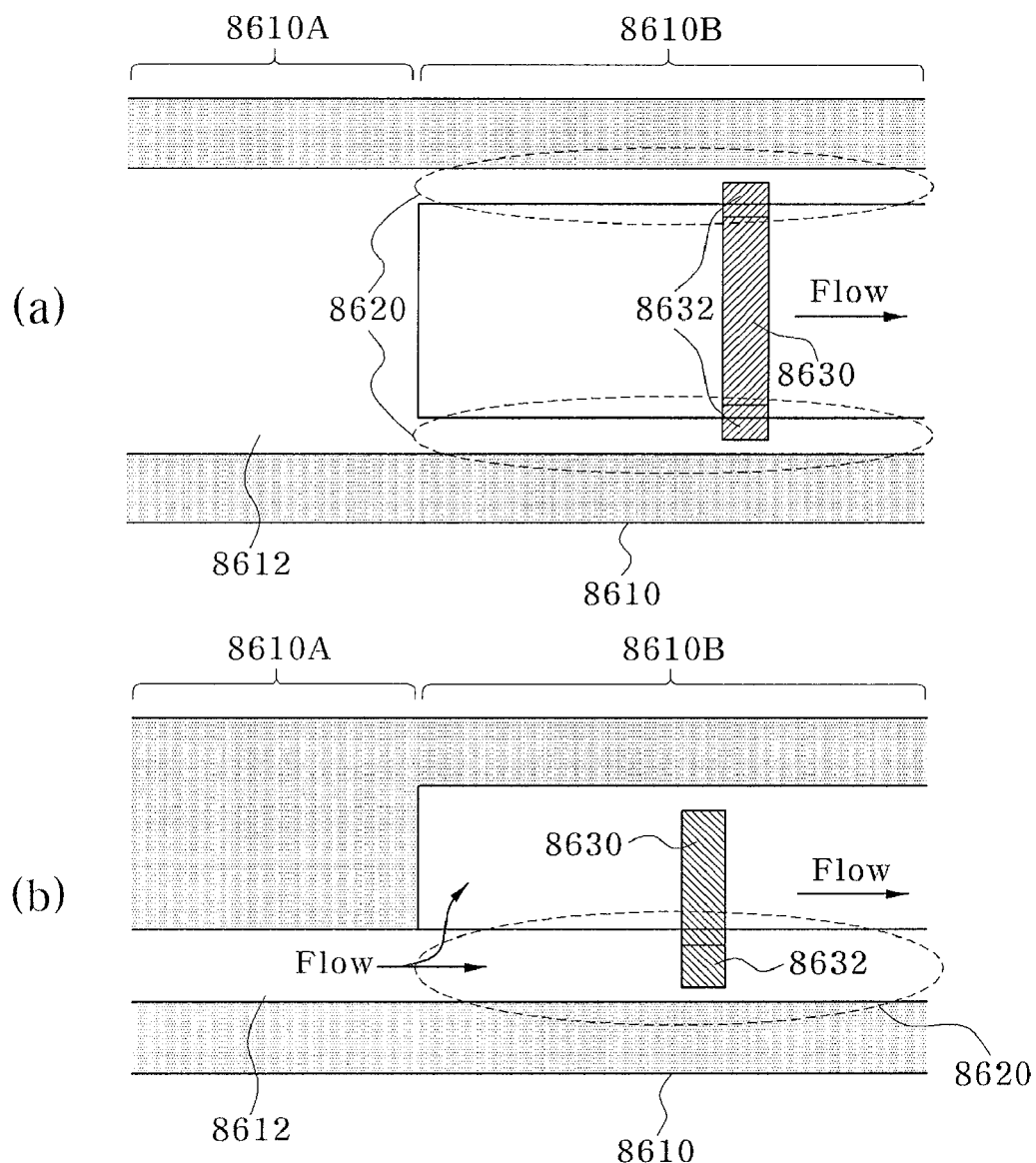

(a) of FIG. 89 is an opened-up plan view of the fluidic channel 8610, and (b) of FIG. 89 is an opened-up side view of the fluidic channel 8610 shown in (a) of FIG. 89. As shown in FIG. 89, the flow of the fluid 8612 in the second region 8010B completely erects the fine structure 8030.

The fluidic channel system according to the above-described embodiments can be changed, modified, and remodeled, as will be described below.

According to some embodiments, a single light projection apparatus or a plurality of light projection apparatuses may be mounted on the system. According to some embodiments, the light projection apparatus may be mounted to be fixed to the fluidic channel. Alternatively, the light projection apparatus may be mounted to move linearly around the fluidic channel or along a two- or three-dimensional path. When a plurality of light projection apparatuses are used, fine structures can be simultaneously produced in different portions of a single fluidic channel or a plurality of fluidic channels. When the movable light projection apparatus is used, it is possible to produce a fine structure having an arbitrary shape in an arbitrary portion inside the fluidic channel. Further, when a movable light projection apparatus is used, it is possible to produce a fine structure having a three-dimensional shape, which cannot be produced by a fixed light projection apparatus.

According to some embodiments, the system can produce a fine structure having a variety of physical, electrical, or chemical properties by adjusting the intensity or wavelength of light radiated from the light projection apparatus. Further, when a mixture of different photocurable fluids flows inside the fluidic channel or different photocurable fluids flow while forming an interface, the system adjusts the wavelength of light radiated from the light projection apparatus temporally or spatially, so that different photocuring reactions are sequentially performed inside the fluidic channel. Then, a fine structure of which each portion has a different property may be formed.

According to some embodiments, the rail can be configured to be suitable for moving, arranging, or coupling the fine structure, in consideration of various characteristics of a photocurable material and the fine structure produced from the photocurable material. In one example, a rail is configured in such a manner that the fine structure produced through a predetermined path can physically move via the path. If necessary, the fine structure may be configured to be arranged based on the path or to be coupled based on the path or arrangement. Such a rail can move, arrange, or couple the fine structure, without forming a specific portion in the fine structure. In another example, a rail forms a predetermined path, a fine structure includes a portion having a predetermined shape, and the rail is configured to physically move the fine structure to the path by using the portion. If necessary, the fine structure may be configured to be arranged based on the path or the shape of the portion, or to be coupled based on the path or arrangement. In still another example, a rail forms a predetermined path, and a chemical, electrical, or magnetic attractive force or a chemical, electrical, or magnetic repulsive force is generated depending on the chemical, electrical, or magnetic property of a produced fine structure. Then, the fine structure can be moved to the path by the attractive or repulsive force. If necessary, the fine structure may be configured to be arranged based on the path or the shape of the portion, or to be coupled based on the path or arrangement.

According to some embodiments, it is possible to configure a fluidic channel system using electromagnetic wave curing, unlike the embodiments of the fluidic system using photocuring. That is, it is possible to configure a fluidic channel system in which the light projection apparatus is replaced with an electron beam generator, the photocurable fluid is replaced with an electromagnetic wave curable fluid, and a proper processor is used. The electromagnetic wave curable fluid may be acryl, methylmethacrylate (MMA), stylen, PEG or the like. Further, according to some embodiments, it is possible to configure a fluidic channel system using electric curing. That is, it is possible to configure a fluidic channel system to which the above-described various embodiments are applied and in which the light projection apparatus is replaced with an electric energy generator, the photocurable fluid is replaced with an electrically curable fluid, and a proper processor is used. The electrically curable fluid may be MMA or stylen which is polymerized in an electrochemical reaction such as oxidization or reduction at an electrode. Further, according to some embodiments, it is possible to configure a fluidic channel system using thermal curing. That is, it is possible to configure a fluidic channel system to which the above-described various embodiments are applied and in which the light projection apparatus is replaced with a heat energy source, the photocurable fluid is replaced with thermally curable fluid, and a proper processor is used. The thermally curable fluid may be acryl, MMA, stylen, PEG, or the like. Further, according to some embodiments, it is possible to configure a fluidic channel system using magnetic curing. That is, it is possible to configure a fluidic channel system to which the above-described various embodiments are applied and in which the light projection apparatus is replaced with a magnetic energy generator, the photocurable fluid is replaced with magnetically curable fluid, and a proper processor is used. The magnetically curable fluid may be a mixture of magnetic particles and a thermally curable material. When the mixture reacts with a magnetic field, the magnetic particles are heated by an induced electromotive force to polymerize the thermally curable material therearound. Therefore, the mixture can be used as the magnetically curable fluid. Further, according to some embodiments, it is possible to configure a fluidic channel system using particle energy curing. That is, it is possible to configure a fluidic channel system to which the above-described various embodiments are applied and in which the light projection apparatus is replaced with a particle energy generator, the photocurable fluid is replaced with particle energy curable fluid, and a proper process is used. The particle energy curable fluid may be acryl, MMA, stylen, PEG, or the like.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure, which is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

The invention claimed is:

1. A fluidic channel system comprising:
    a light projection apparatus that provides light;
    a fluidic channel in which a photocurable fluid flows, the photocurable fluid being selectively solidified by the light;
    a fine structure formed from the photocurable fluid solidified by the light and positioned inside the fluidic channel; and
    a rail along which the fine structure moves.

2. The fluidic channel system according to claim 1, wherein the longitudinal direction of at least a portion of the rail is different from the flow direction of the photocurable fluid flowing around the portion of the rail.

3. The fluidic channel system according to claim 1, wherein the rail comprises an end for limiting the movement of the fine structure.

4. The fluidic channel system according to claim 1, further comprising:
    at least one additional rail connected or not connected to the rail.

5. The fluidic channel system according to claim 1, wherein first and second fluids flow in the fluidic channel, and the rail is disposed to intersect an interface between the first and second fluids.

6. The fluidic channel system according to claim 1, wherein the rail has a groove shape, and the width of the rail in a region where the fine structure is produced is smaller than that in a region where the fine structure moves.

7. The fluidic channel system according to claim 1, wherein the rail has a protrusion shape, and the width of the rail in a region where the fine structure is produced is larger than that in a region where the fine structure moves.

8. The fluidic channel system according to claim 1, further comprising:
    a camera that photographs the inside of the fluidic channel; and
    a processor that determines the shape of the light in accordance with an image photographed by the camera, and provides a signal corresponding to the determined shape to the light projection apparatus.

9. The fluidic channel system according to claim 8, wherein a chip is positioned inside the fluidic channel, the camera photographs the chip, the processor determines the shape of the light suitable for packaging the chip, and wherein the light provided by the light projection apparatus generates a package covering at least a region of the chip.

10. The fluidic channel system according to claim 8, wherein the light projection apparatus comprises:
    a light source; and
    a spatial light modulator which modulates light provided by the light source in accordance with the signal provided from the processor.

11. A fluidic channel system comprising:
a light projection apparatus that provides light;
a fluidic channel in which a fluid is provided, wherein the fluid is a photocurable fluid being selectively solidified by the light;
a fine structure positioned inside the fluidic channel; and
a rail along which the fine structure moves.

12. The fluidic channel system according to claim 11, wherein as the fine structure moves along the rail, the fine structure moves in a direction different from the flow direction of the fluid flowing in the fluidic channel.

13. The fluidic channel system according to claim 11, wherein the rail comprises an end for limiting the movement of the fine structure.

14. The fluidic channel system according to claim 11, further comprising:
an additional rail along which an additional fine structure moves.

15. The fluidic channel system according to claim 14, wherein the additional fine structure moves along the additional rail so that the additional fine structure is delivered to the rail.

16. The fluidic channel system according to claim 11, wherein the fluid includes first and second fluids which flow in the fluidic channel, and the fine structure moves along the rail to pass through an interface between the first and second fluids.

17. The fluidic channel system according to claim 11, wherein the fine structure is produced from the fluid which is selectively cured by providing energy to the fluid positioned inside the fluidic channel.

18. The fluidic channel system according to claim 17, wherein the energy is light energy, thermal energy, electromagnetic wave energy, electrical energy, magnetic energy, or particle energy.

19. The fluidic channel system according to claim 11, wherein the fine structure comprises a guide which prevents the fine structure from coming off of the rail.

20. The fluidic channel system according to claim 19, wherein the rail has a groove shape and the guide has a protrusion shape.

21. The fluidic channel system according to claim 20, wherein the width of the rail in a region where the fine structure is produced is smaller than that in a region where the fine structure moves.

22. The fluidic channel system according to claim 20, wherein one end of the guide has a wedge shape, and a tip of the wedge-shaped end is not positioned at the center of the guide but rather leans in any one direction of both side surfaces of the guide.

23. The fluidic channel system according to claim 22, wherein the rail diverges into two branches, and the leaning direction of the tip of the wedge-shaped end determines to which of the two branches the fine structure is to be moved.

24. The fluidic channel system according to claim 20, wherein the width of the rail and the width of the guide increase toward the outside of the fluidic channel.

25. The fluidic channel system according to claim 20, wherein the rail is recessed in a T shape and the guide protrudes in a T shape.

26. The fluidic channel system according to claim 19, wherein the rail has a protrusion shape and the guide has a groove shape.

27. The fluidic channel system according to claim 26, wherein the width of the rail in a region where the fine structure is produced is larger than that in a region where the fine structure moves.

28. The fluidic channel system according to claim 26, wherein the width of the rail and the width of the guide decrease toward the outside of the fluidic channel.

29. The fluidic channel system according to claim 26, wherein the rail protrudes in a T shape and the guide is recessed in a T shape.

30. The fluidic channel system according to claim 19, further comprising:
an additional rail and an additional fine structure,
wherein the rail and the additional rail are positioned in upper and lower portions of the fluidic channel, respectively, the fine structure having the guide positioned on a top surface thereof moves along the rail, and the additional fine structure having an additional guide provided on a bottom surface thereof moves along the additional rail.

31. The fluidic channel system according to claim 19, wherein the fluidic channel comprises a first region where the rail is not formed, a second region where the rail is formed, and an entrance portion positioned between the first and second regions, and the entrance portion leads the fine structure delivered from the first region such that the guide of the fine structure enters the rail of the second region.

32. The fluidic channel system according to claim 31, wherein the entrance portion comprises at least one inclined surface which narrows toward the second region.

33. The fluidic channel system according to claim 19, wherein the guide is discontinuous.

34. The fluidic channel system according to claim 11, wherein the fine structure comprises a magnetic material, and a magnetic field is applied to the fluidic channel.

35. The fluidic channel system according to claim 34, wherein the magnetic field changes according to time.

36. The fluidic channel system according to claim 34, further comprising:
at least one magnet that applies the magnetic field.

37. The fluidic channel system according to claim 34, wherein the rail diverges into two branches, and a magnetic force applied to the fine structure determines to which of the two branches the fine structure is to be moved.

38. The fluidic channel system according to claim 34, wherein the fine structure is moved along the rail by a magnetic field applied to the fine structure, even though the fluid does not flow.

39. The fluidic channel system according to claim 38, wherein the fluid comprises a gas.

40. The fluidic channel system according to claim 34, wherein the fine structure is moved against the flow of the fluid by a magnetic force applied to the fine structure.

41. The fluidic channel system according to claim 11, wherein the fine structure comprises a latch such that the fine structure is coupled to an additional fine structure.

42. The fluidic channel system according to claim 11, wherein the fine structure comprises a spacer which adjusts a distance between the fine structure and an adjacent additional fine structure.

43. The fluidic channel system according to claim 11, wherein the fine structure is configured to package a microchip.

44. The fluidic channel system according to claim 43, wherein the microchip is a light emitting diode (LED) chip, a radio frequency identification (RFID) chip, or a complementary metal-oxide semiconductor (CMOS) chip.

45. The fluidic channel system according to claim 11, wherein the fine structure is used as a carrier which surrounds and carries an object.

46. The fluidic channel system according to claim 45, wherein the object comprises microbeads, cells, nanostructures, or particles.

* * * * *